United States Patent
Lowe et al.

(10) Patent No.: US 9,712,180 B2
(45) Date of Patent: *Jul. 18, 2017

(54) ANGLE ENCODER AND A METHOD OF MEASURING AN ANGLE USING SAME

(71) Applicant: ZEROKEY INC., Calgary (CA)

(72) Inventors: Matthew William Lowe, Calgary (CA); Vahid Dehghanian, Calgary (CA)

(73) Assignee: ZEROKEY INC., Calgary, Alberta (\*) Notice: Subject to any disclaimer, the term of this patent is extended or adjusted under 35 U.S.C. 154(b) by 0 days.

This patent is subject to a terminal disclaimer.

(21) Appl. No.: 15/191,379

(22) Filed: Jun. 23, 2016

(65) Prior Publication Data

US 2016/0308548 A1 Oct. 20, 2016

Related U.S. Application Data

(63) Continuation of application No. 14/939,460, filed on Nov. 12, 2015, now Pat. No. 9,413,376.

(Continued)

(51) Int. Cl.
| | | |
|---|---|---|
| *H03M 1/22* | (2006.01) | |
| *H03M 1/28* | (2006.01) | |
| *G06F 3/01* | (2006.01) | |
| *G01D 5/241* | (2006.01) | |
| *G06F 3/0488* | (2013.01) | |
| *G01D 5/16* | (2006.01) | |
| *H03M 7/30* | (2006.01) | |
| *H04W 4/00* | (2009.01) | |
| *G06N 7/00* | (2006.01) | |

(52) U.S. Cl.
CPC ............. *H03M 1/285* (2013.01); *G01D 5/16* (2013.01); *G01D 5/241* (2013.01); *G06F 3/014* (2013.01); *G06F 3/016* (2013.01); *G06F 3/04886* (2013.01); *H03M 7/3082* (2013.01); *H04W 4/005* (2013.01); *G06N 7/005* (2013.01)

(58) Field of Classification Search
CPC ...... H03M 1/285; H03M 1/645; G01D 5/241; G01D 5/2451
USPC ..................................................... 341/15, 10
See application file for complete search history.

(56) References Cited

U.S. PATENT DOCUMENTS 2,632,058 A 3/1953 Gray
3,458,709 A * 7/1969 Beall, Jr. ............ G01D 5/34723
250/231.13

(Continued)

FOREIGN PATENT DOCUMENTS

WO WO 2013/135299 A1 9/2013

OTHER PUBLICATIONS

PCT/CA2015/051175 International Search Report and Written Opinion, dated Jun. 2, 2016.

(Continued)

*Primary Examiner* — Jean B Jeanglaude
(74) *Attorney, Agent, or Firm* — Gowling WLG (Canada) LLP

(57) ABSTRACT

An angle encoder has first and second components rotatable with respect to each other, and an encoder pattern having codewords for indicating the angle between the first and second components. The encoder pattern has a set of base encoder channels coded with a conventional Gray code, and a set of Booster channels for improving the resolution of angle measurement.

20 Claims, 33 Drawing Sheets

Related U.S. Application Data

(60) Provisional application No. 62/078,124, filed on Nov. 11, 2014, provisional application No. 62/078,142, filed on Nov. 11, 2014.

(56) References Cited

U.S. PATENT DOCUMENTS

| | | | |
|---|---|---|---|
| 4,621,256 A * | 11/1986 | Rusk | H03M 1/143 |
| | | | 101/248 |
| 5,042,157 A * | 8/1991 | Garrett | G09B 1/06 |
| | | | 250/231.13 |
| 5,519,393 A * | 5/1996 | Brandestini | G01D 5/2492 |
| | | | 341/10 |
| 6,304,840 B1 | 10/2001 | Vance et al. | |
| 7,667,629 B2 * | 2/2010 | Pothireddy | H03M 7/16 |
| | | | 341/70 |
| 2002/0118123 A1 | 8/2002 | Kim et al. | |
| 2003/0011573 A1 | 1/2003 | Villet et al. | |
| 2007/0132772 A1 | 6/2007 | Morphet | |
| 2010/0199228 A1 | 8/2010 | Latta et al. | |
| 2011/0142353 A1 | 6/2011 | Hoshino et al. | |
| 2015/0220158 A1 | 8/2015 | Elargovan et al. | |

OTHER PUBLICATIONS

PCT/CA2015/051178 International Search Report and Written Opinion, dated Feb. 3, 2016.
PCT/CA2015/051175 Invitation to Pay Additional Fees and, where Applicable, Protest Fee, dated Mar. 30, 2016.

* cited by examiner

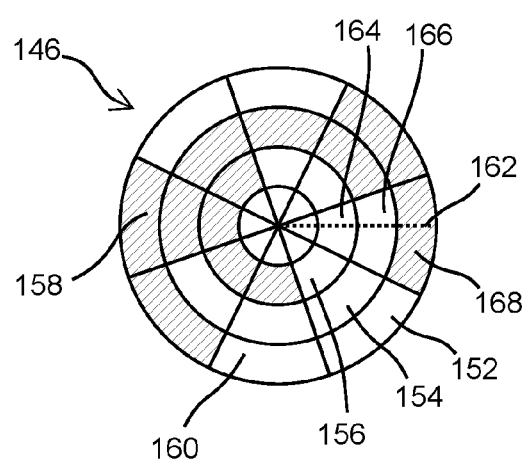
FIG. 4B
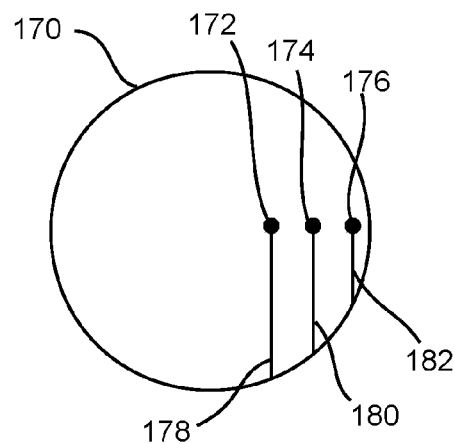
FIG. 4C
| Sector Number of Each Ring | Ring 156/ Contact 172 | Ring 154/ Contact 174 | Ring 152/ Contact 176 |
|---|---|---|---|
| 0 | 0 | 0 | 0 |
| 1 | 0 | 0 | 1 |
| 2 | 0 | 1 | 1 |
| 3 | 0 | 1 | 0 |
| 4 | 1 | 1 | 0 |
| 5 | 1 | 1 | 1 |
| 6 | 1 | 0 | 1 |
| 7 | 1 | 0 | 0 |
FIG. 4D

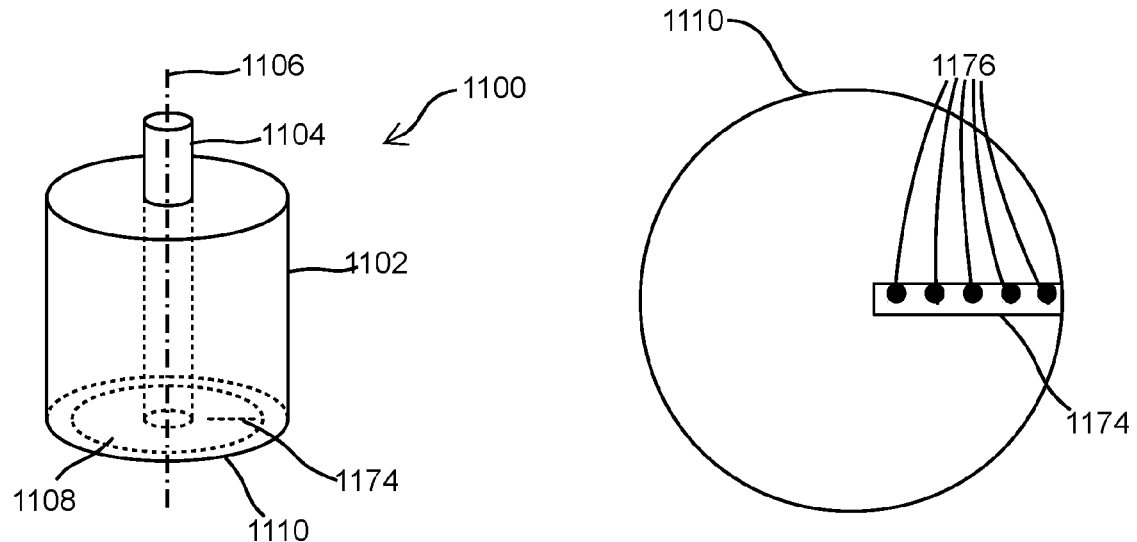
FIG. 12A    FIG. 12B
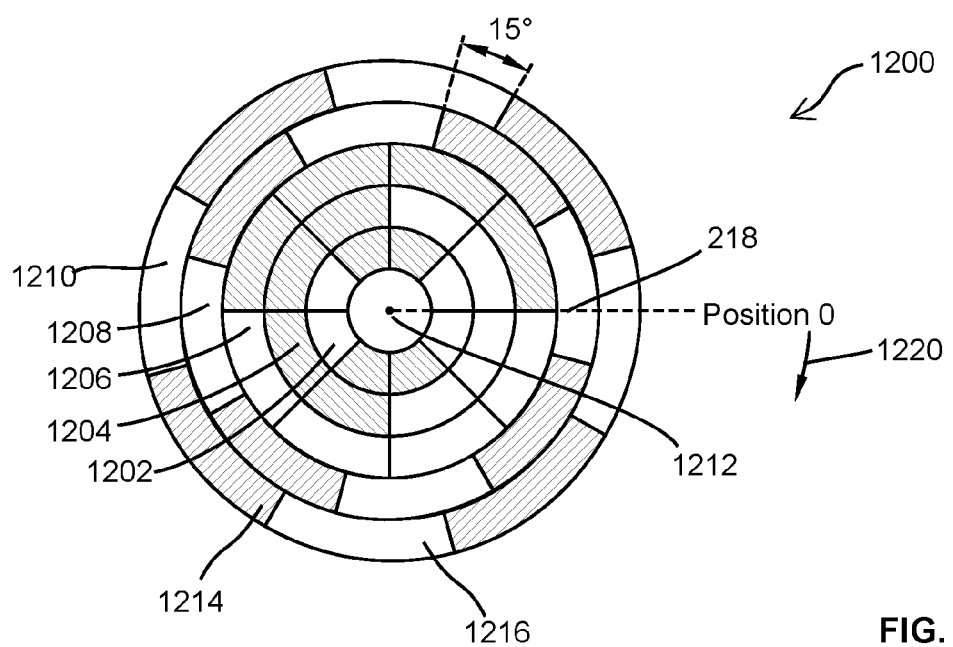
FIG. 13

| Codeword No. | Codeword | Angle |
|---|---|---|
| 0 | 000 | 0° |
| 1 | 100 | 45° |
| 2 | 110 | 90° |
| 3 | 010 | 135° |
| 4 | 011 | 180° |
| 5 | 111 | 225° |
| 6 | 101 | 270° |
| 7 | 001 | 315° |

Encoder Values with 3 Base Channels and 2 Booster Channels

| Codeword No. | Codeword | | | | | Corresponding Angle |
|---|---|---|---|---|---|---|
| | b4 | b3 | b2 | b1 | b0 | |
| 0 | 0 | 0 | 0 | 0 | 0 | 0° |
| 1 | 0 | 0 | 0 | 1 | 0 | 15° |
| 2 | 0 | 0 | 0 | 1 | 1 | 30° |
| 3 | 1 | 0 | 0 | 1 | 1 | 45° |
| 4 | 1 | 0 | 0 | 0 | 1 | 60° |
| 5 | 1 | 0 | 0 | 0 | 0 | 75° |
| 6 | 1 | 1 | 0 | 0 | 0 | 90° |
| 7 | 1 | 1 | 0 | 1 | 0 | 105° |
| 8 | 1 | 1 | 0 | 1 | 1 | 120° |
| 9 | 0 | 1 | 0 | 1 | 1 | 135° |
| 10 | 0 | 1 | 0 | 0 | 1 | 150° |
| 11 | 0 | 1 | 0 | 0 | 0 | 165° |
| 12 | 0 | 1 | 1 | 0 | 0 | 180° |
| 13 | 0 | 1 | 1 | 1 | 0 | 195° |
| 14 | 0 | 1 | 1 | 1 | 1 | 210° |
| 15 | 1 | 1 | 1 | 1 | 1 | 225° |
| 16 | 1 | 1 | 1 | 0 | 1 | 240° |
| 17 | 1 | 1 | 1 | 0 | 0 | 255° |
| 18 | 1 | 0 | 1 | 0 | 0 | 270° |
| 19 | 1 | 0 | 1 | 1 | 0 | 285° |
| 20 | 1 | 0 | 1 | 1 | 1 | 300° |
| 21 | 0 | 0 | 1 | 1 | 1 | 315° |
| 22 | 0 | 0 | 1 | 0 | 1 | 330° |
| 23 | 0 | 0 | 1 | 0 | 0 | 345° |

Base Portion: b4, b3, b2
Booster Portion: b1, b0

FIG. 16G

| Codeword No. | b4 | b3 | b2 | b1 | b0 |
|---|---|---|---|---|---|
| 0 | 0 | 0 | 0 | 0 | 0 |
| 1 | 0 | 0 | 0 | 0 | 1 |
| 2 | 0 | 0 | 0 | 1 | 1 |
| 3 | 0 | 0 | 0 | 1 | 0 |
| 4 | 0 | 0 | 1 | 1 | 0 |
| 5 | 0 | 0 | 1 | 1 | 1 |
| 6 | 0 | 0 | 1 | 0 | 1 |
| 7 | 0 | 0 | 1 | 0 | 0 |
| 8 | 0 | 1 | 1 | 0 | 0 |
| 9 | 0 | 1 | 1 | 0 | 1 |
| 10 | 0 | 1 | 1 | 1 | 1 |
| 11 | 0 | 1 | 1 | 1 | 0 |
| 12 | 0 | 1 | 0 | 1 | 0 |
| 13 | 0 | 1 | 0 | 1 | 1 |
| 14 | 0 | 1 | 0 | 0 | 1 |
| 15 | 0 | 1 | 0 | 0 | 0 |
| 16 | 1 | 1 | 0 | 0 | 0 |
| 17 | 1 | 1 | 0 | 0 | 1 |
| 18 | 1 | 1 | 0 | 1 | 1 |
| 19 | 1 | 1 | 0 | 1 | 0 |
| 20 | 1 | 1 | 1 | 1 | 0 |
| 21 | 1 | 1 | 1 | 1 | 1 |
| 22 | 1 | 1 | 1 | 0 | 1 |
| 23 | 1 | 1 | 1 | 0 | 0 |
| 24 | 1 | 0 | 1 | 0 | 0 |
| 25 | 1 | 0 | 1 | 0 | 1 |
| 26 | 1 | 0 | 1 | 1 | 1 |
| 27 | 1 | 0 | 1 | 1 | 0 |
| 28 | 1 | 0 | 0 | 1 | 0 |
| 29 | 1 | 0 | 0 | 1 | 1 |
| 30 | 1 | 0 | 0 | 0 | 1 |
| 31 | 1 | 0 | 0 | 0 | 0 |

FIG. 17 (Prior art)

$$C = \begin{bmatrix} 0 & 0 & 0 \\ 1 & 0 & 0 \\ 1 & 1 & 0 \\ 0 & 1 & 0 \\ 0 & 1 & 1 \\ 1 & 1 & 1 \\ 1 & 0 & 1 \\ 0 & 0 & 1 \end{bmatrix}$$

FIG. 20A $$B1 = \begin{bmatrix} 0 & 0 & 0 \\ 0 & 0 & 0 \\ 0 & 0 & 0 \\ 1 & 0 & 0 \\ 1 & 0 & 0 \\ 1 & 0 & 0 \\ 1 & 1 & 0 \\ 1 & 1 & 0 \\ 1 & 1 & 0 \\ 0 & 1 & 0 \\ 0 & 1 & 0 \\ 0 & 1 & 0 \\ 0 & 1 & 1 \\ 0 & 1 & 1 \\ 0 & 1 & 1 \\ 1 & 1 & 1 \\ 1 & 1 & 1 \\ 1 & 1 & 1 \\ 1 & 0 & 1 \\ 1 & 0 & 1 \\ 1 & 0 & 1 \\ 0 & 0 & 1 \\ 0 & 0 & 1 \\ 0 & 0 & 1 \end{bmatrix}$$

FIG. 20B $$B2 = \begin{bmatrix} 0 & 0 \\ 0 & 0 \\ \vdots & \vdots \\ 0 & 0 \end{bmatrix} \leftarrow \text{24 rows}$$

FIG. 20C $$B2 = \begin{bmatrix} 0 & 0 \\ 0 & 0 \\ 0 & 0 \\ 1 & 1 \\ 1 & 1 \\ 1 & 1 \\ 0 & 0 \\ 0 & 0 \\ 0 & 0 \\ 1 & 1 \\ 1 & 1 \\ 1 & 1 \\ 0 & 0 \\ 0 & 0 \\ 0 & 0 \\ 1 & 1 \\ 1 & 1 \\ 1 & 1 \\ 0 & 0 \\ 0 & 0 \\ 0 & 0 \\ 1 & 1 \\ 1 & 1 \\ 1 & 1 \end{bmatrix}$$

FIG. 20D $$B2 = \begin{bmatrix} 0 & 0 \\ 0 & 1 \\ 1 & 1 \\ 1 & 1 \\ 1 & 0 \\ 0 & 0 \\ 0 & 0 \\ 0 & 1 \\ 1 & 1 \\ 1 & 1 \\ 1 & 0 \\ 0 & 0 \\ 0 & 0 \\ 0 & 1 \\ 1 & 1 \\ 1 & 1 \\ 1 & 0 \\ 0 & 0 \\ 0 & 0 \\ 0 & 1 \\ 1 & 1 \\ 1 & 1 \\ 1 & 0 \\ 0 & 0 \end{bmatrix}$$

FIG. 20E $$B = [B1, B2] = \begin{bmatrix} 0 & 0 & 0 & 0 & 0 \\ 0 & 0 & 0 & 0 & 1 \\ 0 & 0 & 0 & 1 & 1 \\ 1 & 0 & 0 & 1 & 1 \\ 1 & 0 & 0 & 1 & 0 \\ 1 & 0 & 0 & 0 & 0 \\ 1 & 1 & 0 & 0 & 0 \\ 1 & 1 & 0 & 0 & 1 \\ 1 & 1 & 0 & 1 & 1 \\ 0 & 1 & 0 & 1 & 1 \\ 0 & 1 & 0 & 1 & 0 \\ 0 & 1 & 0 & 0 & 0 \\ 0 & 1 & 1 & 0 & 0 \\ 0 & 1 & 1 & 0 & 1 \\ 0 & 1 & 1 & 1 & 1 \\ 1 & 1 & 1 & 1 & 1 \\ 1 & 1 & 1 & 1 & 0 \\ 1 & 1 & 1 & 0 & 0 \\ 1 & 0 & 1 & 0 & 0 \\ 1 & 0 & 1 & 0 & 1 \\ 1 & 0 & 1 & 1 & 1 \\ 0 & 0 & 1 & 1 & 1 \\ 0 & 0 & 1 & 1 & 0 \\ 0 & 0 & 1 & 0 & 0 \end{bmatrix}$$

FIG. 20F

| Codeword No. | Code | | | | | Angle |
|---|---|---|---|---|---|---|
| | b4 | b3 | b2 | b1 | b0 | |
| 0 | 0 | 0 | 0 | 0 | 0 | 0° |
| 1 | 0 | 0 | 0 | 1 | 0 | 22.5° |
| 2 | 1 | 0 | 0 | 1 | 0 | 45° |
| 3 | 1 | 0 | 0 | 1 | 1 | 67.5° |
| 4 | 1 | 1 | 0 | 1 | 1 | 90° |
| 5 | 1 | 1 | 0 | 0 | 1 | 112.5° |
| 6 | 0 | 1 | 0 | 0 | 1 | 135° |
| 7 | 0 | 1 | 0 | 0 | 0 | 157.5° |
| 8 | 0 | 1 | 1 | 0 | 0 | 180° |
| 9 | 0 | 1 | 1 | 1 | 0 | 202.5° |
| 10 | 1 | 1 | 1 | 1 | 0 | 225° |
| 11 | 1 | 1 | 1 | 1 | 1 | 247.5° |
| 12 | 1 | 0 | 1 | 1 | 1 | 270° |
| 13 | 1 | 0 | 1 | 0 | 1 | 292.5° |
| 14 | 0 | 0 | 1 | 0 | 1 | 315° |
| 15 | 0 | 0 | 1 | 0 | 0 | 337.5° |

135° Encoder with 7 Booster Channels $P_i = S\ i\ /\ (n + 2m + 1) + (v - 1)\ (360\ /\ M)$
$P_3 = 45° \times 3\ /\ (7 + 1) + (2 - 1) \times (360°\ /\ 2) = 196.875°$ Section A-A Encoder Pattern Contacts

ANGLE ENCODER AND A METHOD OF MEASURING AN ANGLE USING SAME

CROSS-REFERENCE TO RELATED APPLICATIONS

This application is a continuation of U.S. patent application Ser. No. 14/939,460 filed on Nov. 12, 2015, which claims the benefit of U.S. Provisional Patent Application Ser. No. 62/078,124, filed Nov. 11, 2014, and U.S. Provisional Patent Application Ser. No. 62/078,142, filed Nov. 11, 2014, the contents of all of which are incorporated herein by reference in their entirety.

FIELD OF THE DISCLOSURE

The present invention relates generally to an input system, and in particular to a method of detecting and capturing user input in a three-dimensional (3D) space and a 3D input system employing same.

BACKGROUND

One known input device is a keyboard for entering commands, including characters and instructions. For example, a desktop computer or a laptop computer generally comprises a physical keyboard having a plurality of physical keys. Pressing a key triggers a control circuit in the keyboard to generate and send a command to the computer. Depending on the key pressed, the command may be a character to be entered into the computer or an instruction instructing the computer to perform one or more designated actions. Standard keyboards are sized for ergonomic effectiveness including finger/key spacing. However, these physical keyboards are usually large in size and not well suited for generally more compact mobile devices.

Devices having touch-sensitive displays such as tablets and smartphones generally use a so-called "software keyboard" for inputting characters. In these devices, a keyboard image is displayed on the touch-sensitive display. When a user uses a pointer, e.g., a finger, stylus or digital pen, to contact the display at a location overlapping a "virtual" key in the displayed keyboard image, the device detects the "virtual" key and generates a character or a command corresponding thereto. However, software keyboards remain limited to the size of the display, and do not provide an adequate text input experience for intensive or complex tasks.

Some input devices require the use of angle encoders. Some angle encoders such as rotary angle encoders are known. For example, one type of rotary angle encoder generally comprises a shaft rotatable about its axis. A disc is fixed to the shaft rotatable therewith, and is received in a stationary housing. The disc is partitioned into a plurality of rings, each being further partitioned to a plurality of segments. The segments are processed such that some segments are connected to an electrical source and others are electrically insulated therefrom to form an encoder pattern.

The housing also receives a row of sliding contacts fixed thereto. Each contact rests against a ring of the disc, and is connected to a separate electrical detector. When the disc rotates with the shaft, the contacts overlapping with the segments that connect to the electrical source connect the respective electrical detectors to the electrical source, causing the respective detectors to detect an "ON" signal; and the contacts overlapping with the segments that are insulated from the electrical source separate the respective electrical detectors from the electrical source, causing the respective detectors to detect an "OFF" signal. In this manner, the detectors together generate a binary codeword representing the angular position of the shaft.

FIG. 1 shows a prior art encoder pattern 50 for imprinting onto the rotatable disc. As shown, the encoder pattern 50 is an encoder disc partitioned into three (3) rings 52, 54 and 56, each being further partitioned to eight (8) angularly aligned, angularly equal-length segments. The shaded segments 58 are connected to an electrical source, and the non-shaded segments 60 are insulated therefrom. Three contacts (not shown) are in contact with the three rings 52 to 56, respectively. When the disc rotates with the shaft (not shown) to a position such that the contacts are along the line 62, the electrical detectors (not shown) together generates a binary codeword 001 representing the current angular position of the shaft.

When the shaft further rotates such that the contacts fall within another set of segments, another binary codeword is then generated. To reduce angle detection error, the encoder pattern 50 may be arranged in a manner to generate Gray code. As those skilled in the art appreciate, a Gray code comprises a set of binary codewords arranged in a particular order such that each codeword differs from its neighboring or adjacent codeword by only one bit, i.e., the so-called Hamming distance of any pair of adjacent codewords is 1. A cyclic Gray code is a Gray code wherein the first and last codewords also differ by only one bit. The Gray code is disclosed in U.S. Pat. No. 2,632,058, entitled "Pulse code communication," to Gray, issued on Mar. 17, 1953, the content of which is incorporated herein by reference in its entirety.

In the example of FIG. 1, the angular measurement precision is 45°, i.e., any angle change less than 45° is not measurable, and the measured angle is always an integer multiplication of 45°. To improve the angular measurement precision, more rings and segments are required.

One problem of the above angle encoders is that the angular resolution, i.e., the smallest measurable angular change, is limited by a number of factors which prevent further improvements in resolution, accuracy or miniaturization. These factors include (1) the limited capability of the reading apparatus to discern one segment from the next, (2) the inability to manufacture discs having small-size segments, and (3) mechanical frailty of small-size encoder discs and reader mechanisms.

It is therefore an object to provide a novel user input method and a system employing the same. It is another object to provide an improved angle encoder and methods of measuring an angle using same.

SUMMARY

According to one aspect of this disclosure, there is provided an angle encoder comprising: a first component; a second component rotatable with respect to the first component and juxtaposed thereto; an encoder pattern associated with said second component, said encoder pattern storing codewords indicative of possible angles between the first and second components; and at least a first reader, in response to a current angle between the first and second components, reading, from said encoder pattern, a codeword indicative of the current angle between the first and second components; said encoder pattern comprises: n base encoder channels, each of said n base encoder channels comprising at most $2^n$ aligned, equal-length segments, each segment storing a binary 1 or 0, and said n base encoder channels storing the codewords of an n-bit Gray code; at least m first Booster channels, each of said m first Booster channels comprising at most $2^n$ equal-length segments, said equal-length segments alternately storing 0's and 1's and being offset from the base encoder channels by an offset distance of $L_0=Si/(m+1)$, where S represents the length of each segment, and i=1, 2, . . . , m, represents the Booster channel number of the first Booster channels.

In some embodiments, the channels of the encoder pattern are concentric rings, each segment is a segment of one of the concentric rings and has an angular length of at least $S=360°/2^n$, and said offset distance $L_0$ is an angular offset distance.

In some embodiments, the channels of the encoder pattern are circumferentially extending linear strips, each segment is a segment of one of the linear strips and has a linear length of at least $S=L/2^n$, where L is the linear length of each strip, and said offset distance $L_0$ is a linear offset distance.

In some embodiments, the encoder pattern is a flexible printed circuit board (PCB) storing codewords.

In some embodiments, the first reader measures the capacitance between the encoder pattern and the reader for reading, from said encoder pattern, the codeword indicative of the current angle between the first and second components.

In some embodiments, the first reader measures the electrical ON and OFF between the encoder pattern and the reader for reading, from said encoder pattern, the codeword indicative of the current angle between the first and second components.

In some embodiments, the first reader measures the resistance or voltage differential between the encoder pattern and the reader for reading, from said encoder pattern, the codeword indicative of the current angle between the first and second components.

In some embodiments, the first reader measures the optical ON and OFF between the encoder pattern and the reader for reading, from said encoder pattern, the codeword indicative of the current angle between the first and second components.

In some embodiments, the angle encoder further comprises: an analogue encoder section; and a second reader coupled to the analogue encoder section for reading an analogue parameter for determining the current angle between the first and second components.

In some embodiments, the angle encoder further comprises: a module of a statistic estimator coupled to the analogue encoder section and the second reader for determining the current angle between the first and second components.

In some embodiments, the statistic estimator is a Bayesian estimator.

In some embodiments, the Bayesian estimator is a Kalman Filter, an Extended Kalman Filter, a Minimum Mean Square Error estimator, or a Particle Filter.

According to one aspect of this disclosure, there is provided a device comprising: a codeword generator for generating a codeword of a (n,m) boosted cyclic Gray code; and a signal output coupled to the codeword generator for outputting the generated codeword of the (n,m) boosted cyclic Gray code; said (n,m) boosted cyclic Gray code comprises a plurality of codewords, each codeword having at least (n+m) bits, a Hamming distance for any pair of codewords being 1; said (n,m) boosted cyclic Gray code has a minimum cross-codeword width of (m+1); and the minimum cross-codeword width of said (n,m) boosted cyclic Gray code is the number of consecutive 1's or 0's in each bit across all codewords.

In some embodiments, each codeword of the (n,m) boosted cyclic Gray code comprises a first portion of n bits and at least a second portion of m bits, said portion of n bits are formed from an n-bit Gray code.

In some embodiments, the codewords of the (n,m) boosted cyclic Gray code comprise a plurality of codeword groups, each codeword group has (m+1) consecutive codewords of the (n,m) boosted cyclic Gray code, the first portion of each codeword group is formed by a same codeword of the n-bit Gray code.

In some embodiments, for the second portion of the (n,m) boosted cyclic Gray code, the i-th bits, i=1, . . . , m, of all codewords of the (n,m) boosted cyclic Gray code are formed by alternate groups of binary 1's and 0's, each group of binary 1's have (m+1) binary 1's and each group of binary 0's have (m+1) binary 0's.

In some embodiments, for the second portion of the (n,m) boosted cyclic Gray code, the first binary 1 of each group of binary 1's of the i-th bits is in the i-th codeword of a codeword group.

In some embodiments, the device is an angle encoder for measuring an angle, the device comprises: an encoder pattern storing at least a subset of the codeword of the (n,m) boosted cyclic Gray code, each codeword of the (n,m) boosted cyclic Gray code indicative of a possible angle value; and at least one reader for reading, from said encoder pattern, a codeword indicative of the angle to be measured.

In some embodiments, the device measures a maximum angle of β, 0<β≤360°/M, M≥2 being an integer; and the device comprises at least M readers, the encoder pattern stores at least a subset of a (n,(M−1)n+Mm) boosted cyclic Gray code, the encoder pattern comprises M zones along the reading direction of each reader, each zone comprises $n_a$ tracks, $n_a$ being an integer, such that $Mn_a≥Mn+Mm$, each track comprises a plurality of sectors with each sector corresponding to a bit of a codeword of the (n,(M−1)n+Mm) boosted cyclic Gray code, In some embodiments, $n_a=n+m$.

BRIEF DESCRIPTION OF THE DRAWINGS

FIG. 4B shows a conventional Gray-code encoder pattern;

FIG. 4C shows the contacts of the rotary angle encoder;

FIG. 4D lists a 3-bit Gray code of the conventional Gray-code encoder pattern of FIG. 4B;

FIG. 12A shows an angle encoder, according to an embodiment of the present disclosure;

FIG. 12B shows the reader of the angle encoder of FIG. 12A;

FIG. 13 shows an example of the encoder pattern of the angle encoder of FIG. 12A having three (3) base channels and two (2) Booster channels;

FIG. 16G lists the codewords of the encoder pattern of FIG. 16F, reading out from the innermost ring to the outermost ring;

FIG. 17 lists the codewords of a 5-bit conventional Gray code, showing that it has a minimum cross-codeword width of 2;

FIGS. 20A to 20F show an example of generating a (3,2) boosted cyclic Gray code;

DETAILED DESCRIPTION

Figure 1:
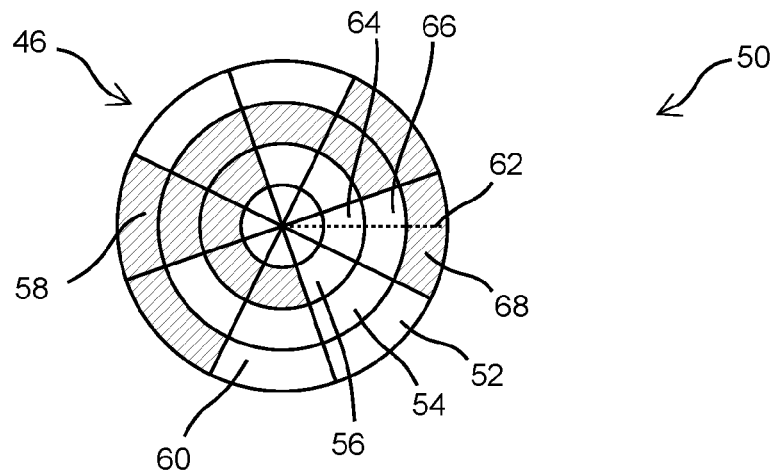
FIG. 1 shows a prior art encoder pattern of a rotary angle encoder.
Figure 2:
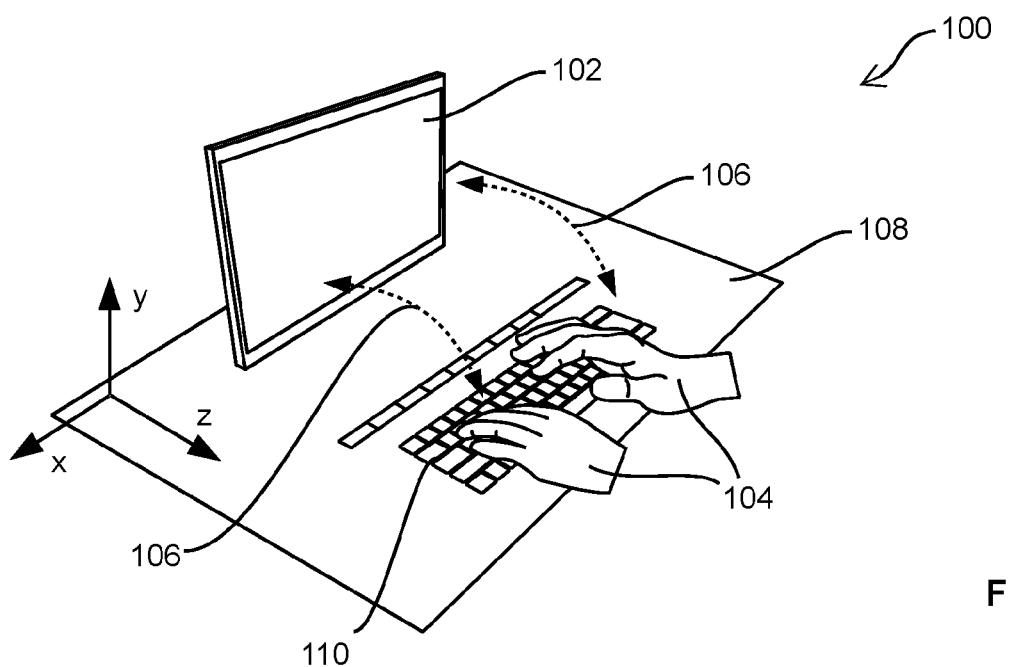
FIG. 2 illustrates a 3D input system according to one embodiment of the present disclosure.

Turning now to FIG. 2, a three-dimensional (3D) input system is shown and is generally identified by reference numeral 100. The 3D input system 100 comprises a computing device 102 such as a tablet, smartphone, laptop computer, desktop computer, or the like, and one or more position sensing devices, which in this embodiment are a pair of position sensing gloves 104. The computing device 102 is in communication with the position sensing gloves 104 using a suitable wireless connection 106, e.g. Bluetooth®, for receiving user input such as gestures representing characters and/or commands. Of course, other wireless or wired communication methods, e.g., WiFi®, wireless phone channels, ZigBee®, Ethernet, USB, Optical connection, serial cable, parallel cable, or the like, may alternatively be used for functionally connecting the computing device 102 and the position sensing gloves 104.

In the example of FIG. 2, the computing device 102 is positioned on a tabletop 108. A user (not shown) wearing the position sensing gloves 104 applies finger(s) thereof in contact with a virtual keyboard 110 to enter keystrokes for submission to the computing device 102, which may be interpreted as characters and/or commands by the computing device 102. An image of the virtual keyboard 110, e.g., a printed keyboard picture or an image projected from a projector (not shown), is shown on the tabletop 108 for representing the virtual keyboard and for assisting the user to locate the keys of the virtual keyboard. In the example of FIG. 2, the keyboard image 110 represents a "QWERTY" virtual keyboard. However, images representing other keyboard or input layouts may also be used.

The keyboard image of the virtual keyboard 110 may be optional. That is, in some alternative embodiments, the 3D input system 100 may not comprise any visually detectable keyboard image 110. Applicant has determined that experienced keyboard users do not need visual reinforcement of a keyboard image 110, and can rely on mental and muscle-memory to accurately place fingertips in relative positions corresponding with the keys of a keyboard.

The computing device 102 generally comprises a processing unit, memory or storage, one or more communication interfaces for communicating with other devices via aforementioned wireless or wired connections, a system bus for connecting various components to the processing unit, and one or more controllers controlling the operation of various components. Here, the processing unit may be one or more single-core or multiple-core computing processors, such as Intel® microprocessors offered by Intel Corporation of Santa Clara, Calif., USA, AMD® microprocessors offered by Advanced Micro Devices of Sunnyvale, Calif., USA, ARM® microprocessors manufactured by a variety of manufactures under the ARM® architecture developed by ARM Ltd. of Cambridge, UK, or the like. The memory may be RAM, ROM, EEPROM, solid-state memory, hard disks, CD, DVD, flash memory, or the like.

Usually, the computing device 102 also comprises one or more displays, such as monitors, LCD displays, LED displays, projectors, and the like, integrated with other components of the computing device 102, or physically separate from but functionally coupled thereto. Although in this embodiment, the position sensing gloves 104 are used as an input device for inputting characters and commands to the computing device 102, the computing device 102 may further comprise other input device such as physical keyboard, computer mouse, touch sensitive screen, microphone, scanner or the like.

Although not shown, the 3D input system 100 may further comprise other output devices such as speakers, printers, and the like.

Figure 3:
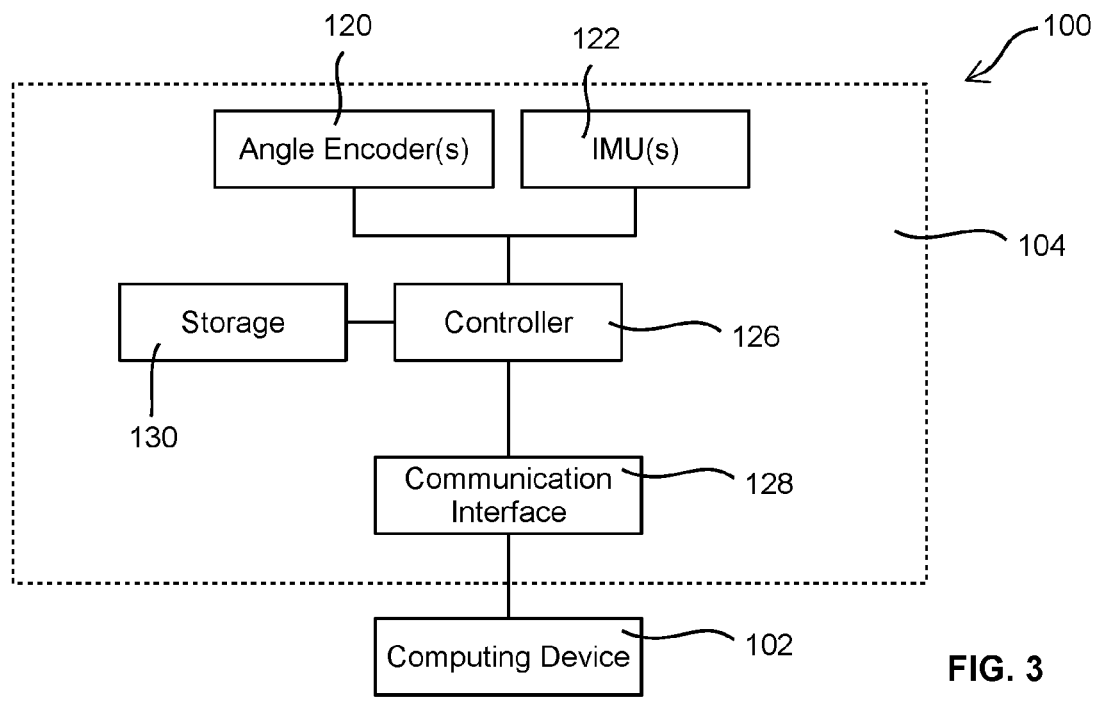
FIG. 3 is a simplified block diagram of the hardware structure of the 3D input system of FIG. 2.

FIG. 3 is a simplified block diagram of the hardware structure of a position sensing glove 104. While the sensors may be operatively associated with the wearer's hands in a variety of embodiments, including minimalist connection of electrically connected sensors to parts of the hands, one embodiment includes the substrate such a glove. As shown, the position sensing glove 104 comprises a supportive substrate, e.g., a glove made of suitable cloth or leather, one or more inertial measurement units (IMUs) 122 for determining the hand position, or in other words, the glove position, in a 3D space, and one or more angle encoders 120 for determining the fingertip location relative to the hand in the 3D space.

A controller 126 connects to the angle encoders 120 and the IMUs 122 for receiving angle measurement data from the angle encoders 120 and data of acceleration, orientation, and/or gravitational forces from the IMUs 122. The controller 126 processes the received data and sends the processed data to the computing device 102 via a communication interface 128, which in this embodiment is a Bluetooth® transceiver. The controller 126 also receives commands from the computing device 102 via the communication interface 128.

In this embodiment, the position sensing glove 104 further comprises a data storage 130, such as a volatile or nonvolatile memory, in communication with the controller 126 for storing sensor data received from the angle encoders 120 and the IMUs 122, data generated by the controller 126, and data and commands received from the computing device 102. Although not shown, the position sensing glove 104 also comprises a power source such as a Lithium-Ion battery for powering various components.

Figure 4A:
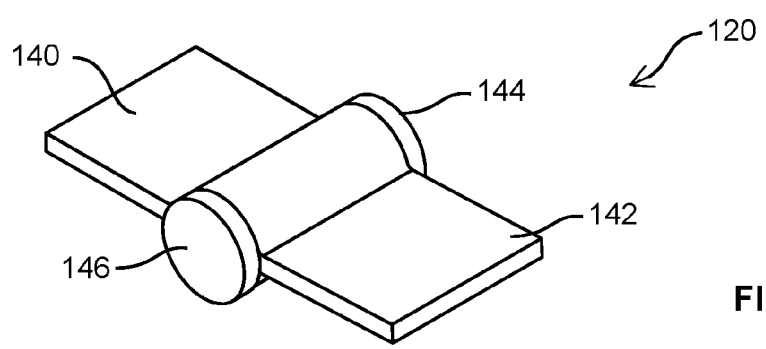
FIG. 4A is a perspective view of a rotary angle encoder.

The angle encoder 120 may be any detector suitable for detecting angles using, e.g., mechanical, resistive, capacitive, optical or magnetic means. FIGS. 4A to 4C show an example of a mechanical rotary angle encoder for detecting the angle between two pivoting members. As shown in FIG. 4A, the mechanical rotary angle encoder 120 comprises a first and a second link 140 and 142 rotatable about a pivot 144. The pivot 144 comprises an end cap 146 coupled thereon and rotatable with the first link 140. The inner surface of the end cap 146 is radially divided into n rings, and each ring is circumferentially divided into $2^n$ sectors. For example, in FIG. 4B, the inner surface of the end cap 146 is radially divided into three (n=3) rings 152, 154 and 156, and each ring is circumferentially divided into $2^n$, i.e., eight (8), sectors.

The shaded sectors 158 are electrically conductive (e.g., by coating a layer of electrically conductive material, or made of electrically conductive material), and the unshaded sectors 160 are electrically nonconductive (e.g., made of electrically nonconductive material, or by coating a layer of electrically nonconductive material, respectively) to form a predefined pattern. For example, in FIG. 4B, the pattern corresponds to a 3-bit conventional Gray code, as listed in FIG. 4D, where 0 represents electrically nonconductive and 1 represents electrically conductive.

The pivot 144 receives therein n electrical contacts preferably fixed on a plate facing towards the end cap 146 such that, when the end cap 146 is coupled to the pivot 144, each electrical contact firmly rests on a respective ring of the inner surface of the end cap 146. For example, FIG. 4C shows three electrical contacts 172, 174 and 176 fixed on a plate 170, and are connected to an angle detection circuit (not shown) via electrical wires 178, 180 and 182, respectively. When the end cap 146 is coupled to the pivot 144, the contact 172, 174 and 176 respectively rest on the rings 156, 154 and 152. The plate 170, and thus the electrical contacts 172 to 176, are rotatable with the second link 142.

When the first link 140 is rotated about the pivot 144 relative to the second link 142, causing the end cap 146 to rotate relative to the electrical contacts 172 to 176, the electrical contacts 172 to 176 are then in contact with various sectors depending on the angle of rotation. For example, in the example of FIG. 4B, the contacts 172 to 176 are in contact with sectors 164, 166 and 168, respectively, along the broken line 162. The angle detection circuit then generates a code 001 representing the current angle between the first and second links 140 and 142.

The precision of detected angle is determined by the angle, or angular length, of the sectors. In the example of FIGS. 4B and 4C, each sector has an angle of 45°. Therefore, the smallest detectable angle in that example is 45°. However, by using other angle detector or angle encoder, the smallest detectable angle may be reduced. For example, by using an angle encoder of FIGS. 31A to 32B (described in more detail later), which comprises a digital encoder section having a Gray code with an angle detection precision of 25° and an analogue encoder section, and by using a Bayesian estimator, the smallest detectable angle may be about 5°.

The IMUs 122 may be any sensors suitable for detecting acceleration, orientation, magnetic forces and/or gravitational forces. The IMUs 122 provide additional information about hand position, such as rotational movements and translational shifts, i.e., moving away from a home row position, i.e., a reference position of the hands/gloves 104, determined by a calibration process (described later).

Figure 5A:
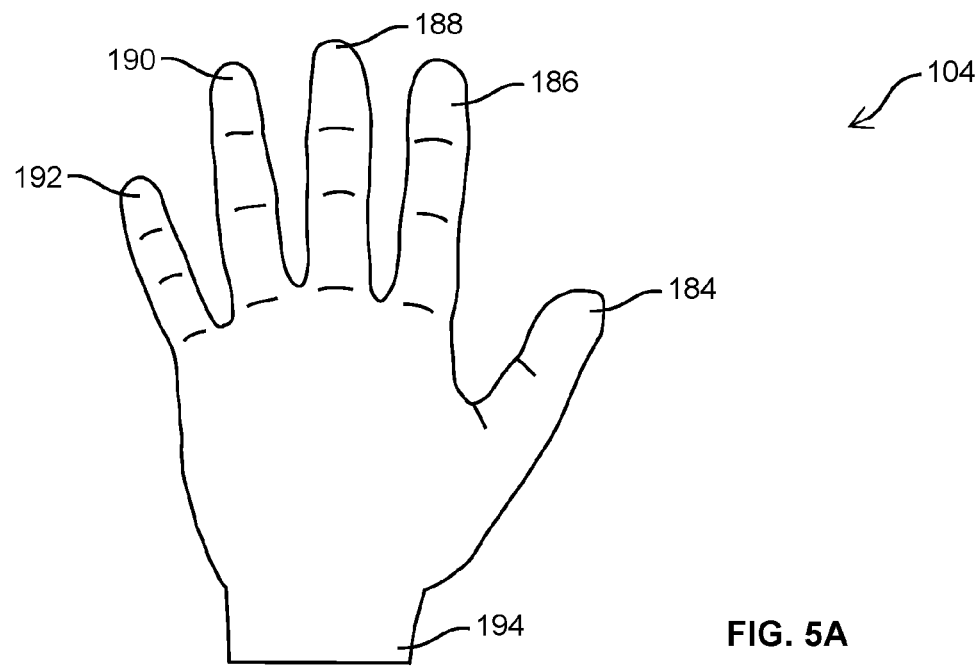
FIG. 5A shows the bottom view of a position sensing glove of the 3D input system of FIG. 2.
Figure 5B:
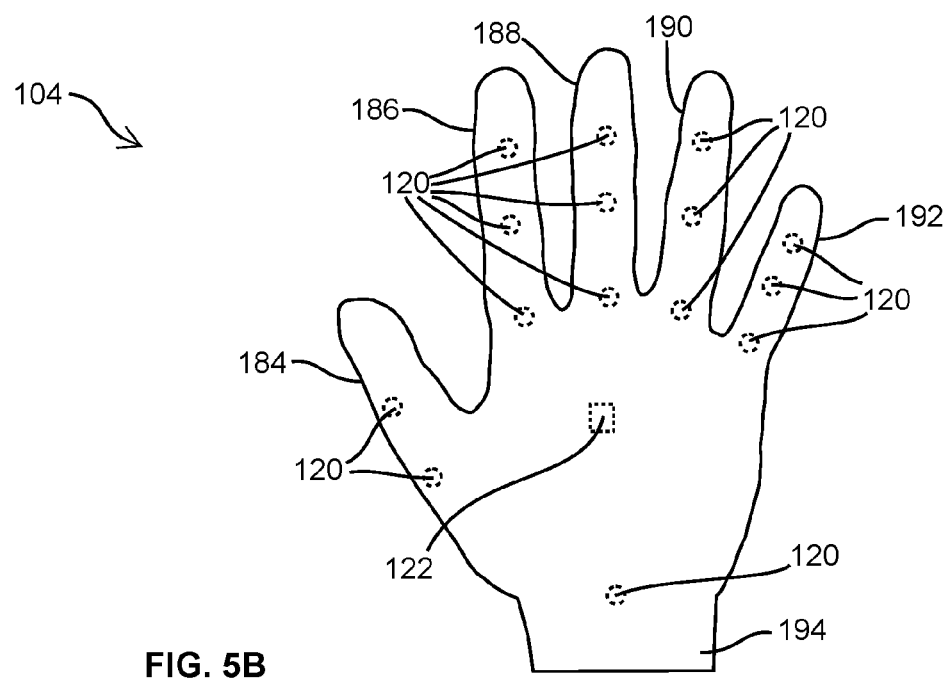
FIG. 5B shows the top view of the position sensing glove of the 3D input system of FIG. 2.

FIGS. 5A and 5B are the bottom (palm) and top (back) views of a right-hand position sensing glove 104, respectively. A left-hand position sensing glove 104 is similar to that of FIGS. 5A and 5B but with a generally mirrored configuration.

Figure 5C:
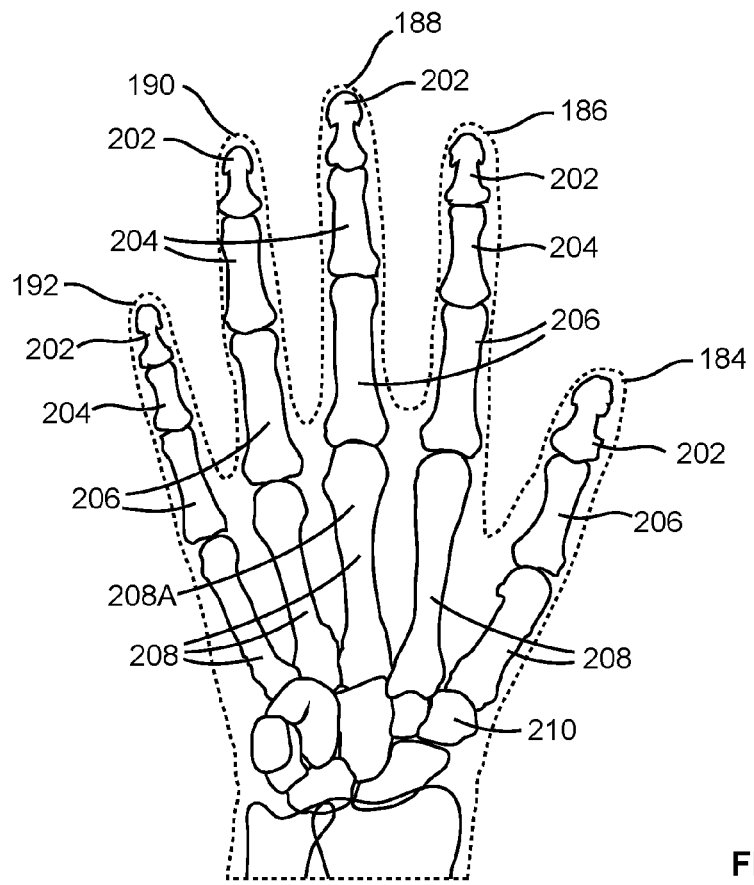
FIG. 5C shows the joints of the hand that the rotary angle encoders of FIG. 4A of the position sensing glove are positioned about.

The glove 104 is made of lightweight fabrics and mesh so as to minimize hindering the user's dexterity. As shown, the glove 104 comprises five finger portions 184 to 192 and a wrist portion 194, corresponding to the five fingers and the wrist of the user's hand. A plurality of angle encoders 120 are installed on the top side of the glove at the positions corresponding to the joints of human fingers (i.e., on the joints of the entire finger from the fingertip to the knuckle of the finger joining the hand) and wrist. As shown in FIG. 5B and also referring to FIG. 5C for the names of the hand bones, two (2) angle encoders 120 are installed on the thumb 184 of the glove 104 at the positions corresponding to the joints of a human thumb, i.e., one angle encoder 120 at about the joint between the distal phalange 202 and the proximal phalange 206 of the thumb 184, and another angle encoder 120 at about the joint between the metacarpal 208 and the carpus 210. Three (3) angle encoders 120 are installed on each of the fingers 186 to 192 at the positions corresponding to the joints of the respective human fingers, i.e., between the distal phalange 202 and the intermediate phalange 204, between the intermediate phalange 204 and the proximal phalange 206, and between the proximal phalange 206 and the metacarpal 208, respectively. One (1) angle encoder 120 is installed on the wrist 194.

The links 140 and 142 of the angle encoder 120, on each joint, move with the pivoting movement of the respective joint, rotating about the pivot 144, when the hand and/or fingers move. Each angle encoder 120 thus detects the angle of the respective joint in real time. In this embodiment, each angle encoder 120 detects the angle of the respective joint along a vertical plane.

An IMU 122 is also installed about the third metacarpus 208A. Although not shown, the controller 126, communication interface 128, the storage 130 and the power source are also installed on the glove 104 at one or more suitable non-interfering locations.

Figure 6:
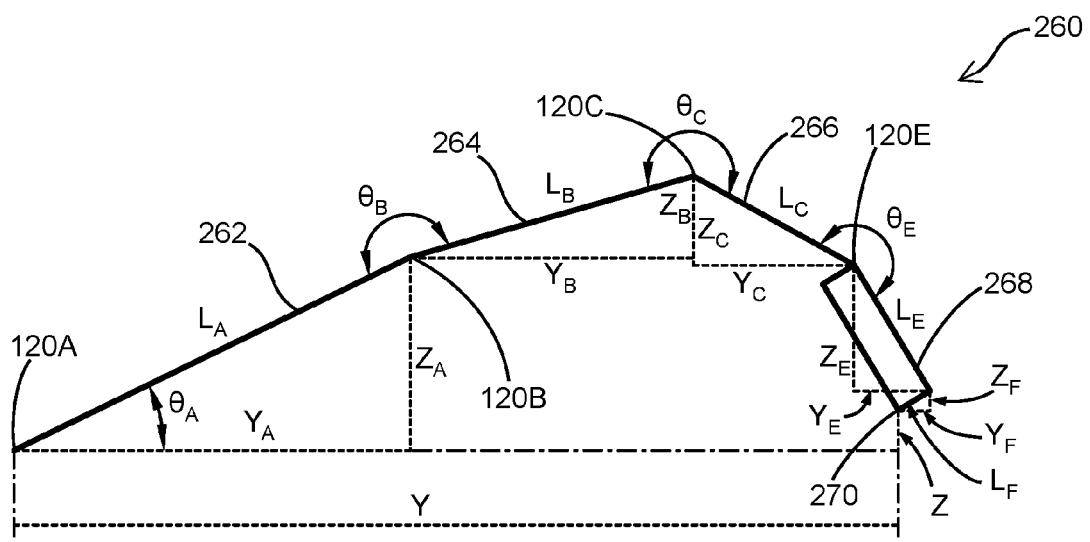
FIG. 6 shows the determination of the fingertip position of a finger.

The position sensing glove 104 uses the detected angles to determine the position of each fingertip in a 3D space. FIG. 6 illustrates an example of a simplified representation of a finger 260 having three angle encoders 120B, 120C and 120E, for calculating the fingertip position with respect to the wrist. Although the thumb only has two angle encoders, the calculation is similar.

In FIG. 6, line segments 262 to 268 represents a simplified free-body diagram of the glove 104. Line segment 262 represents the palm section of the glove 104 (i.e., the section from the joint between the proximal phalange 206 and the metacarpal 208 to the wrist 194), and line segments 264 to 268 represent the three sections of the finger (i.e., the proximal phalange 206, intermediate phalange 204 and the distal phalange 202). For a glove 104 manufactured with a known size, each of the sections 262 to 268 has a known length $L_A$, $L_B$, $L_C$ and $L_E$, respectively. Also, the fingertip 270 is at a known distance $L_F$ to the end of the section 268. The lengths $L_A$, $L_B$, $L_C$, $L_E$ and $L_F$ can be tuned by calibration as worn by the user.

The four angle encoders 120A, 120B, 120C and 120E are located at the wrist and the three joints of the finger 260. Angle encoder 120A detects a vertical angle $\theta_A$ of the wrist with respect to a horizontal plane, e.g., the tabletop, the angle encoder 120B detects a vertical angle $\theta_B$ between sections 262 and 264, the angle encoder 120C detects a vertical angle $\theta_C$ between sections 264 and 266, and the angle encoder 120E detects a vertical angle $\theta_E$ between sections 266 and 268. Then, the position of the fingertip 270 in a vertical plane Y-Z described by the coordinates (Y, Z) with respect to the position of the angle encoder 120A can be calculated as:

$$Y_A = L_A \cos(\theta_A) \tag{1}$$

$$Y_B = -L_B \cos(\theta_B - \theta_A) \tag{2}$$

$$Y_C = L_C \cos(\theta_B + \theta_C - \theta_A) \tag{3}$$

$$Y_E = -L_E \cos(\theta_B + \theta_C + \theta_E - \theta_A) \tag{4}$$

$$Y_F = -L_F \sin(\theta_B + \theta_C + \theta_E - \theta_A) \tag{5}$$

$$\begin{aligned}Y &= Y_A + Y_B + Y_C + Y_E - Y_F \\ &= L_A\cos(\theta_A) - L_B\cos(\theta_B - \theta_A) + L_C\cos(\theta_B + \theta_C - \theta_A) - \\ &\quad L_E\cos(\theta_B + \theta_C + \theta_E - \theta_A) + L_F\sin(\theta_B + \theta_C + \theta_E - \theta_A)\end{aligned} \tag{6}$$

$$Z_A = L_A \sin(\theta_A) \tag{7}$$

$$Z_B = L_B \sin(\theta_B - \theta_A) \tag{8}$$

$$Z_C = L_C \sin(\theta_B + \theta_C - \theta_A) \tag{9}$$

$$Z_E = -L_E \sin(\theta_E + \theta_C + \theta_B - \theta_A) \tag{10}$$

$$Z_F = -L_F \cos(\theta_E + \theta_C + \theta_B - \theta_A) \tag{11}$$

$$\begin{aligned}Z &= Z_A + Z_B - Z_C - Z_E - Z_F \\ &= L_A\sin(\theta_A) + L_B\sin(\theta_B - \theta_A) - L_C\sin(\theta_B + \theta_C - \theta_A) + \\ &\quad L_E\sin(\theta_E + \theta_C + \theta_B - \theta_A) + L_F\cos(\theta_E + \theta_C + \theta_B - \theta_A)\end{aligned} \tag{12}$$

In this embodiment, each fingertip is considered at a respectively predefined X-Y-plane angle with respect to the wrist 140, i.e., the projection line on an X-Y plane of the finger from the fingertip to the wrist 140 is at a respectively predefined angle with respect to a reference direction, e.g., the X-axis, of the X-Y plane.

With the above calculation of Equations (1) to (12), the position of each fingertip relative to the wrist is determined. The position of the wrist 140 in the 3D space may be determined by the IMU 122. The position of each fingertip in the 3D space is then determined.

Figure 7:
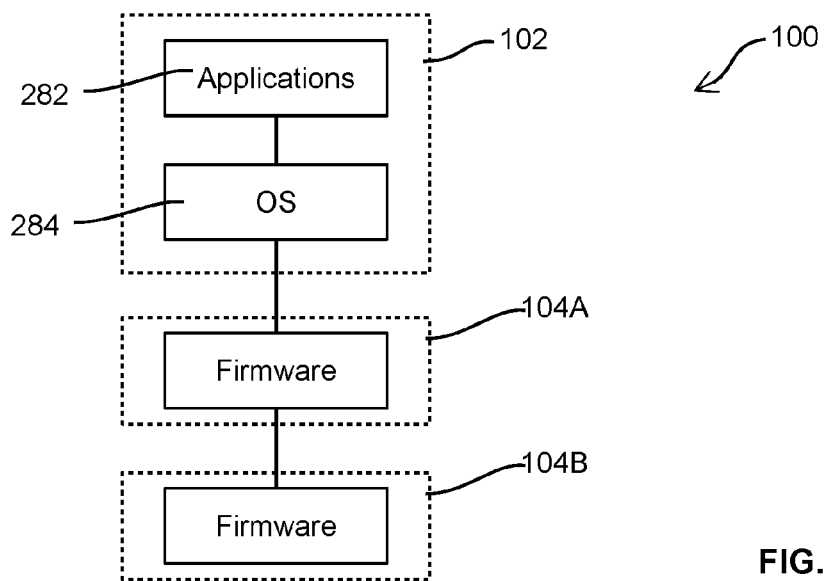
FIG. 7 shows the software architecture of the 3D input system.

FIG. 7 shows the software architecture of the 3D input system 100. The computing device 102 comprises one or more applications 282, run by the processing unit with the support of an operating system (OS) 284, such as Microsoft® Windows™, Android™, Apple® OS X®, Apple® iOS®, Linux®, etc. The application 282 communicates with the firmware running in the controller 126 of the position sensing device 104 via the OS 284.

In some embodiments in which both of a user's hands are used for inputting characters and commands, each glove collects sensor data and processes collected sensor data independently.

In an alternate embodiment, the firmware in the controller 126 of one position sensing glove 104B is in communication with the firmware in the controller 126 of the other position sensing glove 104A for sending position sensing data thereto and receiving commands therefrom. The firmware in the controller 126 of the position sensing glove 104A communicates with the applications 282 in the computing device 102 via the OS 284 for sending position sensing data generated from both gloves 104A and 104B and for receiving commands. The firmware in the controller 126 of the position sensing glove 104A identifies and executes the commands for it, and forwards the command for the position sensing glove 104B thereto.

Through the use of the IMU 122, the glove 104 (i.e., either of the gloves 104A and 104B) captures the position and orientation of the user's hand. Through the use of the angle encoders 120, the glove 104 captures the angle of each neighboring pair of phalanges and the angle of the wrist. Using this hand and finger information, the firmware of the glove 104 constructs a 3D model of the hand. Changes in the 3D hand model can then be used to determine gestures and other inputs from the hand. The position sensing glove 104 allows typing with the glove for entering characters and commands as if the user is using a physical keyboard.

As described above, a virtual keyboard can be constructed in a 3D space, and the 3D reconstructed hand models are mapped to points on the virtual keyboard. When a user's input motions cause the hand model to contact a key in the virtual keyboard, a keystroke is generated and sent to the computing device 102.

Figure 8:
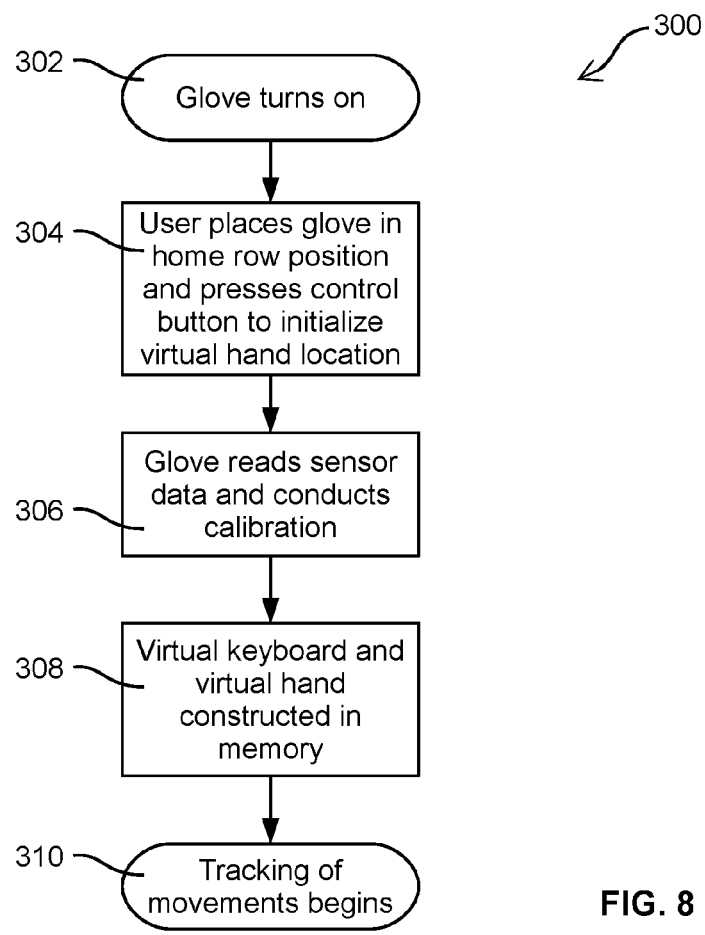
FIG. 8 is a flowchart showing the steps of calibrating the position-sensing glove.

FIG. 8 is a flowchart showing the steps of a calibration process 300 executed by the position sensing gloves 104 and the computing device 102 for calibrating the gloves.

The process 300 starts when the gloves 104A and 104B are turned on (step 302). The gloves then enters a calibration mode. At step 304, the user wearing the position sensing gloves 104 places a hand, e.g., the glove 104A, in a known position, such as at a home row position for using a virtual keyboard, and uses the other hand to press a control button to initialize the location of a virtual hand to be constructed by the firmware of the glove 104A. The button may be on the glove 104A, on the computing device 102 as a physical button or a virtual button.

At step 306, the glove 104A reads data from the angle encoders and the IMU thereon, and conducts calibration by calculating the locations of every fingertip thereof as described above. At step 308, the calculated fingertip locations are used for constructing a virtual hand model corresponding to glove 104A and a virtual keyboard in the 3D space. The constructed virtual hand model for glove 104A, and the virtual keyboard, are stored in the storage of the glove 104A.

The hand model construction uses stored values for bone length, i.e., $L_A$, $L_B$, $L_C$, $L_E$ and $L_F$ of FIG. 6, and arranges them as determined by the angular measurements from the angle encoders and IMU. These stored values are determined by the size of the glove 104A that the user is wearing. In other words, a larger glove 104A has longer stored bone length values than a smaller glove 104A. The stored values for bone length, $L_A$, $L_B$, $L_C$, $L_E$ and $L_F$ of FIG. 6, may be calibrated using a calibration process.

Although not shown in FIG. 8, steps 304 to 308 are repeated for the glove 104B. In some embodiments, where the firmware in the controller 126 of glove 104A is in communication with the firmware 126 of glove 104B for receiving position sensing data therefrom, a second virtual hand model is generated using the position data therein (not shown), and mapped to the virtual keyboard in glove 104A. After both gloves 104A and 104B are calibrated, the calibration process ends (step 310).

In some alternative embodiments, the glove calibration process 300 may be activated automatically by time delay or any suitable configuration. In some other embodiments, a suitable gesture, e.g., resting all fingertips on the tabletop 108 for a predefined period of time, may be used to initialize the location of a virtual hand to be constructed by the firmware of the glove 104A. In these embodiments, as no button needs to be pressed to start the glove calibration process 300, the calibration of both gloves 104A and 105B may be started generally at the same time, and both gloves 104A and 105B may be calibrated simultaneously.

Figure 9A:
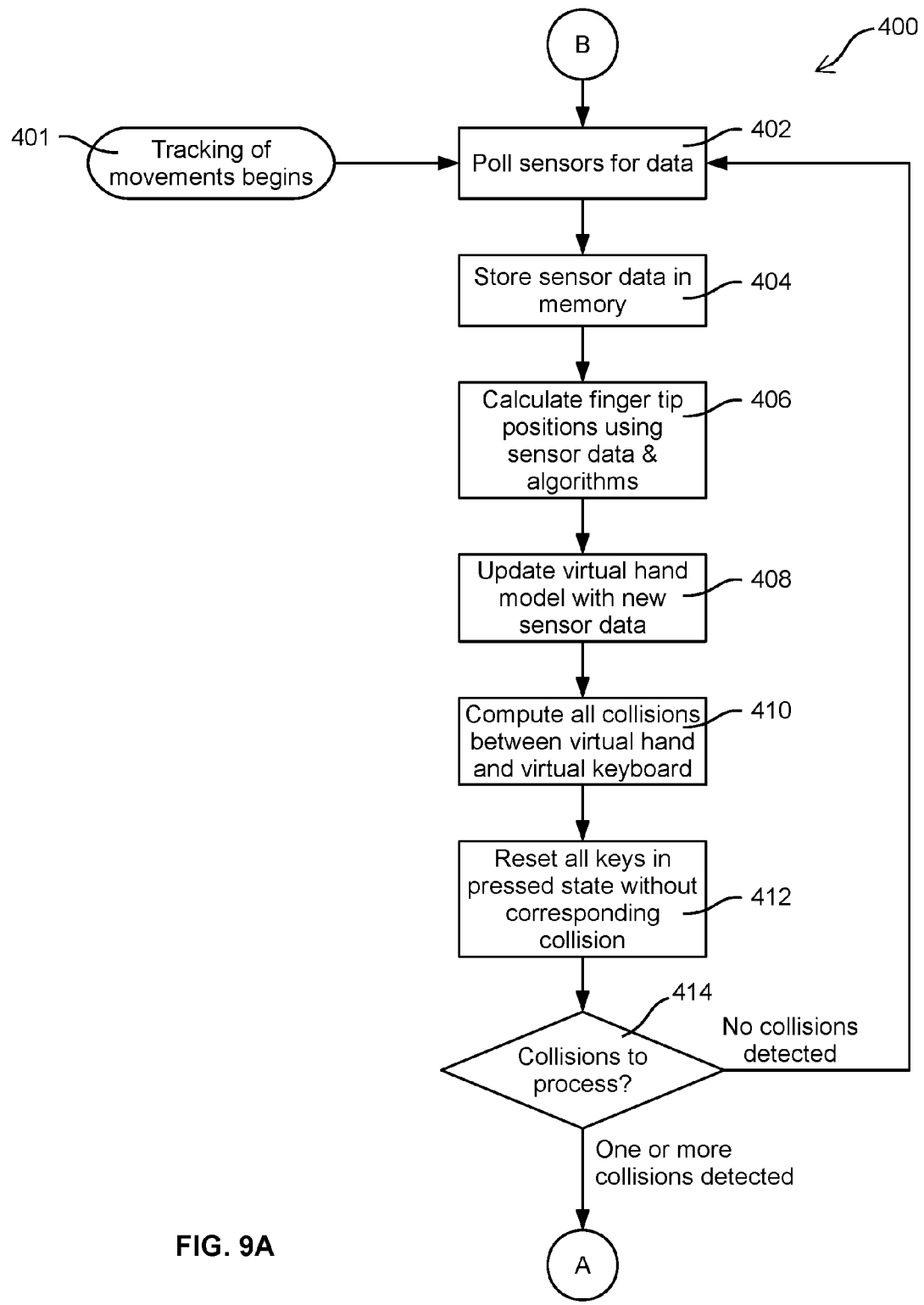
FIGS. 9A and 9B illustrate a flowchart showing the steps of generating user input using the position-sensing glove.
Figure 9B:
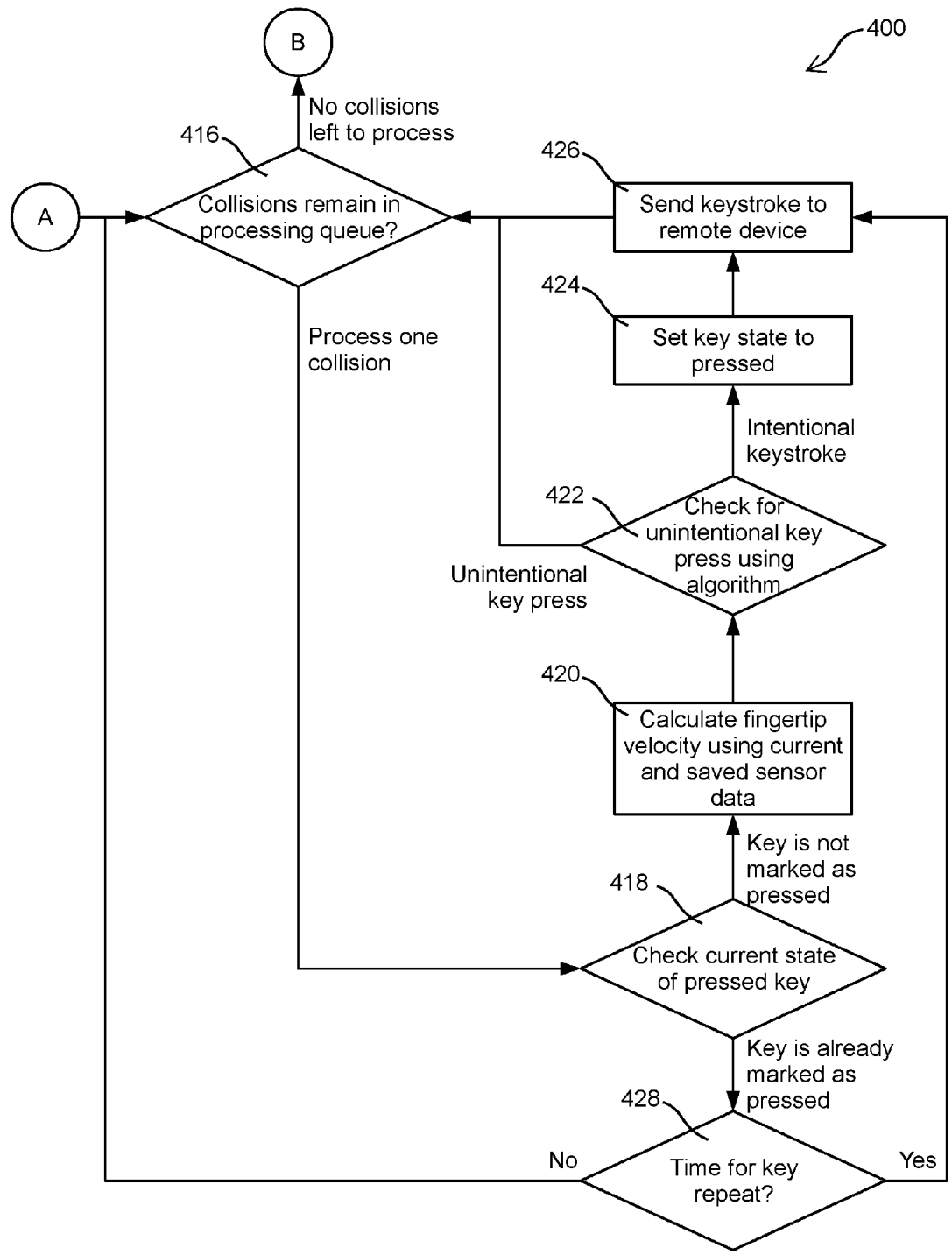

FIGS. 9A and 9B show a flowchart showing the steps of a fingertip tracking process 400 executed by the position sensing gloves 104 and the computing device 102 for inputting characters and commands to the computing device 102.

As shown in FIG. 9A, after calibration, each glove 104 starts to track fingertip movements (step 400). At step 402, the glove 104 polls sensors, i.e., the angle encoders 120 and IMU 122, thereon to receive data therefrom. The received sensor data is stored in the storage of the glove 104 (step 404). Then, the firmware of the glove 104 calculates fingertip positions using the received sensor data as described in FIG. 6 and Equations (1) to (12) (step 406). The sensor data is used to update the virtual hand model (step 408). At step 410, the firmware of the glove 104 computes all collisions between the virtual hand and the virtual keyboard, i.e., a fingertip hitting a key of the virtual keyboard, indicating a key press of the virtual keyboard. Here, the firmware determines collisions by comparing the coordinates of each fingertip, calculated using Equations (1) to (12), against the region of each virtual key. If the point coordinate of the fingertip falls within the region of a virtual key, a collision is determined. All keys in the pressed state without corresponding collisions are reset (step 412). The firmware of glove 104 checks for any collisions to process (step 414), if no collisions are queued the process loops back to step 402 to poll sensors for data.

If at step 414, one or more collisions are detected, as shown in FIG. 9B, the firmware of glove 104 iterates over each collision for processing (step 416). If no collisions are in the processing queue at step 416, the process loops to step 402 of FIG. 9A, and continue to poll the sensors for data. If collisions are in the queue at step 416, one collision is processed and then removed from the queue (the "process one collision" branch of step 416).

The state of the key associated with the current collision is checked (step 418). If the key is not marked as "Pressed", the firmware of glove 104 calculates the velocity of the fingertip that collided with the virtual key using the current and previously stored sensor data (step 420). At step 422, the firmware of glove 104 checks if the detected key-pressing is unintentional, including merely resting fingers on the tabletop 108.

To detect unintentional key presses, the firmware of glove 104 calculates the velocity of the fingertip and a velocity threshold associated with a key-press, including using historical fingertip positions over time as described above. As physical keyboards normally require a minimum amount of force to overcome the button's internal spring, and unintentional key tapping is generally light with a low fingertip velocity, the firmware compares the calculated fingertip velocity with a key-pressing velocity threshold, which may be a predefined velocity threshold or a user customizable velocity threshold. A keystroke is determined if the calculated velocity is higher than the key-pressing velocity threshold. The firmware of glove 104 then sets the state of the pressed key as "Pressed" (step 424), and sends the keystroke data of the pressed key, e.g., the character of the pressed key, to the computing device 102 (step 426). The process then loops to step 416 to process additional collisions.

If at step 420, it is determined that the calculated velocity is lower than the velocity threshold, the key pressing is unintentional and no keystroke is determined. The process loops to step 416 to process additional collisions.

If at step 418, it is determined that a key is already marked as "Pressed", the firmware of glove 104 checks the number of milliseconds elapsed since the keystroke was last sent (step 428). To provide for key repeat functionality, i.e. a key is held down, a key-repeat time threshold is used, which may be a predetermined time threshold or a user customizable time threshold. Processing of a collision is skipped if the elapsed time is less than the key-repeat time threshold, and key repeating is determined if the key has been held for a time period longer than the key-repeat time threshold.

If a valid key repeat is detected, the firmware of glove 104 maintains the state of the pressed key as "Pressed", and sends the keystroke data to the computing device 102 (step 426). The process then loops to step 416 to process additional collisions.

If at step 428, no valid key repeat is detected, the firmware of glove 104 loops to step 416 to process additional collisions.

The above process repeats until a termination condition is met, e.g., the gloves 104 being turned off, or a termination command sent to the computing device 102 via a hand gesture of the gloves 104, pressing a combination key of the software keyboard using the gloves 104, pressing a combination key of a physical keyboard of the computing device 102, pressing a hardware or software button, or any other suitable means.

Those skilled in the art appreciate that the function of the 3D input system 100 is not limited to typing. It may be readily used for other purposes, for example as a motion capture device for use in animated filmmaking, or for use in remote surgical cases.

Figure 10:
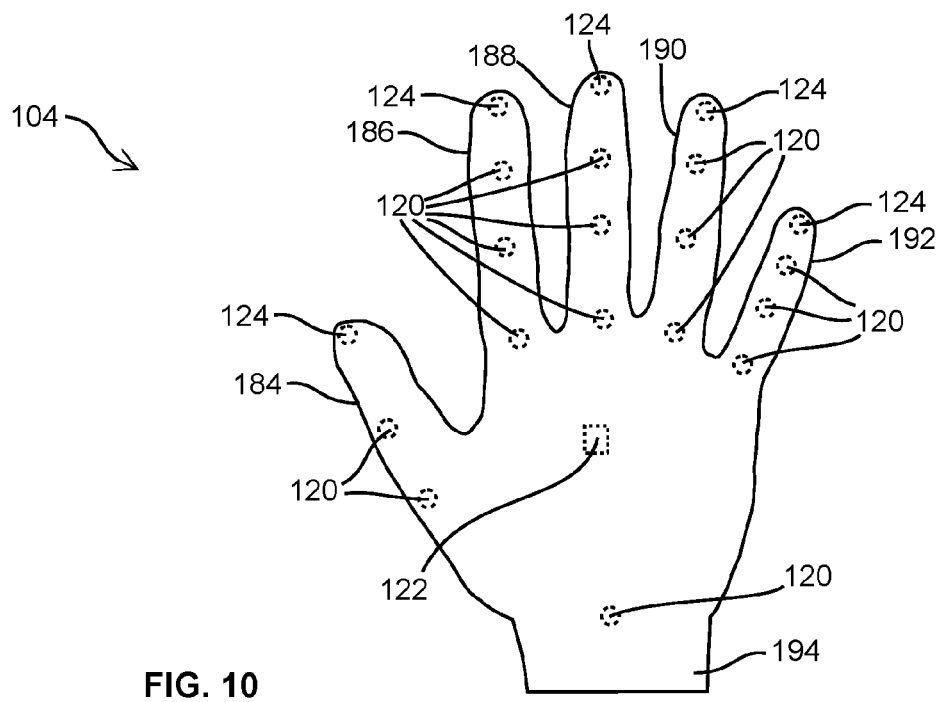
FIG. 10 illustrates a top view of the position sensing glove of the 3D input system of FIG. 2 employing contact sensors for detecting key presses, according to an alternative embodiment.

As shown in FIG. 10, in some alternative embodiments, contact sensors 124 in the form of accelerometers or contact switches, each being installed on a fingertip, may be utilized to detect key presses. A key-pressing state is determined when a fingertip is in contact with a surface, e.g., a table surface, and alters the state of the contact switch thereon.

In some alternative embodiments, at step 422 of the fingertip tracking process 400, each glove 104 uses a statistic estimation method for determining the key press of each fingertip, i.e., whether the collision of the fingertip and the virtual keyboard is an intentional key press or an unintentional key tapping.

For example, in one embodiment, the glove 104 uses a Neyman Pearson (NP) detection method for determining whether a key has been hit. The key being hit is determined by comparing the fingertip location with the location of the virtual keys, as described above.

The NP method is a binary hypothesis testing method using the well-known Neyman Pearson lemma for making a decision between two hypotheses $H_0$ and $H_1$. For example, for each fingertip, $H_0$ is a hypothesis of "fingertip not hitting any key", and $H_1$ is a hypothesis of "fingertip hitting a key". Based on a likelihood-ratio test, the NP method determines a threshold for rejecting $H_0$ in favor of $H_1$ with a so called significance leve $\alpha$ 1. In other words, the NP method determines a threshold for deciding that $H_1$ has occurred with a probability of a false alarm, i.e., falsely determined that $H_1$ has occurred, no larger than the significance level $\alpha$.

In the NP method, each hypothesis is associated with a probability space that is characterized by its probability density function (PDF). The type of the PDFs associated with $H_0$ and $H_0$ may be pre-determined. Alternatively, a maximum likelihood (ML) estimation method or the like may be used to determine the best PDF fit.

In this embodiment, the fingertip velocity $v_z$ is used, and is considered a random variable with a Gaussian distribution. The PDFs associated with $H_0$ and $H_1$ are then considered Gaussian distributions. A calibration process is then used for determining the parameters, e.g., the mean and variance, of the PDF of the hypotheses $H_0$ and $H_1$.

During the initial calibration, the computing device 102 prompts the user to type at least one set of predefined, specific characters or at least one predefined, specific phrase, such as, "This is Your ZeroKey glove initial Calibration."

The sensors of the gloves collect data, which is then used to form a user-specific probability space that corresponds to one or more features such as acceleration, velocity, and the like, of fingertips when they hit keys on the virtual keyboard, as well as when they do not hit any keys. Sensor outputs that correspond to the hypothesis $H_0$, i.e., "fingertip not hitting any key", and those corresponding to the hypothesis $H_1$, i.e., "fingertip hitting a key", $H_1$ are then used to characterize the corresponding PDFs.

For example, during calibration, the user is asked to type a predefined, specific phrase "This is Your ZeroKey glove initial Calibration." For determining the PDF parameters of the right index finger. For ease of presentation, this phrase is reproduced below with some characters enclosed in square brackets:

T[h]is is [Y]o[u]r ZeroKe[y] glove i[n]itial Calibratio[n].

The characters "h", "Y", "u", "y" and "n" enclosed in square brackets are generally entered using the right index finger, and thus, in the above phrase, these characters correspond to the $H_1$ hypothesis for the right index finger, i.e., the right index finger hitting a key, and other letters in the phrase correspond to the $H_0$ hypothesis for the right index finger, i.e., the right index finger not hitting any key.

The fingertip position of the right index finger is continuously calculated as described above. Here, the term "continuously" has a meaning in the discrete time domain, where the outputs of sensors of the gloves 104 are sampled at discrete time instances, and the fingertip position of the right index finger is consecutive calculated for each sampling time instances. Of course, in some embodiments, continuous-time signal processing may be used, and the term "continuously" then has a meaning in the continuous time domain.

Using the calculated fingertip location, the velocity $v_{z,RIF}$ of the right index fingertip along the z-axis can be determined as $$v_{z,RIF}[n] = \frac{Z(t_n) - Z(t_{n-1})}{t_n - t_{n-1}} \tag{13}$$

where $t_{n-1}$ and $t_n$ are two consecutive time instances. These values of $v_{z,RIF}[n]$ are then used to estimate the mean and the variance of the Gaussian PDFs corresponding to $H_0$ and $H_1$ hypothesis as follows:

$$v_{z,RIF}[n] = \frac{Z(t_n) - Z(t_{n-1})}{t_n - t_{n-1}}, \quad (14)$$

$$\mu_{v,RIF} \mid H_0 = \frac{1}{N_{H_0}} \sum_{i=1}^{N_{H_0}} v_{z,RIF}[n_i], \quad (15)$$

$$\mu_{v,RIF} \mid H_1 = \frac{1}{N_{H_1}} \sum_{k=1}^{N_{H_1}} v_{z,RIF}[n_k], \quad (16)$$

$$\sigma^2_{v,RIF} \mid H_0 = \frac{1}{N_{H_0} - 1} \sum_{i=1}^{N_{H_0}} (v_{z,RIF}[n_i] - \mu_{v,RIF} \mid H_0)^2, \quad (17)$$

$$\sigma^2_{v,RIF} \mid H_1 = \frac{1}{N_{H_1} - 1} \sum_{k=1}^{N_{H_1}} (v_{z,RIF}[n_k] - \mu_{v,RIF} \mid H_1)^2, \quad (18)$$

where $H_0$ is the hypothesis that characters {Tis is or ZeroKe glove iitial Calibratio.} have been typed, $H_0$ is the hypothesis that characters {hYuynn.}, $n_i$ represents the time instances that $H_0$ has occurred, $n_k$ represents the time instances that $H_1$ has occurred, and $N_{H_0}=41$, $N_{H_1}=6$.

After determining the means $\mu_{v,RIF}|H_1$ and $\mu_{v,RIF}|H_1$ of $H_0$ and $H_1$, respectively, and the variances $\sigma_{v,RIF}^2|H0$ and $\sigma_{v,RIF}^2|H1$ thereof, a velocity threshold of fingertip velocity $\gamma_{RIF}$ is then determined using the Neyman Pearson lemma for the right index finger for the user-specific probability space and based on the required probability of false alarm $P_{FA}$ as $$\gamma_{RIF} = Q^{-1}(P_{FA}), \quad (19)$$

where $$Q = \int_{\gamma}^{+\infty} f_{v,RIF}(v_{z,RIF} \mid H_0) d a_{RIF}, \quad (20)$$

$Q^{-1}(\bullet)$ represents the inverse function of $Q(\bullet)$, and $f_{v,RIF}(v_{z,RIF}|H_0)$ is the PDF of $v_{z,RIF}$ under $H_0$. When the velocity $v_{z,RIF}$ of the right index fingertip is greater than the set threshold $\gamma_{RIF}$, a key-pressed event by the right index finger is determined.

Depending on the implementation, for a glove 104, the calibration process may determine a velocity threshold $\gamma_i$ for each fingertip $F_i$, where i=1, . . . , $N_F$, and $N_F$ is the number of the fingers of the glove 104, for determining the key press of the respective finger. Alternatively, a velocity threshold $\gamma_i$ may be determined for one fingertip $F_i$, and is used as the velocity threshold $\gamma$ for all fingertips. Yet alternatively, the calibration process determines a velocity threshold $\gamma_i$ for each fingertip $F_i$, and then combines the determined velocity thresholds $\gamma_i$ to determine a velocity threshold $\gamma$ for all fingertips.

In various embodiments, a system designer may choose any of the above described velocity threshold(s) determination methods for each or both gloves 104. For example, in one embodiment, the calibration process determines a separate velocity threshold for each fingertip of each glove 104. In another embodiment, the calibration process determines a separate velocity threshold for each fingertip of one glove 104, and determines a single velocity threshold for all fingertips of the other glove. In yet another embodiment, the calibration process determines a single velocity threshold for all fingertips of both gloves 104.

In some alternative embodiments, other suitable methods may be used for setting the velocity threshold, e.g. methods based on minimum probability of error, heuristic threshold settings, or the like.

Key press may also be determined using other characteristics of the fingers or fingertips, e.g., in some embodiments, fingertip acceleration may be used to determine key press using above or other suitable methods. All or a subset of sensor outputs may be combined to determine key press.

In above embodiments, velocity or acceleration of fingertip along the z-axis is used for determining key press. In some alternative embodiments, the fingertip velocity along another axis or the magnitude of the total velocity or acceleration can also be used. As well, data from other sensors e.g. accelerometer and/or other hinge encoders can also be used to improve the estimation of fingertip movement features.

In an alternative embodiment, a Bayesian Filter, such as a Kalman Filter or Particle Filter, is used for tracking the position of fingertips based on the outputs of the sensors in the gloves 104. In another embodiment, the Bayesian Filter is further improved with the prediction of the position of fingertips based on the predicted spelling of the word as the key corresponding to the next letter that the user is going to type on the virtual keyboard. This prediction can be compared against the relevant sensor outputs e.g. hinge encoders, IMU, and the like, to correct the predicted position of the fingertip on the virtual keyboard.

In another embodiment, the glove 104 also comprises one or more suitable wireless transmitters, such as WiFi® or Bluetooth® transmitters. A wireless receiver, such as a WiFi® or Bluetooth® receiver, near the glove 104 receives the wireless signal transmitted from the one or more wireless transmitters, and measures the Time of Arrival (TOA). The TOA is then combined with outputs of other sensors, e.g., IMU and or angle encoders through a Bayesian Filter, e.g. Kalman Filter or Particle Filter to estimate glove and fingertip positions. Of course, alternatively, the glove 104 may comprise a wireless receiver for receiving the wireless signals transmitted from the one or more nearby wireless transmitters for estimating glove position. Once the glove position is determined, the fingertip positions can be determined using the above described methods and the glove position. Alternatively, the TOA measurement may be directly combine with data of other sensors including the angle encoders and IMU(s) to directly calculating the glove and fingertip positions.

In another embodiment, the calculation of glove and fingertip positions may be further assisted by applying a constraint that, when typing, the fingertips and/or the gloves would within a predetermined or dynamically calculated range in the 3D space. For example, when typing, the fingertips would not be below a predetermined or dynamically calculated elevation range, which may be used as a constraint for better detection of fingertip actions.

In another embodiment, the glove 104 further comprises one or more other suitable sensors such as magnetometer and/or barometer, which may be used for estimating the glove and fingertip locations and/or elevations, respectively. The output of these sensors may be combined with the output of IMU, angle encoders, and/or TOA measurements through a Bayesian Filter, e.g. Kalman Filter or Particle Filter to estimate glove and fingertip positions.

Figure 11:
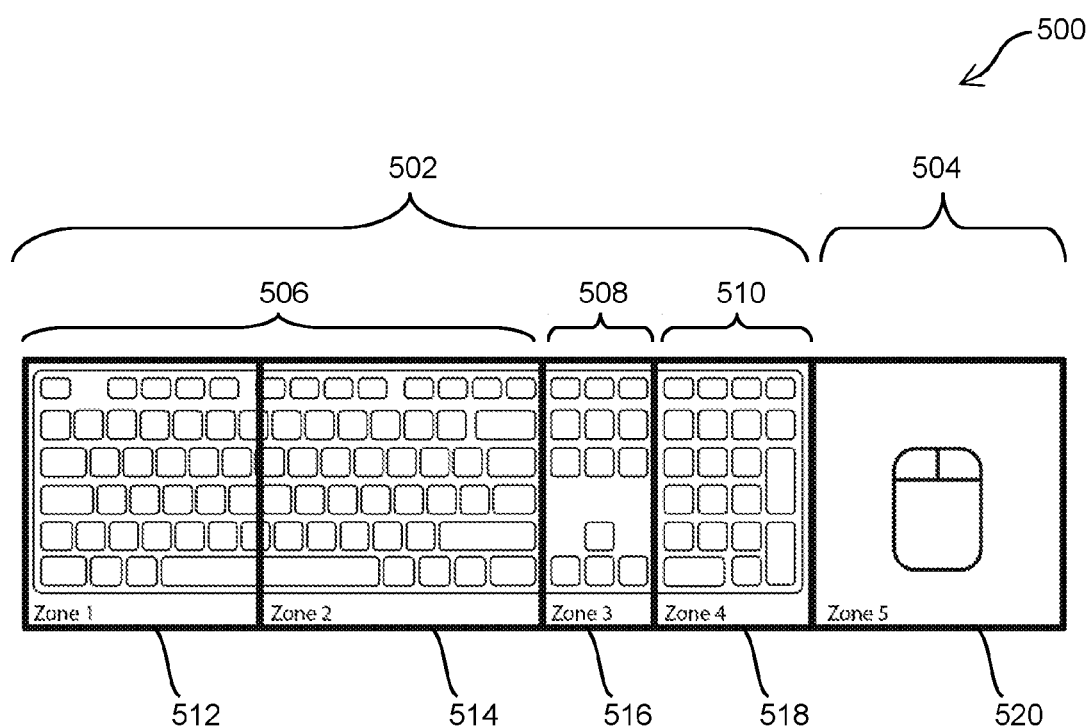
FIG. 11 shows an example of a virtual keyboard having a typical, full-size computer keyboard portion and a mouse pad portion, according to an alternative embodiment.

In some scenarios, such as typing, exact positioning of the gloves is not required and sometimes even undesired. In embodiments for such scenarios, the virtual keyboard may be divided into a plurality of zones for additional errorreduction, e.g., for counteracting user and sensor errors. FIG. 11 shows an example of a virtual keyboard 500 having a typical, full-size computer keyboard portion 502 and a mouse pad portion 504. Similar to the physical computer keyboards known in the art, the computer keyboard portion 502 comprises a typewriter key portion 506, a navigation key portion 508 and a number key portion 510.

As shown, the virtual keyboard 500 is divided into five (5) zones 512 to 520. The first zone 512 includes keys in the typewriter key portion 509 that are normally typed using the left hand, the second zone 514 includes keys in the typewriter key portion 509 that are normally typed using the right hand. The third, fourth and fifth zones 516, 518 and 520 correspond to the navigation key portion 508, the number key portion 510 and mouse pad portion 520, respectively.

Any of the zones 512 to 520 may be an active zone when a glove 104 is positioned in the proximity thereto. In each active zone, an additional, zone position variable P is measured and tracked. As those skilled in the art appreciate, the position of a hand, or glove 104, may drift during typing. The zone position variable P stores the relative position of the glove 104 with respect to a reference point, e.g., the center, of the active zone, and is then used for compensating the glove drift.

In these embodiments, the gloves 104 are first calibrated as described above. A virtual keyboard 500 is then established under the gloves 104, and the user then starts to use the gloves 104 to input text or command using the virtual keyboard 500. During use, the position of each glove 104 is continuously tracked at regular time intervals as described above. The position drift of each glove 104, which is measured as a distance vector of the glove 104 to the zone center point, is also tracked. At regular time intervals T, a corrective vector Q is calculated as follows:

$$Q = -C\left(\frac{P}{\|P\|}\right) \quad (21)$$

where C is a correction coefficient, and $\|P\|$ represents the norm, or magnitude of the vector P. The corrective vector Q is then added to the coordinates of the glove position such that the glove drifts back towards the zone center. As a result, positioning errors due to small sensor drift or small unintentional user movements are eliminated.

Both the correction coefficient C and the time intervals T, may be of predefined values. Alternatively, the correction coefficient C and T may be initially be predefined, but automatically and dynamically adjusted in use for adapting to user's typing behavior. Those skilled in the art appreciate that many estimation or learning algorithms in conjunction with a suitable error function can be utilized to adaptively adjust both C and T. For example, in one embodiment, one may iterate over all possible values of C and T, calculate the error of the historical data set and select the values which produce the lowest error rate. The error function may be selected based on design requirements. For example, in typing an error might be indicated by the number of times the backspace is pressed immediately preceding a key that neighbours the key pressed before the backspace. An error function may then be determined for adjusting the values of C and/or T.

The corrective coefficient C and T are generally small as the glove positioning error causing drift is usually of small distance between consecutive time instances. Thus, the above glove drift compensation would not prevent user from switching the active zones, i.e., purposively moving hand/glove from one zone to another. When user purposively moves a hand/glove from one zone to another, it generally involves quick hand/glove movement exceeding the corrective vector C, and crosses the boundary of the current active zone to another zone. The system detects such a glove movement, denotes the previous active zone as inactive, and denotes the zone that the glove is currently in as an active zone. The centre of the new active zone is used in calculating the corrective vector Q.

In another embodiment of the current disclosure, the output of the KF/Bayesian positioner will be fed into a zone detection algorithm to determine the nominal glove positions, i.e., the relative positions of the glove in the zone. Nominal glove positions are useful in the applications in which the exact glove positions are not required, such as typing.

When a glove 104 is moved into the mouse pad zone 520, the action of the glove 104 is interpreted by the system as a computer mouse input, including position translation, left-click and/or right-click, as if the user is holding a computer mouse in their hand. The position translation corresponds to the movement of the hand in the mouse pad zone 520, a left-click command is generated when the system detects that the index finger of the glove 104 has made a "click" action, and a right-click command is generated when the system detects that the middle finger of the glove 104 has made a "click" action.

In position translation, the mid-point of a line drawn between the pinky fingertip, i.e., the fingertip of the little finger, and the thumb fingertip is used as the "mouse" position, i.e., the reference point of a virtual mouse for determining the position of the mouse cursor in the computer screen. Position changes of this reference point are calculated as mouse position translation, and is used for determining mouse cursor movements.

In some alternative embodiments, additional mouse functions are also emulated, including scroll wheel, side buttons and mouse-pickup (which, when detected, prevents mouse position translation while the glove is repositioning). Such functions may be emulated by detecting the finger and hand actions that may be performed by a user when the user is holding a real computer mouse. For example, the elevation of the glove 104 may be monitored, and if it is detected that the glove 104 has been lifted from its original, working elevation for a height higher than a predefined height threshold, a mouse-pickup is then determined, and the position translation of the glove 104 no longer triggers mouse position translation, until the glove 104 is put back to the working elevation.

Those skilled in the art appreciate that the virtual keyboard and the corresponding keyboard image 110 may have various implementations in various embodiments. For example, in above embodiments, the virtual keyboard is a full-size computer keyboard. However, in alternative embodiments, the virtual keyboard may be other suitable keyboard, such as, a number input keyboard, a calculator keyboard or the like. In some embodiments, the system 100 allows the user to select a keyboard layout suitable for the task to be performed. For example, a user may choose a non-standard keyboard layout particularly designed for a medical imaging device. The user may switch between a normal keyboard layout and their custom layout as needed. In some embodiments, the virtual keyboard does not include any mouse pad portion 504, and consequently no mouse pad zone 520. In an alternative embodiment, the position sensing glove 104 also provides a locating function for helping the user return to the home row position without having to repeat the calibration process. In this embodiment, the glove 104 comprises a vibrator, e.g., a vibration motor. When the index finger of the associated hand, i.e., the hand wearing the glove 104, moves to its home row position, i.e., the position that the index finger was placed during calibration, a vibration is triggered in the glove 104 to notify that the index finger has reached the home row position.

Although, in the above embodiments, a keyboard image is shown for assisting the user to use the virtual keyboard, in another embodiment, the system 100 does not show any keyboard image, and the user relies on the so-called typing muscle memory to use the virtual keyboard.

As described above, the glove 104 can detect the hand and fingertip positions and interpret the action of hand and fingertips as gestures. Thus, the glove 104 is not limited as an input device for operating a virtual keyboard and/or a virtual mouse. In some embodiments, the glove 104 can be used as a gesture input device for manipulating graphic objects and/or virtual reality objects using gestures. For example, in one embodiment, the glove 104 may be used in a flight simulator or a flight game for operating a virtual aircraft.

Although in above embodiments, a firmware in the glove 104 processes sensor data and sends processed data to the computing device 102, in an alternative embodiment, the firmware of the glove 104 does not process sensor data. Rather, it receives data from the sensors and forwards unprocessed data to the computing device 102. The computing device then processes received sensor data to determine user input.

In above embodiments, where two glove 104A and 104B are used, sensor data collected by one glove 104*b* may be sent to the other glove 104A, and glove 104A combines received sensor data with that collected by itself. In an alternative embodiment, each glove collects sensor data and processes collected sensor data independently. In another embodiment, each glove collects sensor data and sends collected data directly to the computing device 102 for processing.

Although in above embodiment, the glove 104 comprises five fingers, in some alternative embodiments, the glove 104 may comprise a different number of fingers. In some other embodiments, some fingers of the glove may not comprise any angle encoders at all.

In some embodiments, some joint locations of the glove 104 may comprise more than one angle encoder. For example, in one embodiment, the wrist of the glove 104 may comprise two angle encoders, one for detecting angular movement of wrist along a vertical plane (i.e., an X-Z or a Y-Z plane) and the other for detecting angular movement of wrist along a horizontal plane (i.e., an X-Y plane).

Although in above embodiments, the position sensing device is in the form of a glove, in an alternative embodiment, the position sensing device is in the form of a set of strips for attaching to fingers. In other embodiment, the position sensing device is in the form of a wearable sleeve, or a sleeve of a suit. Angle encoders are installed thereon at joint locations of, e.g., the elbow, the shoulder and the like, for detecting movement of a user's arm. Similarly, the position sensing device may be in the form of a pair of pants with angle encoders installed about knee and ankle for detecting movement of legs.

In above embodiments, a tabletop 108 is used for landing user's fingers during virtual keyboard manipulation. In an alternative embodiment, the system 100 does not include a tabletop 108 and the user can manipulate a virtual keyboard "in the air", i.e., without landing fingertips on a physical surface. In this embodiment, the gloves may not comprise any contact switches for determining key pressing state, and the X-Y plane of the virtual keyboard is determined by the position of the hand during the calibration process.

In another embodiment, finger abduction sensors are used on at least some fingers to more accurately measure the position of these fingers in a 3D space.

In an alternative embodiment, the position sensing glove(s) 104 are used for manipulating a virtual keyboard on a tabletop. The virtual keyboard are sized such that the base of the user's hand(s) are not moved any significant amount during operation. In this embodiment, the position sensing glove(s) do not comprise any IMU 122.

In this embodiment, the fingertip positions with respect to the glove or hand are calculated using, e.g., the outputs of angle encoders, and the calculated fingertip positions are used as the actual fingertip positions in the 3D space. Moreover, as the glove(s) are used on a physical tabletop, the lowest elevation of each fingertip is constrained to a minimum elevation, which may be used for better key-press detection. Such a minimum elevation may be obtained through a calibration process, or may be dynamically determined in use.

In an alternative embodiment, the position sensing glove(s) 104 uses angle encoders to detect the position of the hand. In this embodiment, the position sensing glove(s) do not comprise any IMU 122.

In an alternative embodiment, the computing device does not comprise an operating system. In this embodiment, the computing device only comprises a firmware running a system monitoring program for receiving input from the position sensing glove(s) 104, and generating output for an output device. The computing device may also process the data received from the position sensing glove(s) for generating output.

In an alternative embodiment, during the calibration process, bone length measurements are automatically tuned by the software to reconcile angular measurements and the static home row position. Bone length is further tunable automatically by the software and/or manually by the user to improve accuracy. In this embodiment, the firmware automatically tunes the bone lengths based on the conditions that (a) the user's finger would not go through the surface they are typing on, i.e., each fingertip's z-axis location is always greater than or equal to zero (0), (b) fingers will decelerate to zero (0) velocity when in contact with the typing surface, and (c) the point at which the fingers decelerate to a stop is at an X-Y plane of Z=0, and if such a stop position is at an X-Y plane of a non-zero Z coordinate, an error in the calculated Z coordinate occurs.

Based on these conditions, first, a user-guided calibration process requires the user to place the glove 104 in the home row position on a horizontal surface. Using the accelerometer data, the keyboard X-Y plane is mapped to be perpendicular to the force of gravity. The fingertip position is calculated for all fingers. Non-zero fingertip positions in the Z-axis indicate that the corresponding bone length data is incorrect. The process iterates over the different bone segments, solving for a factor that, when applied to that individual segment, will compensate for the Z coordinate of the fingertip, i.e., tuning the Z coordinate of the fingertip to zero. This factor is applied to the same bone segment of each finger (excluding the thumb). Based on a completed data set, the bone length is adjusted such that it best-fits for all fingers (since fingers are usually proportionate). A factor is selected such that it gives rise to the minimal amount of change in bone length (since the glove is less likely to fit persons with large deviations in length).

Such a calibration process is an initial calibration process for the user. The bone lengths calibrated during the calibration process are stored and used during operation.

In another embodiment, an automatic calibration process is used. The calibration process is based on a condition that the virtual keyboard has a predefined thickness, e.g., 4 mm, in a 3D space. As the glove processes motion data and detects key presses, the firmware thereof may detect that the Z coordinate of the typing motion does not reach zero (0), indicating a small error in Z-coordinate calculation. Using historical sensor data, the glove iterates through adjustments that zeros the Z-coordinate to satisfy all historical motions.

In above embodiments, the controller 126 processes data output from the angle encoders 120 and the IMU 122, calculates the fingertip positions and the glove position, and transmits the calculated fingertip positions and the glove position to the computing device 102. In an alternative embodiment, the controller 126 collects data output from the angle encoders 120 and the IMU 122, and transmits the collected data to the computing device 102. The computing device 102 then calculates the fingertip positions and the glove position.

In an alternative embodiment, the controller 126 generates a virtual keyboard, calculates the fingertip positions and the glove position, determines keystrokes and/or gestures, and transmits the determined keystrokes and/or gestures to the computing device 102.

In above embodiments, the system calculates the 3D fingertip locations with respect to the glove 104 using the angle data of the angle encoders 120, calculates the 3D hand location using the IMU 122 and/or other suitable sensors, and uses the calculated 3D hand location for determining the actual fingertip locations in the 3D space. In some alternative embodiments, the glove 104 may not comprise any sensor, e.g., any IMU, for determining the 3D hand location. In these embodiments, the hand location is considered irrelevant. The system calculates the 3D fingertip locations with respect to the glove 104 using the angle data of the angle encoders 120, and considers the calculated 3D fingertip locations as the actual 3D location of the fingertips.

In some alternative embodiments, the position sensing glove 104 may not comprise a supportive substrate. For example, in one embodiment, the position sensing glove 104 may only comprise the above described sensors, e.g., the rotary angle encoders and IMU(s), which are supported by supportive wires. In another embodiment, the above described sensors are directly attached to a user's hands by suitable means such as removable tapes or glues. Moreover, the above described sensors may be alternatively interconnected via suitable wireless means.

In another embodiment, the glove 104 further comprises artificial muscles, e.g., on each finger from the fingertip to the knuckle thereof. Such artificial muscles are made of suitable materials such as nitinol. When an electrical current is applied thereto, the current causes the artificial muscles' temperature to increase, and consequently the artificial muscles contract. When the electrical current is stopped, the artificial muscles cool down and expand.

In this embodiment, the artificial muscles are controlled based on detection of collision between fingers and one or more virtual objects, and/or between the hand and one or more virtual objects, to provide force feedback to the wearer such that the wearer obtains a grabbing feeling against virtual objects in a 3D virtual reality environment.

In other embodiments, force feedback may alternatively be provided using other suitable methods. For example, a number of strings or wires may be arranged along the fingers of a glove 104, which may be tensioned and relaxed to provide force feedback to the wearer based on the action of the hand and/or fingertips.

The position sensing glove 104 may alternatively use other suitable angle finding sensors or angle encoders, for example, the angle encoders of FIGS. 12A to 32B to be described below may alternatively be used in the position sensing glove 104.

Turning now to FIGS. 12A and 12B, an angle encoder is shown and is generally identified by reference numeral 1100. The angle encoder 1100 comprises a housing 1102 concentrically receiving a shaft 1104 rotatable about its axis 1106. The housing 1102 also receives therein an encoder pattern in the form of an encoder disc 1108 adjacent the bottom 1110 thereof and concentrically fixed to the shaft 1104 and rotatable therewith. Herein, the term "encoder pattern" is sometimes described as the pattern of a physical encoder component (in the form of a mechanical component or an electrical component) such as an encoder disc 1108. However, the term "encoder pattern" shall also be understood as the encoder component itself for ease of description.

As will be described in more detail later, the encoder disc or encoder pattern 1108 comprises a plurality of rings. Herein, a ring of an encoder disc and a strip of a flexible printed circuit board (PCB) (described later) may be collectively denoted as a track. Each ring is partitioned to a plurality of equal angular-length segments, and each segment records a binary information, e.g., recording either binary zero (0) or binary one (1).

A reader 1174 having a row of reader bits in the form of a row of electrical sliding contacts 1176 is fixed to the inner surface of the bottom 1110 of the housing 1102, and is in contact with the encoder disc 1108. The number of the contacts 1176 of the reader 1174 is the same as that of the rings of the encoder disc 1108. Each contact 1176 rests against a respective ring, and reads the information of a segment it overlaps therewith. Each contact 1176 is connected to a separate electrical detector (not shown). Therefore, the electrical detectors together detect a binary codeword, the content of which depends upon the angular location between the encoder disc 1108 and the reader 1174.

FIG. 13 shows an example of the encoder pattern 1200 of the disc 1108. In this embodiment, the encoder disc 1108 comprises a plurality of rings 1202 to 1210 concentric with respect to a common center 1212. The plurality of rings 1202 to 1210 include n inner rings 1202, 1204 and 1206 (i.e., n=3 in the example of FIG. 13) acting as base encoder channels, and m outer rings 1208 and 1210 (i.e., m=2 in the example of FIG. 13), acting as Booster channels.

Each channel is partitioned into a plurality of equal angular-length segments. Herein, the angular-length of a segment is the angular span of the segment with respect to the common center 1212, measured in rad or degree. In each channel, each segment records a binary information, e.g., recording either binary bit zero (0) or binary bit one (1), using known methods. For example, in FIG. 13, the shaded segments 1214 store 1's and the non-shaded segments 1216 store 0's.

In this embodiment, segments storing bit one are made electrically conductive and are connected to an electrical source such as a current source or a voltage source, and segments storing bit zero are made electrically nonconductive. The contacts 1176 of the reader 1174 slide over and in contact with segments of the respective channels. Contacts 1176 in contact with conductive segments thus connects the electrical source to the electrical detectors that the respective contacts 1176 are connected thereto, and generates a signal representing bit one. Contacts 1176 in contact with nonconductive segments cause the respective electrical detectors to generate bit zero. Those skilled in the art appreciate that other methods of storing bit zero and bit one in the segments, e.g., magnetic-, capacitive-, mechanical- and optical-based methods, and the corresponding reading methods may also be used in alternative embodiments.

Figures 14A, 14B:
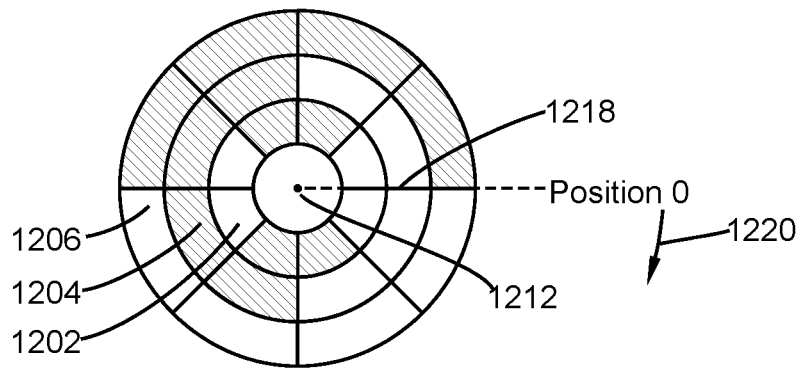
FIG. 14A shows the base encoder channels of the encoder pattern of FIG. 13.
FIG. 14B shows the conventional Gray code stored in the base encoder channels of FIG. 14A.

In this embodiment, the segments of the base channels are encoded using a conventional Gray code. FIG. 14A shows the base channels 1202, 1204 and 1206 only. As shown, starting from a common radial base position (Position 0) 1218, each of the base channels 1202, 1204 and 1206 is partitioned into $2^n$ angularly aligned, equal angular-length segments such that each segment has an angular length of $360°/2^n$, and each segment of a channel is angularly aligned with (n−1) segments respectively on the other (n−1) channels. In this example, each segment has an angular length of 45°.

The segments are then coded with, or store, 1's and 0's using the method described above such that the angularly aligned n segments, reading from the innermost channel 1202 radially outwardly to the outermost channel 1206, form a n-bit conventional Gray codeword. Of course, those skilled in the art appreciate that, in an alternative embodiment, one may read from the outermost channel 1206 radially inwardly to the innermost channel 1202, and the so-obtained codeword is also a n-bit conventional Gray codeword.

The encoder disc 1108 and thus the encoder pattern 1200 may be rotated counterclockwise with the reader 1174 being stationary such that the codewords are read clockwise. For ease of description, we describe the codewords hereinafter with a configuration that the bits of a codeword are read starting from the encoder pattern 1200 from the innermost channel radially outwardly, and the codewords are read clockwise as indicated by the arrow 1220. FIG. 14B shows the conventional Gray code stored in the three base encoder channels 1202, 1204 and 1206 of FIG. 13, and read out clockwise from the common radial base position 1218. In an alternative embodiment, the encoder disc 1108 is stationary and the reader 1174 is rotating clockwise, giving rise to the same codewords in the same order as FIG. 14B. In some other embodiments, the codewords may be read starting from the common radial base position 1218 counterclockwise (rotating the encoder disc 1108 clockwise with reader 1174 stationary, or alternatively, rotating the reader 1174 counterclockwise with the encoder disc 1108 stationary), giving rise to the same codewords as FIG. 14B but with a different order. Moreover, those skilled in the art appreciate that the common radial base position 1212 does not necessarily correspond to codeword 000. Rather, one may arbitrarily choose another starting position as desired to read the codewords in various embodiments.

Referring back to FIG. 13, the m outer, Booster channels 1208 and 1210 are each partitioned to $2^n$ angularly equal-length segments, each having an angular length of $360°/2^n$, and alternately coded with 0's and 1's. However, as shown in FIG. 13, the segments of each Booster channel 1208 and 1210 are angularly offset from the base encoder channels 1202 to 1206.

Figure 15:
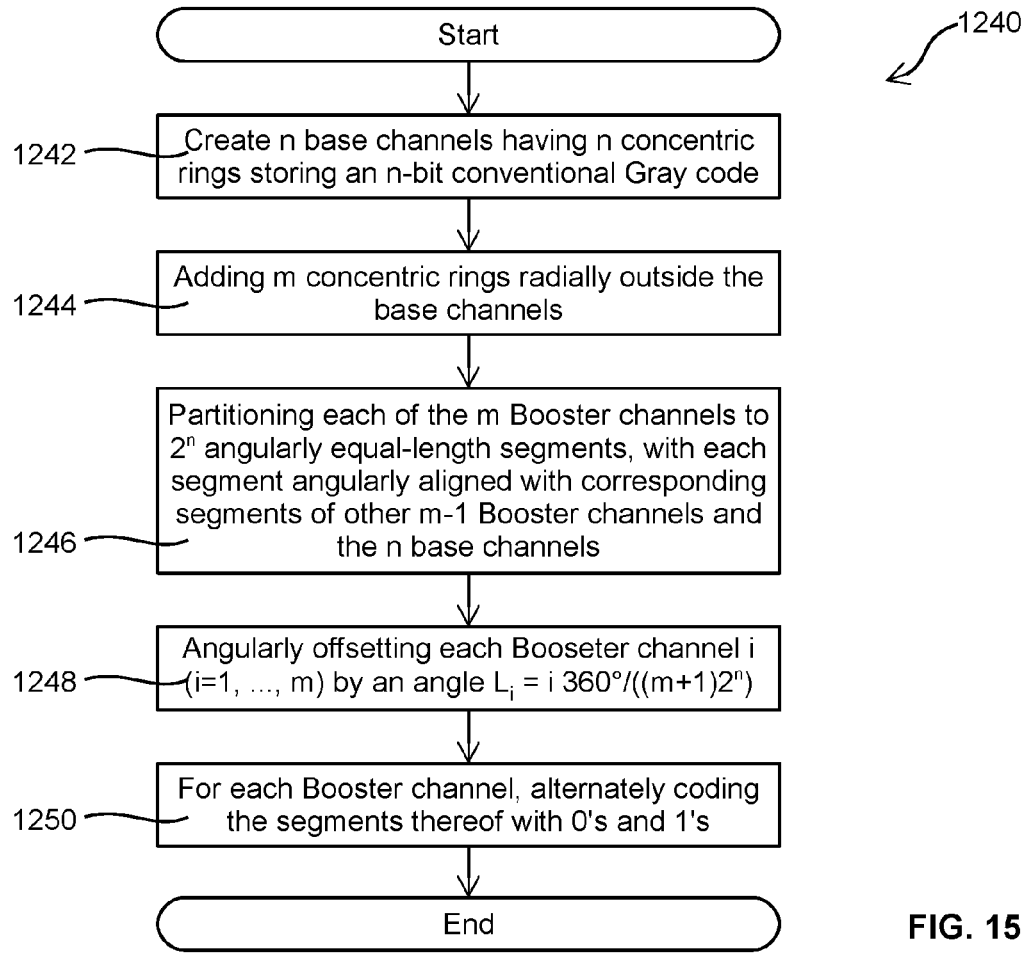
FIG. 15 is a flowchart showing the steps of a process for generating an encoder pattern having n base channels and m Booster channels.

FIG. 15 is a flowchart showing the steps of a process 1240 for generating an encoder pattern having n base channels and m Booster channels. As shown, one may first generate n base channels having n concentric rings storing an n-bit conventional Gray code (step 1242). The generating of such Gray code base channels is known in the art, and is not described in detail. Then, one may add m concentric rings as m Booster channels radially outside the n base channels (step 1244), and partitioning each of the m Booster channels to $2^n$ angularly equal-length segments, with each segment angularly aligned with corresponding segments of other m−1 Booster channels and the n base channels (step 1246). At step 1248, along a predefined angular direction, e.g., clockwise, each Booster channel is offset by a separate angular offset distance. In particular, the i-th Booster channel, wherein i=1, . . . , m from the innermost Booster channel (i=1) radially outwardly to the outermost Booster (i=m), is offset by $$L_i = \frac{S \, i}{m+1}, \quad (22)$$

where $$S = \frac{360°}{2^n} \quad (23)$$

represents the angular length of each segment. Using Equations (22) and (23), one can determine that the minimum angular offset distance is $L_1=S/(m+1)$. At step 1250, the segments of each channel are alternately coded with 0's and 1's, starting from coding a start segment with a zero (0). An encoder pattern for the encoder disc 1108 with n base channels and m Booster channels is then formed.

Figure 16A:
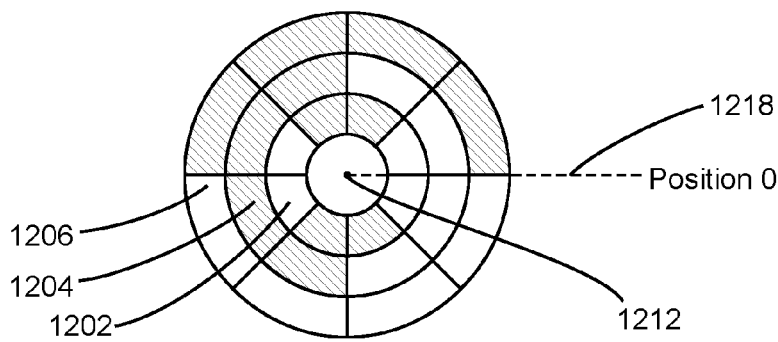
FIGS. 16A to 16F show an example of generating the encoder pattern of FIG. 13.
Figure 16B:
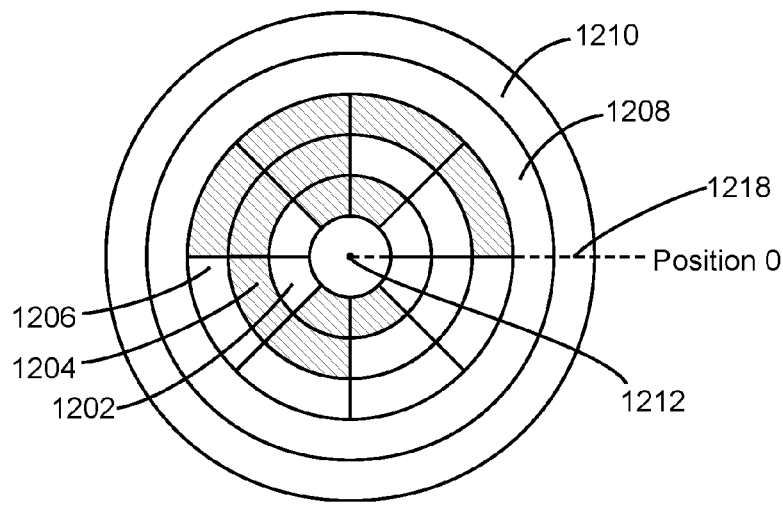
Figure 16C:
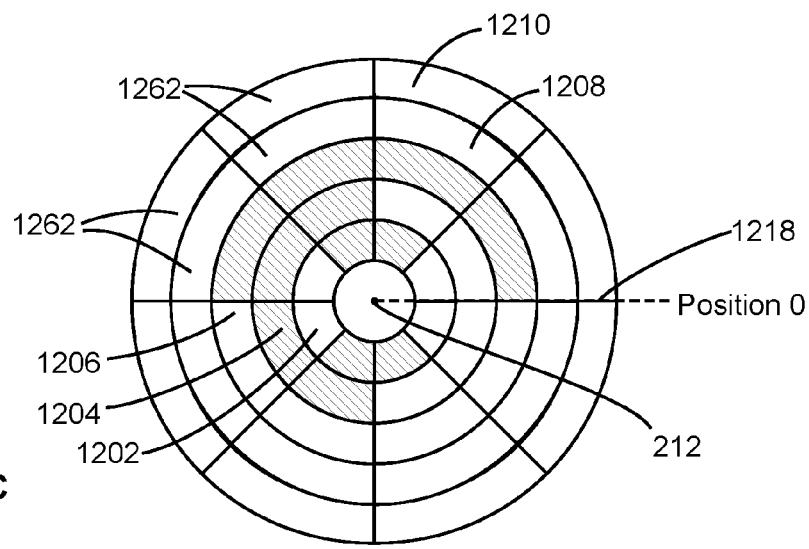

FIGS. 16A to 16F show an example of generating the encoder pattern 1200 of FIG. 13 having n=3 base channels and m=2 Booster channels. As shown in FIG. 16A, three (3) base channels 1202 to 1206 are first generated storing a 3-bit conventional Gray code (step 1242 of FIG. 15). In FIG. 16B, two (2) concentric rings 1208 and 1210 are added radially outside the n base channels 1202 to 1206 (step 1244). In FIG. 16C, each Booster channel 1208, 1210 is partitioned into eight (8) angularly equal-length segments 1262 angularly aligned with corresponding segments of the other Booster channel (1210, 1208) and the base channels 1202 to 1206 (step 1246).

Figure 16D:
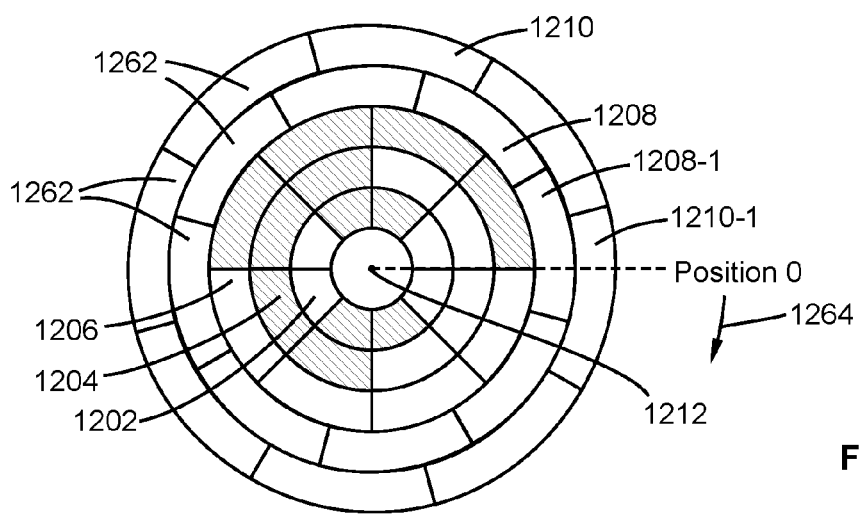

In FIG. 16D, each Booster channel is offset clockwise as indicated by the arrow 1264 by a respective offset angle calculated using Equations (22) and (23). In particular, the first Booster channel 1208 is offset clockwise by $L_i=15°$, and the second Booster channel 1210 is offset clockwise by $L_i=30°$.

Figure 16E:
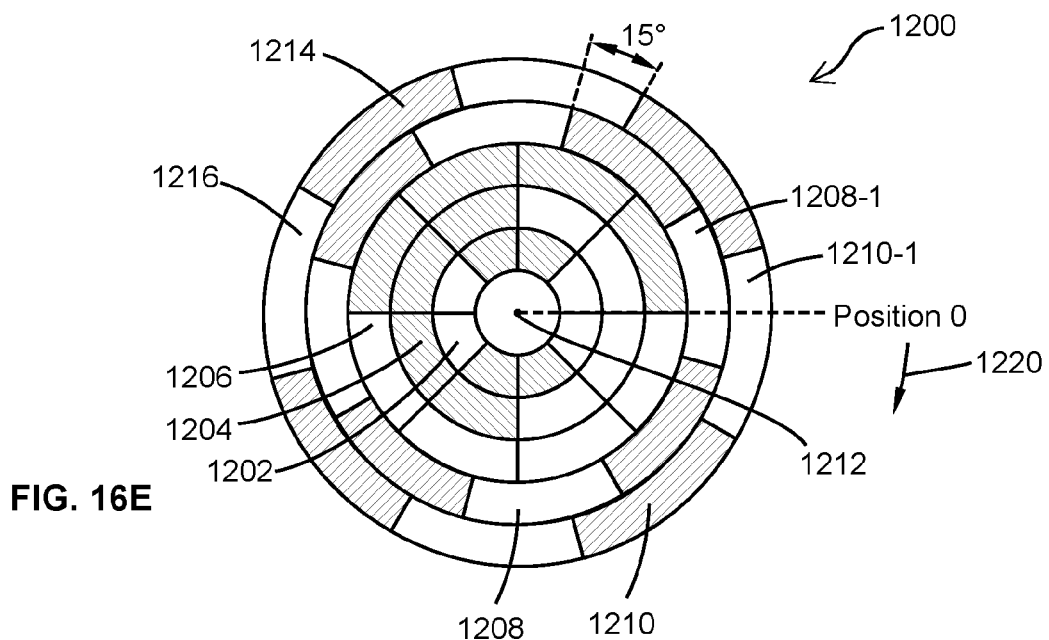

The segments of each of the Booster channels 1208 and 1210, starting from a respective, arbitrary-selected start segment such as 1208-1 of channel 1208 and 1210-1 of channels 1210, are alternately coded with 0's and 1's. As shown in FIG. 16E, starting from coding segment 1208-1 as a zero (0), segments of channel 1208 are alternately coded with 0's and 1's, with 0's shown as blank segments, and 1's shown as hatched segments. The encoder pattern 1200 is then generated.

Figure 16F:
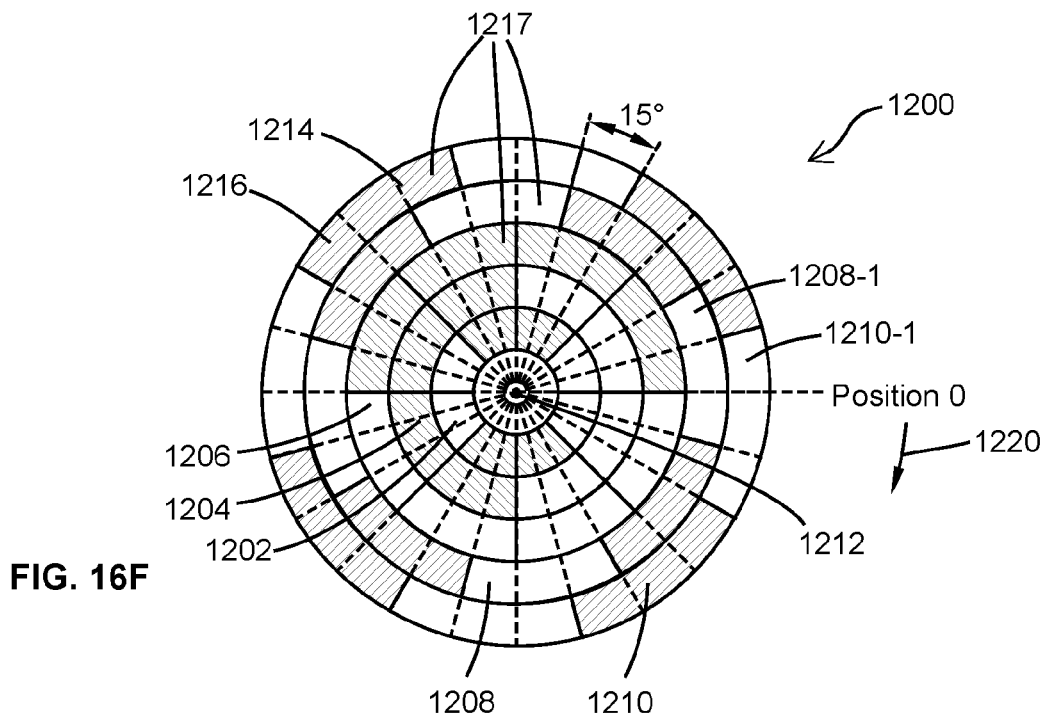

As shown in FIG. 16F, the edges of the segments partitions each of the rings 1202 to 1210 is into 24 sectors 1217, with each sector having an angular length of $L_1$. Each radial row of five (5) sectors encode a codeword. FIG. 16G lists the codewords of the encoder pattern 1200 of FIG. 16F, reading out from the innermost ring 1202 to the outermost ring 1210.

Also shown in FIG. 16F, an encoder pattern 1200 may alternatively formed by first generating the codewords of a(n,m) boosted cyclic Gray code, partitioning an encoder disc into (n+m) concentric rings, partitioning each ring into $(m+1)2^n$ sectors 1217, and then storing the $(m+1)2^n$ codewords in the encoder disc such that each sector stores a one (1) or a zero (0), and each codeword is stored in (n+m) radially aligned sectors.

Generally, the encoder pattern stores $(m+1)2^n$ codewords with an angle measurement resolution of $L_1=360°/((m+1)2^n)$, i.e., the minimum measurable angle being $L_1$. The $(m+1)2^n$ codewords form a special cyclic Gray code, denoted herein as a (n,m) boosted cyclic Gray code, in which each codeword differs from its neighboring or adjacent codeword by only one bit, i.e., the Hamming distance of any pair of adjacent codewords is 1. The first and last codewords of the (n,m) boosted cyclic Gray code also differ by only one bit.

For example, as shown in FIG. 16G, the encoder pattern 1200 comprises 24 codewords, forming a (3,2) boosted cyclic Gray code that may be used for measuring entire 360°. As the angular width of each sector is 15°, the measurement resolution of the encoder pattern 1200 is 15°.

The angular measurement α is determined by the following formula:

$$\alpha = gS + \sum_{i=1}^{m} \frac{S(b_i \oplus (g \bmod 2))}{m+1}, \quad (24)$$

where g represents the segment position given by Gray code reading (e.g., the "Codeword No." column of FIG. 16G), S represents the angular length of segments determined by Equation (23), m represents the number of Booster channels, $b_i$ represents the binary value of Booster channel i, i=1, ..., m, and ⊕ represents exclusive-or (XOR) operation.

In this embodiment, if a contact 1176 of the reader 1174 is partially within a segment storing 1, it generates a 1.

The (n,m) boosted cyclic Gray code has an advantage of having a minimum cross-codeword width larger than that of conventional Gray codes, as explained blow.

As shown in FIG. 16G, each codeword therein comprises five (5) bits b4, b3, b2, b1 and b0. Bits b4, b3 and b2 correspond to a three-bit base portion, and bits b1 and b0 correspond to a two-bit Booster portion.

Each bit across all 24 code words comprises groups of consecutive 1's and 0's, indicated in FIG. 16G using rectangular boxes. For example, b4 across all codewords comprises groups each having six (6) 1's, e.g., b4 of Codeword Nos. 3 to 8, and of Codeword Nos. 15 to 20, and groups each having six (6) 0's, e.g., b4 of Codeword Nos. 21 to 23 and 0 to 2, and of Codeword Nos. 9 to 14. The number of consecutive 1's or 0's in each bit across all codewords is herein denoted as the cross-codeword width of the code. The (3,2) boosted cyclic Gray code of FIG. 16G then has a minimum cross-codeword width of 3. Generally, an (n,m) boosted cyclic Gray code formed by the process of FIG. 15 has a minimum cross-codeword width of (m+1). As each sector (corresponding to a codeword bit) has an angular length of $L_1=S/(m+1)$, the minimum angular length of consecutive 1's and 0's of the encoder pattern 1200 is $$L_s = L_1(m+1) = S = \frac{360°}{2^n}, \quad (25)$$

which is determined by n only, and is independent of m.

In contradistinction, an (n+m)-bit conventional Gray code has a minimum cross-codeword width of 2 (see FIG. 17, which lists the codewords of a 5-bit conventional Gray code).

Note that an (n,m) boosted cyclic Gray code comprises $(m+1)2^n$ codewords, but an (n+m)-bit conventional Gray code comprises $2^{n+m}$ codewords. The (n,m) boosted cyclic Gray code thus obtains larger minimum cross-codeword width (corresponding to the minimum angular length of consecutive 1's and 0's in the embodiments of angle encoder) with the cost of redundancy (i.e., less number of codewords and coarser angle resolution). One advantage of an (n,m) boosted cyclic Gray code is that its larger minimum cross-codeword width reduces the possibility of error in codeword processing, and may be used for error correction. For example, in embodiments that all bits of a codeword are read or processed in parallel, such as the angle encoder 1100 described above, each read bit 1176 experiences less number of transitions between one (1) and zero (0) giving rise to less reading errors.

Those skilled in the art appreciate that various embodiments are readily available. For example, steps 1248 and 1250 of the above process of generating an encoder pattern may be interchanged in one embodiment.

Figure 18A:
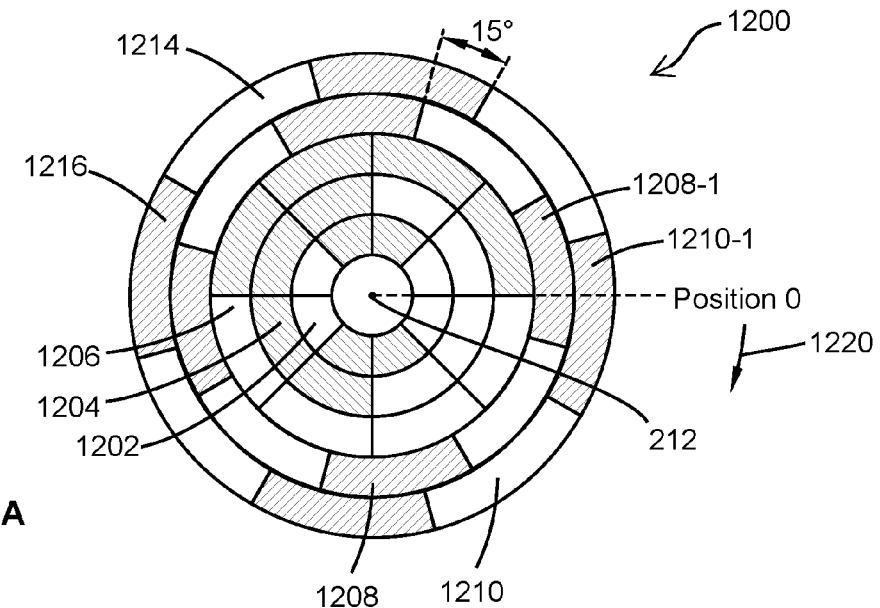
FIGS. 18A to 18D show examples of encoder patterns of the angle encoder of FIG. 12A having three (3) base channels and two (2) Booster channels, according to various alternative embodiments.

While in the example of FIGS. 16A to 16G, segments of each Booster channel 1208, 1201 is alternately coded with 0's and 1's starting from a start segment 1208-1, 1210-1 coded with a zero (0), in some alternative embodiments, segments of at least some or all Booster channels may be alternately coded with 0's and 1's starting from the same start segment but coded with a one (1). For example, in an alternative embodiment, segments of both channels 1201 and 1210, respectively, are alternately coded with 1's and 0's starting from a start segment 1208-1 and 1210-1 coded with a one (1). The so-obtained encoder pattern 1200 is shown in FIG. 18A.

Figure 18B:
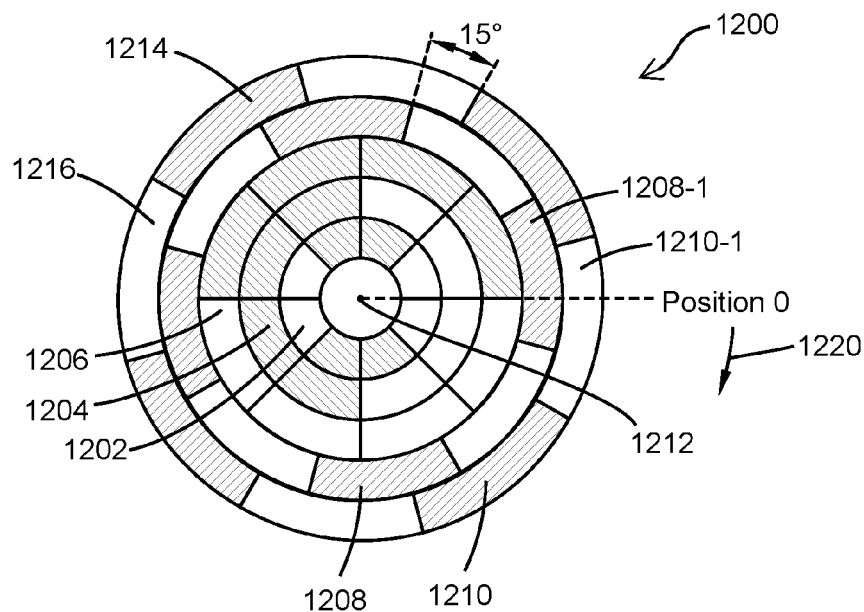

In another embodiment, segments of channel 1208 are alternately coded with 1's and 0's starting from the start segment 1208-1 coded with a one (1), and segments of channel 1210 are alternately coded with 0's and 1's starting from the start segment 1210-1 coded with a zero (0). The so-obtained encoder pattern 1200 is shown in FIG. 18B.

Figure 18C:
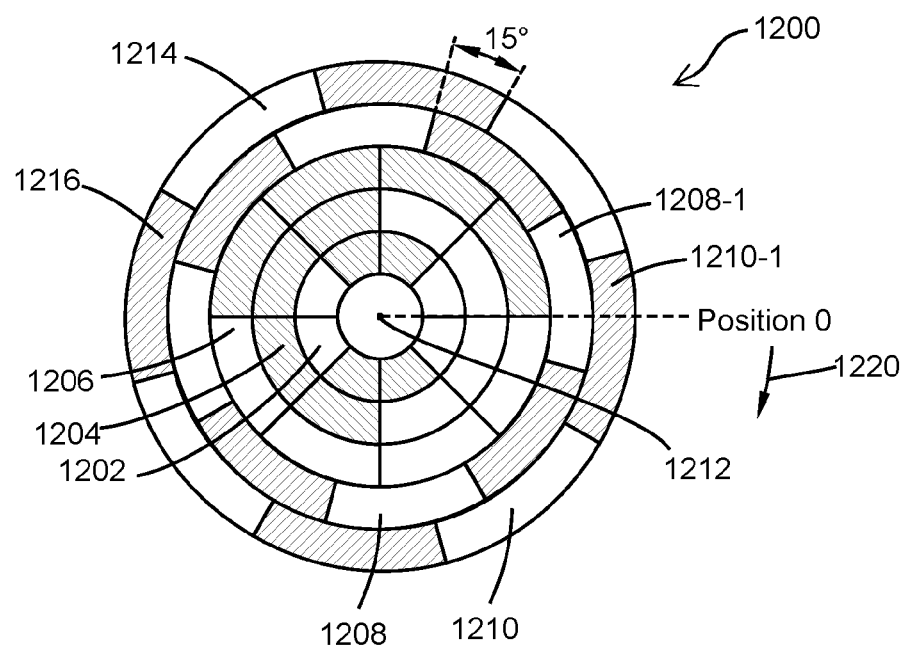

In yet another embodiment, segments of channel 1208 are alternately coded with 0's and 1's starting from the start segment 1208-1 coded with a zero (0), and segments of channel 1210 are alternately coded with 1's and 0's starting from the start segment 1210-1 coded with a one (1). The so-obtained encoder pattern 1200 is shown in FIG. 18C.

Figure 18D:
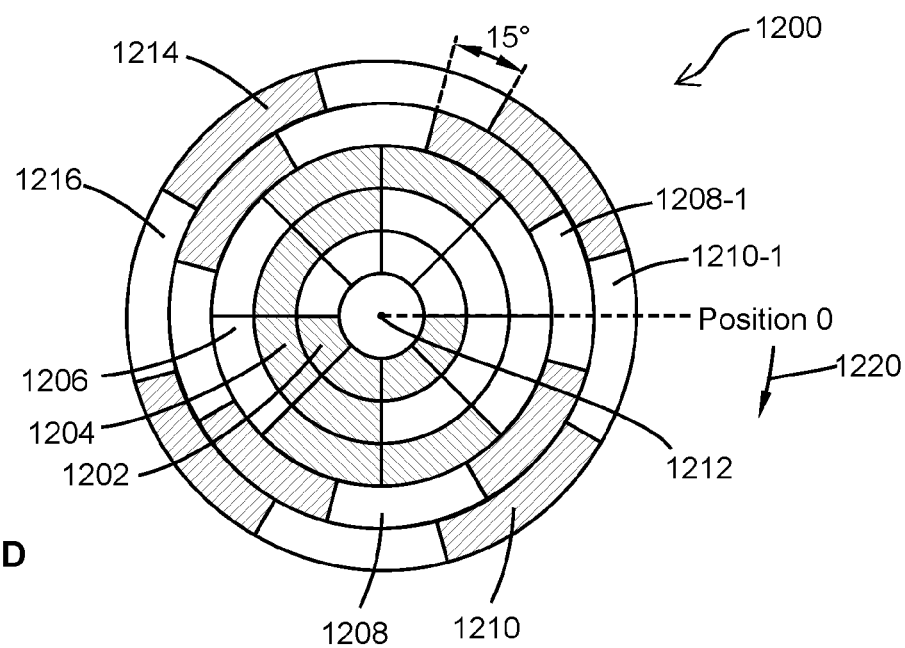

In alternative embodiments, the base Gray code may be any kind of Gray code. For example, FIG. 18D shows an encoder pattern 1200 having three base channels 1202 to 1206 and two Booster channels 1208 and 1210 in an alternative embodiment. The two Booster channels 1208 and 1210 are the same as those of FIG. 16E. However, the three base channels 1202 to 1206 are coded in a way different to those of FIG. 16E. In fact, the Gray code formed by the three base channels 1202 to 1206 of FIG. 18D is an order-reversed version of that of FIG. 16G. The advantage of the base Gray code pattern of FIG. 18D is that such an encoder pattern is more robust as the inner channels have angularly longer consecutive 1's and 0's comparing to outer channels.

In another embodiment, the base channels are outer channels and the Booster channels are inner channels.

In another embodiment, the base and Booster channels are radially interleaved.

Figure 19:
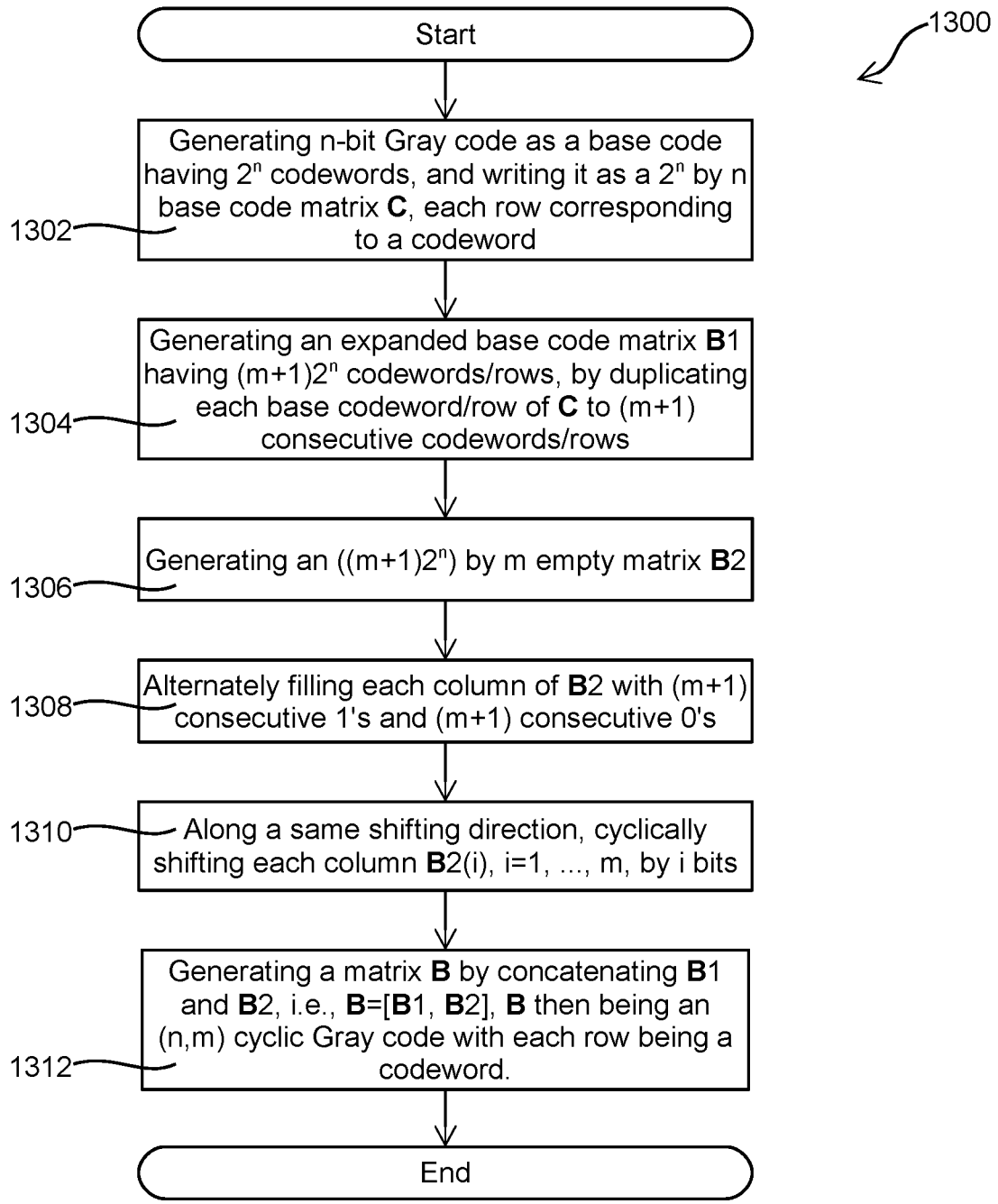
FIG. 19 is a flowchart showing the steps of a process for generating an (n,m) boosted cyclic Gray code in this embodiment.

In an alternative embodiment, an (n,m) boosted cyclic Gray code may be generated without using any ring patterns. FIG. 19 is a flowchart showing the steps of a process 1300 for generating an (n,m) boosted cyclic Gray code in this embodiment. In this embodiment, the process 1300 is implemented as an integrated circuit (IC) chip or chips using suitable technologies such as field-programmable gate array (FPGA), application-specific integrated circuit (ASIC) or the like. The IC circuit comprises one or more logic circuits for performing the following steps. Of course, those skilled in the art appreciate that one may implement the process 1300 in other suitable manners (e.g., as an above described angle encoder).

At step 1302, one may first generate an n-bit conventional Gray code having $2^n$ codewords, $c(1), c(2), \ldots c(2^n)$, as a base code C, i.e., written in a matrix form, $$C = \begin{bmatrix} c(1) \\ c(2) \\ \vdots \\ c(2^n) \end{bmatrix}_{2^n \times n}, \tag{26}$$

where the subscript of the square brackets [•] indicates the matrix size. Thus, the matrix C has $2^n$ rows and n columns, with each row corresponding to a codeword.

At step 1304, the base code C is expanded to form an expanded base code B1 having $(m+1)2^n$ codewords, by duplicating each base codeword $c(k)$, $k=1, 2, \ldots, 2^n$, to (m+1) consecutive codewords $c_1(k), c_2(k), \ldots, c_{(m+1)}(k)$, where $c_i(k)=c(k)$ for all $i=1, 2, \ldots, (m+1)$. Written in a matrix form, the expanded base code B1 may be expressed as $$B1 = \begin{bmatrix} c_1(1) \\ \vdots \\ c_m(1) \\ c_1(2) \\ \vdots \\ c_m(2) \\ \vdots \\ c_1(2^n) \\ \vdots \\ c_m(2^n) \end{bmatrix}_{(m+1)2^n \times n} \tag{27}$$

At step 1306, an $(m+1)2^n$ by m empty matrix B2 is generated, $$B2 = \begin{bmatrix} 0 & \cdots & 0 \\ \vdots & \ddots & \vdots \\ 0 & \cdots & 0 \end{bmatrix}_{(m+1)2^n \times m}. \tag{28}$$

At step 1308, each column of the empty matrix B2 is alternately filled with (m+1) consecutive 1's and (m+1) consecutive 0's. In other words, if B2 is written in the form of column vectors, $$B2=[B2(1), B2(2), \ldots, B2(m)]_{(m+1)2^n \times m}, \tag{29}$$

then, each column vector B2(i) is:

$$B2(i) = \begin{bmatrix} I_{(m+1) \times 1} \\ 0_{(m+1) \times 1} \\ I_{(m+1) \times 1} \\ \vdots \\ 0_{(m+1) \times 1} \end{bmatrix}_{(m+1)2^n \times 1}, \text{ for } i = 1, 2, \ldots, m, \tag{30}$$

where $I_{(m+1) \times 1}=[1, \ldots, 1]^T$ is an identity vector having (m+1) 1's, $0_{(m+1) \times 1}=[0, \ldots, 0]^T$ is a zero vector having (m+1) 0's, and $[\cdot]^T$ represents matrix transpose. In some alternative embodiments, some or all B2(i), $1 \leq i \leq m$, may be $$B2(i) = \begin{bmatrix} 0_{(m+1) \times 1} \\ I_{(m+1) \times 1} \\ 0_{(m+1) \times 1} \\ \vdots \\ I_{(m+1) \times 1} \end{bmatrix}_{(m+1)2^n \times 1}. \tag{31}$$

At step 1310, each column vector B2(i) is cyclically shifted by i bits, $i=1, 2, \ldots, m$, along a same direction, being forward cyclic shifting or alternatively backward cyclic shifting. Herein, forward cyclic shifting of a vector $p=[p_1, p_2, \ldots, p_L]^T$ by t bits gives rise to a shifted vector $p'=[p_{t+1}, p_{t+2}, \ldots, p_L, p_1, \ldots, p_t]^T$. Backward cyclic shifting of a vector $p=[p_1, p_2, \ldots, p_L]^T$ by t bits gives rise to a shifted vector $p'=[p_{L-t+1}, p_{L-t+2}, \ldots, p_L, p_1, \ldots, p_{L-t}]^T$.

At step 1312, a matrix B is formed by concatenating matrices B1 and B2, i.e., $$B=[B1, B2]_{(m+1)2^n \times (n+m)}. \tag{32}$$

Then, B is the matrix form of an (n,m) boosted cyclic Gray code with each row of matrix B being a codeword.

FIGS. 20A to 20F show an example of generating a (3,2) boosted cyclic Gray code. As shown in FIG. 20A, a 3-bit conventional Gray code having 8 codewords is generated as a base code (step 1302 of FIG. 19), and is written in as a matrix C. Each row of matrix C corresponds to a codeword of the base code.

As shown in FIG. 20B, the base code C is expanded to form an expanded base code B1 having 24 codewords, by duplicating each row of C to three (3) consecutive rows (step 1304 of FIG. 19).

As shown in FIG. 20C, a 24 by 2 empty matrix B2 is generated (step 1306 of FIG. 19).

As shown in FIG. 20D, each column of the empty matrix B2 is alternately filled with three (3) consecutive 1's and three (3) consecutive 0's (step 1308 of FIG. 19).

As shown in FIG. 20E the first column of B2 is forward cyclic shifted by 1 bit, and the second column of B2 is forward cyclic shifted by 2 bits (step 1310 of FIG. 19).

As shown in FIG. 20F, a (3,2) boosted cyclic Gray code B is generated by concatenating B1 and B2 (step 1312 of FIG. 19) with each row corresponding to a codeword thereof.

In above embodiments, the (n,m) boosted cyclic Gray code comprises (n+m) bits or channels including a set of n base bits corresponding to n base channels, and m boosted bits corresponding to m Booster channels, with a minimum angular length of consecutive 1's and 0's being $L_S=360°/2^n$, and an angle measurement resolution of $L_1=360°/((m+1)2^n)$.

In an alternative embodiment, the minimum angular length of consecutive 1's and 0's, or the minimum cross-codeword width, may be further increased by introducing a second set of m Booster channels offset from the first set of Booster channels.

Figure 21A:
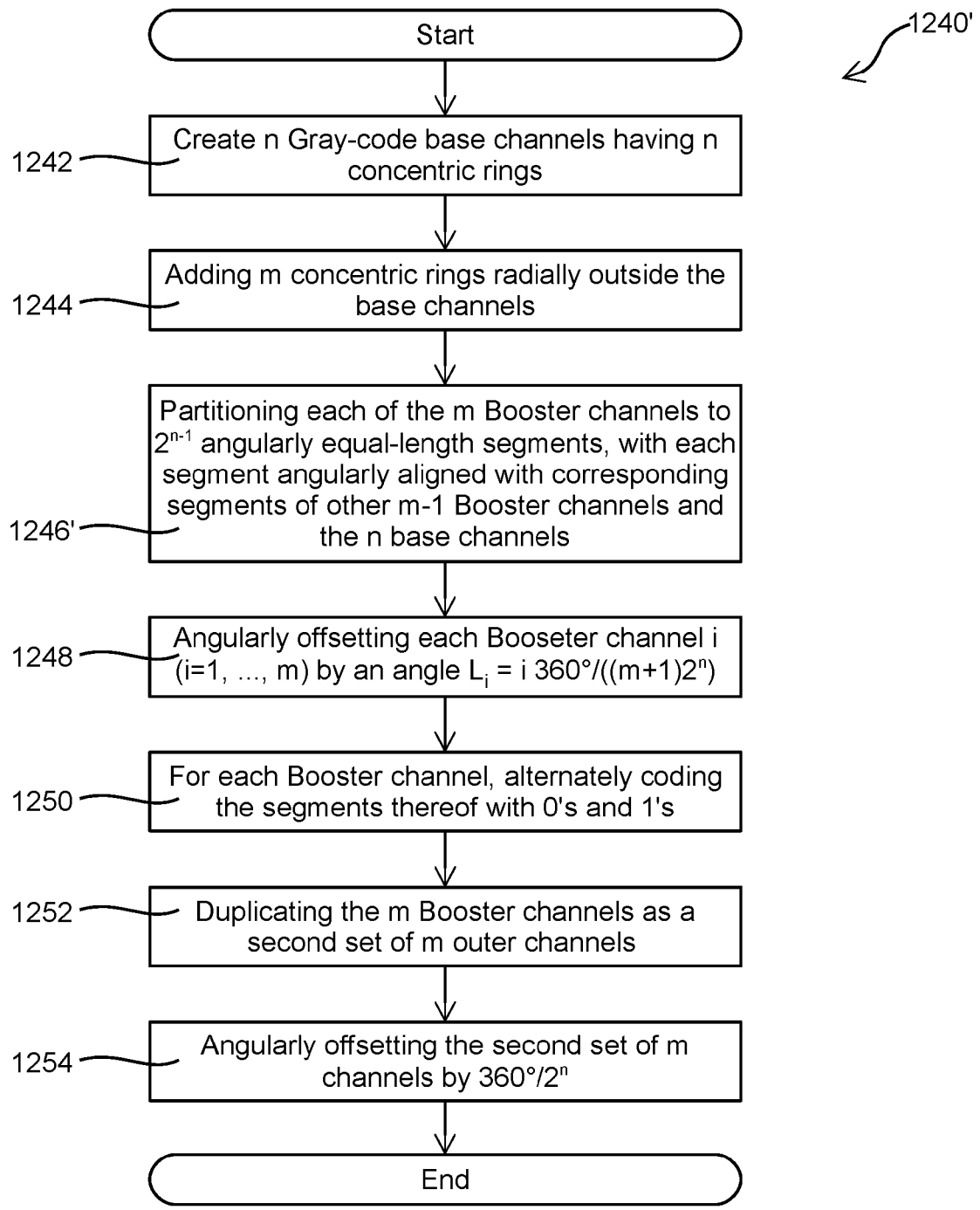
FIG. 21A is a flowchart showing the steps of a process for generating an encoder pattern having an (n,m) boosted cyclic Gray code with dual Booster channel sets, the (n,m) boosted cyclic Gray code with dual Booster channel sets having n base channels and two Booster channel sets, with each Booster channel set having m Booster channels.

FIG. 21A is a flowchart showing the steps of a process 1240' for generating an encoder pattern having n base channels and two Booster channel sets, with each Booster channel set having m Booster channels. The process 1240' is similar to the process 1240 of FIG. 15, except step 1246' of process 1240' is slightly different, and the process 1240' has two extra steps 1252 and 1254. The steps of process 1240' that are the same as those of process 1240 are referenced with same numbers, and are not described in detail here.

Following steps 1242 to 1250 of process 1240', n base channels and the first set of m Booster channels are established. However, as indicated at step 1246' of FIG. 21A, each Booster channel only has $2^{n-1}$ angularly equal-length segments.

After establishing the first set of m Booster channels, at step 1252, the first set of m Booster channels are duplicated as the second set of m Booster channels radially outer of the first set of Booster channels. At step 1254, the second set of m Booster channels are offset by $S=360°/2^n$ from the first set of m Booster channels to form the encoder pattern, denoted as an (n,m) boosted cyclic Gray code with dual Booster channel sets.

The (n,m) boosted cyclic Gray code with dual Booster channel sets has $(m+1)2^{n+1}$ codewords each having (n+2m) bits or channels, with an angle measurement resolution of $360°/((m+1)2^{n+1})$, and a minimum angular length of consecutive 1's and 0's being $L_S=360°/2^{n-1}$. The angular measurement a is determined by the following formula:

$$a = gS + \sum_{c=1}^{m} \frac{S[(b_{c1} \oplus b_{c2}) \oplus (g \bmod 2)]}{m+1}. \tag{33}$$

Figures 21B, 21C:
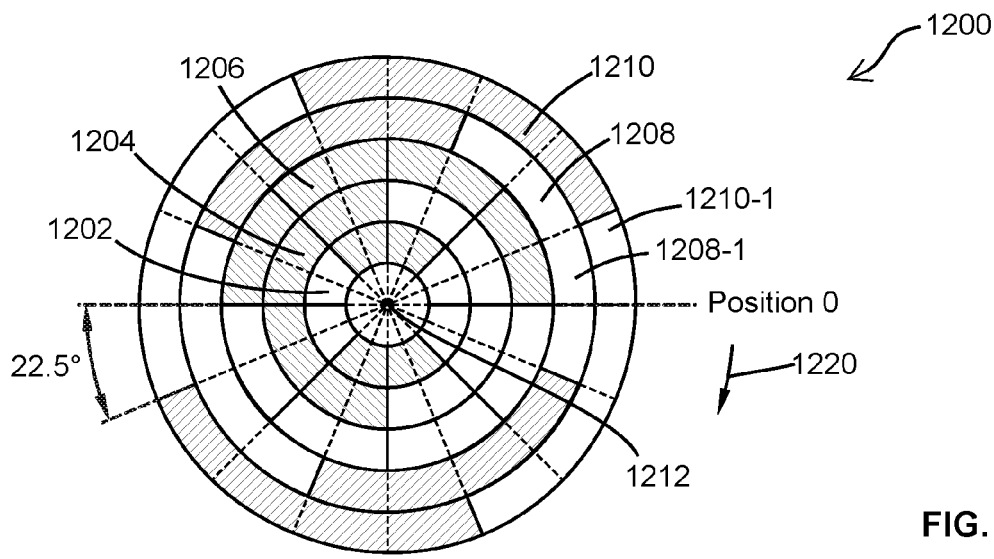
FIG. 21B shows an example of a (3,1) boosted cyclic Gray code with dual Booster channel sets.
FIG. 21C lists the codewords of the (3,1) boosted cyclic Gray code with dual Booster channel sets of FIG. 21B.
Figure 21D:
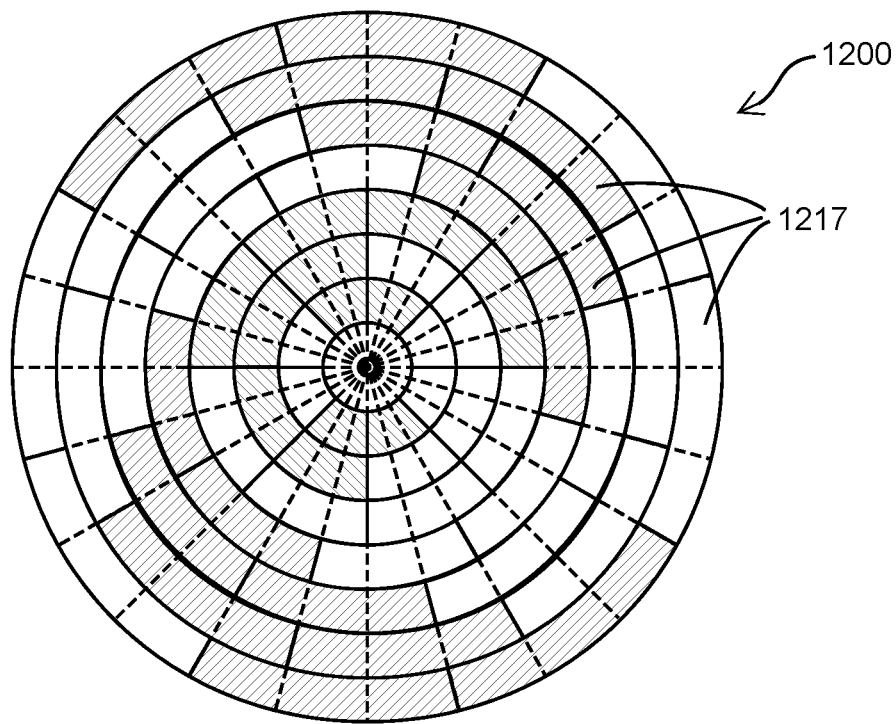
FIG. 21D shows another example of a (3,2) boosted cyclic Gray code with dual Booster channel sets.

FIG. 21B shows an example of a (3,1) boosted cyclic Gray code with dual Booster channel sets, and FIG. 21C lists the corresponding codewords thereof. As can be seen, this encoder pattern has five (5) channels, giving rise to a 22.5° angle measurement resolution, and a minimum 90° angular length of consecutive 1's and 0's, and 16 codewords. FIG. 21D shows an example of a (3,2) boosted cyclic Gray code with dual Booster channel sets, having 7 channels, 24 codewords, a 15° angle measurement resolution, and a minimum 90° angular length of consecutive 1's and 0's.

Of course, those skilled in the art appreciate that, in another embodiment, the base channels are outer channels and the Booster channels are inner channels. In yet another embodiment, the base and Booster channels are radially interleaved.

Also shown in FIG. 21D, an encoder pattern 1200 may alternatively formed by first generating the codewords of a (n,m) boosted cyclic Gray code with dual Booster channel sets, partitioning an encoder disc into (n+2m) concentric rings, partitioning each ring into $(m+1)2^{n+1}$ sectors 1217, and then storing the $(m+1)2^{n+1}$ codewords in the encoder disc such that each sector stores a one (1) or a zero (0), and each codeword is stored in (n+2m) radially aligned sectors.

In some applications, the angle encoder only measures a narrow angle, and thus the above-described encoder pattern 1200 comprises a large unused area. In some alternative embodiments, the angle encoder for such applications may leverage the otherwise unused area as an additional encoding zone by locating some Booster channels therein. In these embodiments, each base and Booster channel is an arc or a portion of a ring, and a ring may comprise multiple channels. Comparing to the above-described angle encoder having n base channels and m Booster channels, the angle encoder having the same number of base and Booster channels in these embodiments has an advantage of less number of rings, meaning that, for the same encoder disc size, the sectors of the angle encoder in these embodiments, in particular, the sectors of the inner rings have longer circumferential length and wider radial width, allowing the reader bits 1176 to have a larger contact area, and reducing errors. On the other hand, with the same number of rings, the angle encoder in these embodiments provides higher angle measurement resolution, i.e., smaller minimum measurable angle.

In these embodiments, the angle encoder comprises M readers, and measures an angle within a range from 0° to β, where β is equal to or less than L/M=360°/M, M≥2 representing the number of readers, L=360° being the angular length of the encoder pattern. The encoder pattern is partitioned into M zones, with one primary encoding zone and (M−1) additional encoding zones, and each zone has (n+m) channels.

Figure 22:
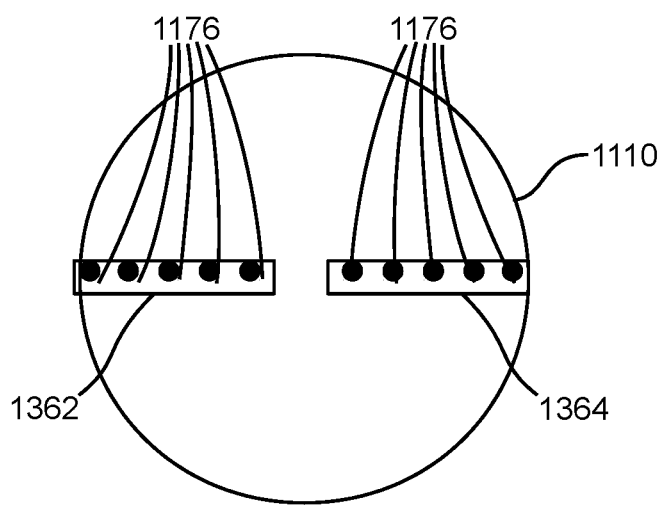
FIG. 22 shows the readers of an angle encoder, according to another embodiment of the present disclosure.

For example, as shown in FIG. 22, in this embodiment, the angle encoder comprises two (i.e., M=2) readers 1362 and 1364 arranged in opposite directions on the bottom 1110 of the housing. Each reader comprises (n+m) electrical contacts 1176 resting on the encoder disc 1108 each contacting a ring or channel. Therefore, each channel has two contacts resting thereon.

Figure 23A:
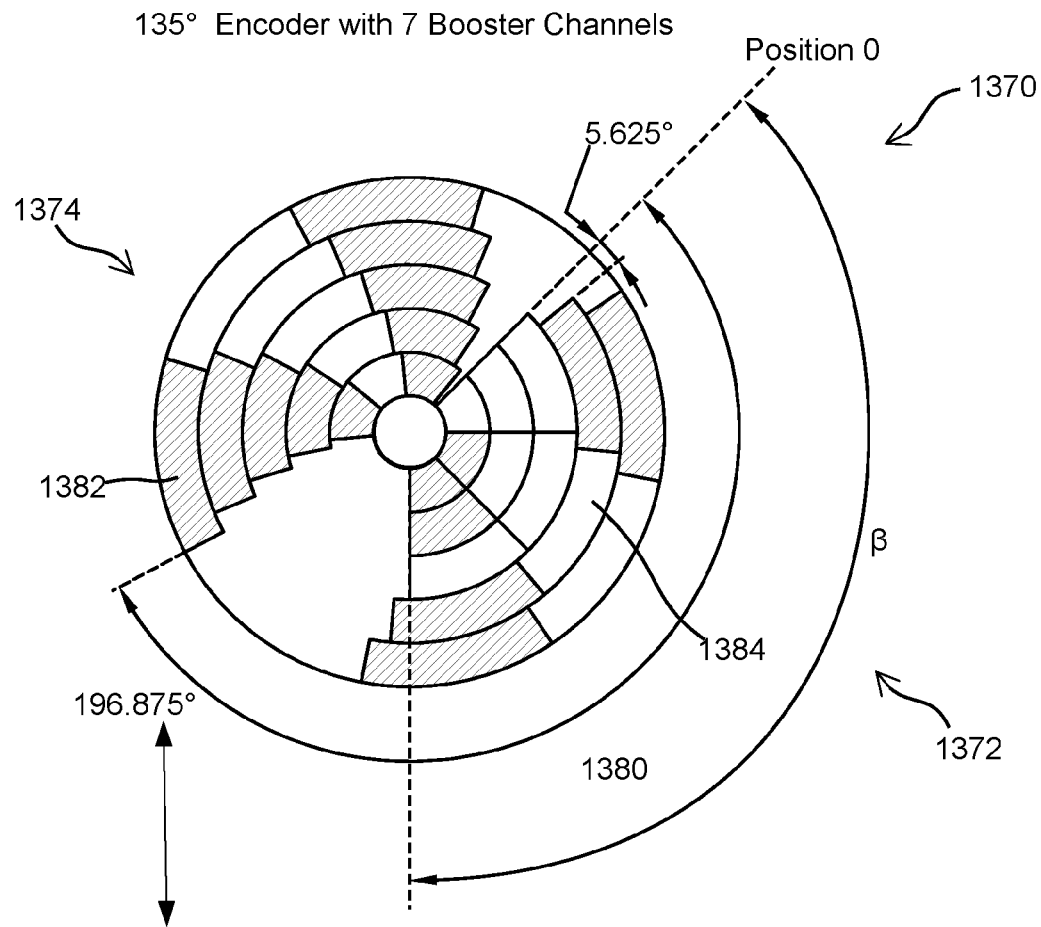
FIGS. 23A and 23B show an example of a dual-reader, narrow-angle encoder pattern for acting with the readers of FIG. 22.
Figure 23B:
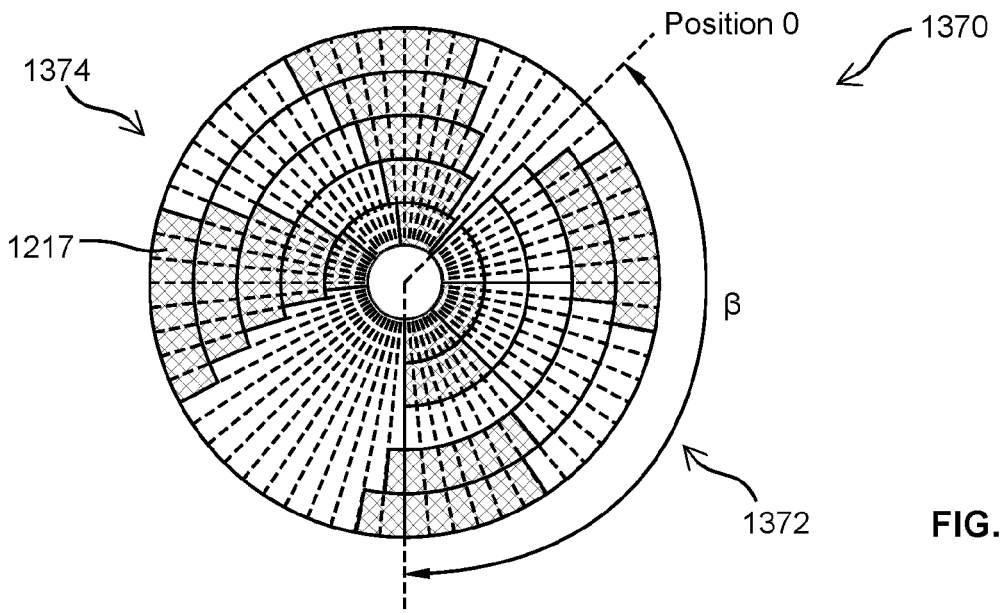

The corresponding encoder pattern may be denoted as an M-reader, narrow-angle encoder pattern. For example, as shown in FIGS. 23A and 23B, the encoder pattern 1370 may be denoted as a dual-reader, narrow-angle encoder pattern of the encoder disc 1108, and comprise (n+m) rings, and is partitioned to two zones, including a primary encoding zone 1372 for reader 1302 to read, and an additional encoding zone 1374 for reader 1364 to read. The primary encoding zone 1372 comprises the angular portion of disc 1108 from the base position (Position 0) to β (135° in this example), and the additional encoding zone 1374 comprises the rest of the disc 1108, i.e., from β to 360°.

The primary encoding zone 1372 comprises n base channels and m Booster channels. The additional encoding zone 1374 comprises (n+m) channels, all used as Booster channels. Therefore, the encoder pattern 1370 comprises (n+2m) Booster channels. Booster channels in the primary encoding zone 1372 are in the same rings as some Booster channels in the additional encoding zone 1374. For example, the outermost Booster channel 1380 in the primary encoding zone 1372 is in the same ring as the outermost Booster channel 1382 in the additional encoding zone 1374.

For ease of description, the Booster channels are numbered as follows: the Booster channels in the primary encoding zone 1372 are numbered, from the innermost channel to the outermost channel therein, as i=1, 2, . . . , m. The Booster channels in the additional encoding zone 1374 are numbered, from the outermost channel to the innermost channel therein, as i=m+1, m+2, . . . , (M−1)n+Mm.

The base channels in the primary encoding zone 1372 are partitioned to segments encoded using a conventional Gray code as described above. In this embodiment, each segment of the base channels in the primary encoding zone 1372 has an angular length of $S=L/2^n=360°/2^n$.

The Booster channels in the primary encoding zone 1372 and the channels in the additional encoding zone 1374 are partitioned to a plurality of segments each having an angular length of $L/2^n=360°/2^n$. The segments of the Booster channels and those of the channels in the additional encoding zone 1374 are offset from the base encoder channels by an offset angle $P_i$ calculated as:

$$P_i = \frac{Si}{(m+1)} + (v-1)\frac{L}{M}, \quad (34)$$

where $S=L/2^n=360°/2^n$ is the angular length of the segments, $i=1, 2, \ldots, (M-1)n+Mm$, is the Booster channel number as defined above. M=2 represents the number of readers, and v represents the encoding zone, i.e., v=1 if i≤m; v=2 if m+1≤i≤2m+n; v=3 if 2m+n+1≤i≤3m+n, and so on; and v can be calculated as a function of i as follows:

$$v = f(i) = \frac{i - i \bmod (m+n)}{m+n} + 1. \quad (35)$$

Thus, in the example of FIGS. 23A and 23B where n=3 and m=2, the encoder pattern 1370 comprises 7 Booster channels. Each segment of the base and Booster channels has an angular length of S=45°. The offset angle of the innermost Booster channel 1384 (i=1) in the primary encoding zone 1372 is calculated as $P_1=5.625°$. The offset angle of the outermost Booster channel 1382 (i=3) in the additional encoding zone 1374 is calculated as $P_3=196.875°$. The angular resolution, i.e., the minimum measurable angle is 5.625° within the angle rang 0° to β=135° from the Position 0. FIG. 23B shows the sectors corresponding to codeword bits.

With the examples of FIGS. 23A and 23B, an M-reader, narrow-angle encoder pattern 1370 may alternatively formed by first generating the codewords of a (n,(M−1)n+Mm) boosted cyclic Gray code, selecting $N_R$ ($N_R$ being an integer) consecutive codewords corresponding to a β degree angle span, partitioning an encoder disc into (n+m) concentric rings, partitioning each ring into $N_R$ sectors 1217 (see FIG. 23B), determining a β degree angle span of the encoder disc as the primary encoding zone 1372, storing (n+m) bits of each of the $N_R$ codewords in the primary encoding zone 1372 such that each sector stores a one (1) or a zero (0), and the (n+m) bits of each codeword is stored in (n+m) radially aligned sectors; and for the other ((M−1)n+(M−1)m) bits of each of the $N_R$ codewords, storing each (n+m) bits of each of the $N_R$ codewords in an additional encoding zone 1374.

Generally, an M-reader, narrow-angle encoder pattern may comprise M zones along the reading direction (also the moving direction) of each reader. Each zone is partitioned into $n_a$ tracks ($n_a$ being an integer) such that $Mn_a \geq Mn+Mm$. Each track is partitioned into a plurality of sectors. Depending on the number of sectors that each track is partitioned into, the M-reader, narrow-angle encoder pattern may store all or a subset of a (n,(M−1)n+Mm) boosted cyclic Gray code.

In another embodiment, all codewords of the (n,(M−1)n+Mm) boosted cyclic Gray code are used. The encoder disc and encoder pattern are similar to those described above, except that, in this embodiment, each channel of the primary encoding zone 1372 and the additional encoding zones 1374 is partitioned into $((M-1)n+Mm+1)2^n$ sectors for storing all $((M-1)n+Mm+1)2^n$ codewords of the (n,(M−1)n+Mm) boosted cyclic Gray code.

Although in above embodiment, the additional encoding zones (e.g., zone 1374) are all used as Booster channels. In an alternative embodiment, the channels of the addition encoding zones may be used as base Gray code channels, or a mixture of base Gray code channels and Booster channels.

Figure 24:
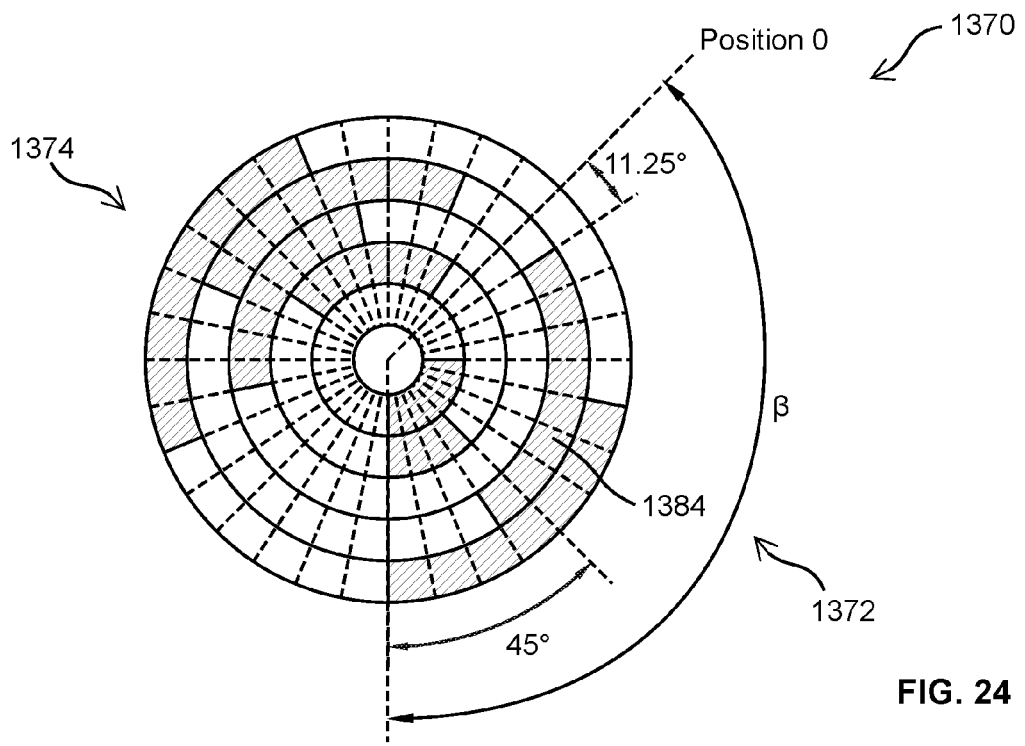
FIG. 24 shows another example of a dual-reader, narrow-angle encoder pattern for acting with the readers of FIG. 22, according to an alternative embodiment.
Figure 25A:
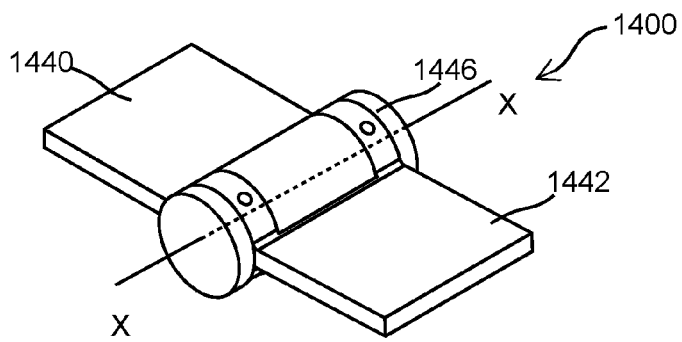
FIGS. 25A and 25B are perspective views of a hinge encoder, according to another embodiment.
Figure 25B:
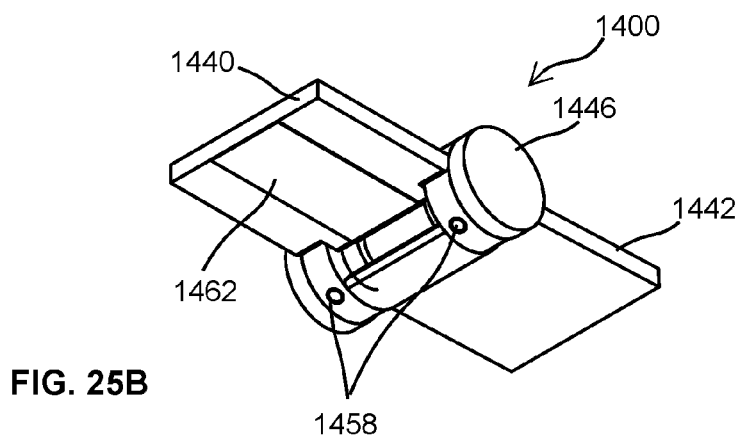
Figure 25C:
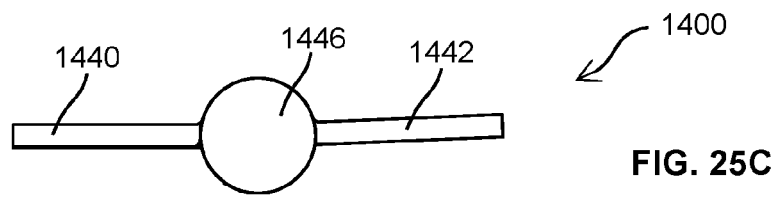
FIG. 25C is a side view of the hinge encoder of FIGS. 25A and 25B.
Figure 25D:
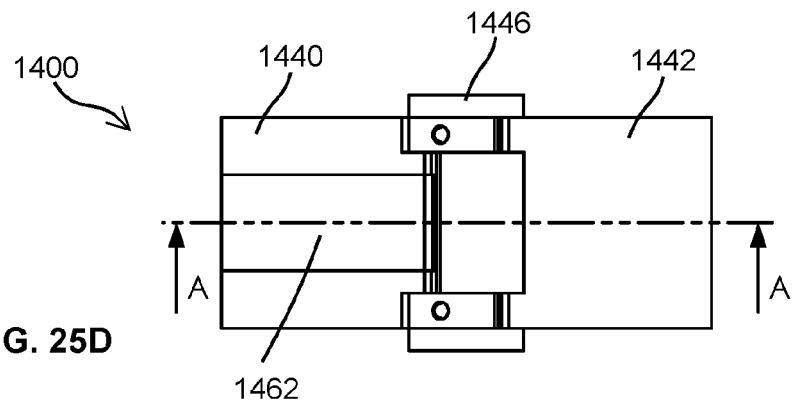
FIG. 25D is a bottom view of the hinge encoder of FIGS. 25A and 25B.
Figure 26A:
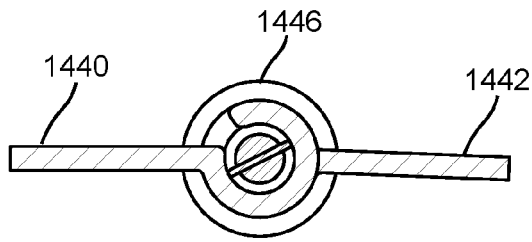
FIG. 26A is a cross-sectional view of the hinge encoder of FIGS. 25A to 25D along section A-A of FIG. 25D.
Figure 26B:
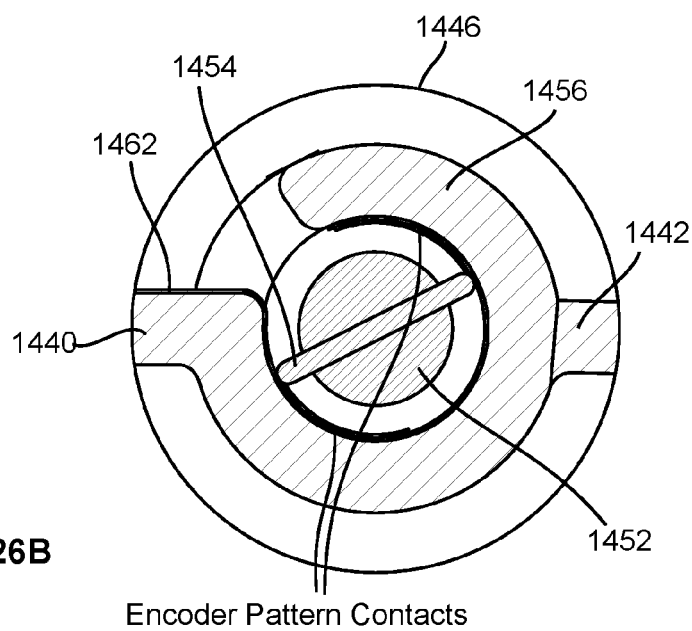
FIG. 26B is the enlarged view of the pivot of FIG. 26A.

FIG. 24 shows a dual-reader, narrow-angle encoder pattern 1370 according to another embodiment, modified from an (n,m) boosted cyclic Gray code with dual Booster channel sets. As shown, the angular offset of the innermost Booster channel 1384 in the primary encoding zone 1372 is 11.25°. The angular resolution is also 11.25° within the angle rang 0° to β=135° from the Position 0. FIG. 24 also shows therein the sectors corresponding to codeword bits.

Referring to FIGS. 25A to 26B, in an alternative embodiment, the angle encoder is implemented as a hinge encoder 1400. As shown, the hinge encoder 1400 comprises a first and a second link 1440 and 1442 rotatable about a pivot 1446. The pivot 1446 comprises a pivoting pin 1452 coupled to the second link 1442 and rotatable therewith. The pivoting pin 1452 comprises a wiper 1454 radially outwardly extending therefrom. The wiper 1454 comprises a plurality of electrical contacts (not shown) for reading the binary information stored in a flexible printed circuit board (PCB) 1462 wrapping thereabout. In this embodiment, the wiper 1454 is grounded and the flexible PCB 1462 is electrically connected to a circuit, e.g., a suitable analogue to digital convertor (ADC), which detects continuity/proximity to the grounded wiper for reading the binary information stored in the flexible PCB. Of course, other suitable reading methods may be alternatively used. Nevertheless, we describe the reading of information stored in the flexible PCB and reading from the electrical contacts of the wiper 1454 (or reader pin(s)) for ease of description.

The flexible PCB 1462 is coupled to the first link 1440 and rotatable therewith. As will be described in more detail later, the flexible PCB 1462 comprises an encoder pattern about the pivoting pin 1452 and the wiper 1454, storing codewords indicative of the angles between the hinge links 1440 and 1442. The hinge link 1440 comprises a cylindrical portion 1456 about the flexible PCB 1462. The hinge link 1442 also comprises a cylindrical portion (not shown) about the pivoting pin 1452 and the wiper 1454, and is fixed with the pivoting pin 1452 using a positioning pin 1458.

Figure 27A:
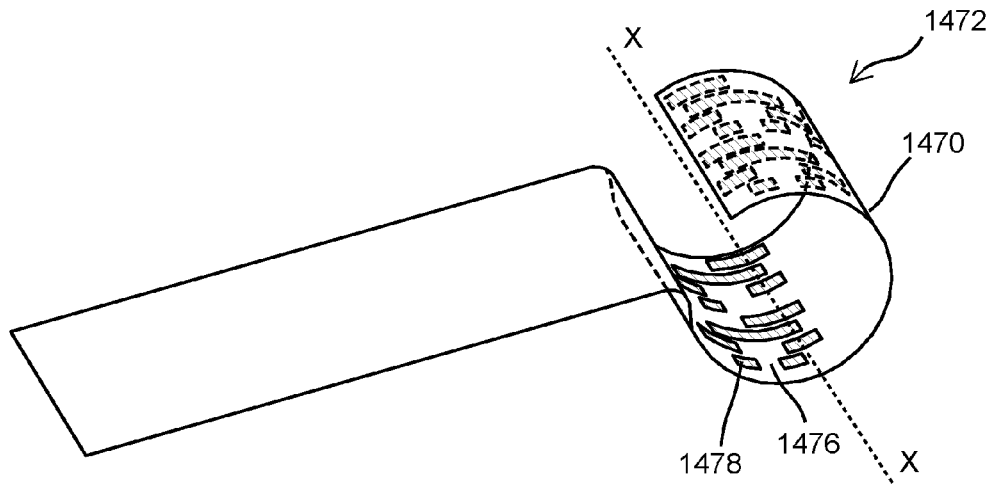
FIG. 27A illustrates the flexible printed circuit board (PCB) of the hinge encoder of FIGS. 25A and 25B.
Figures 27B, 28:
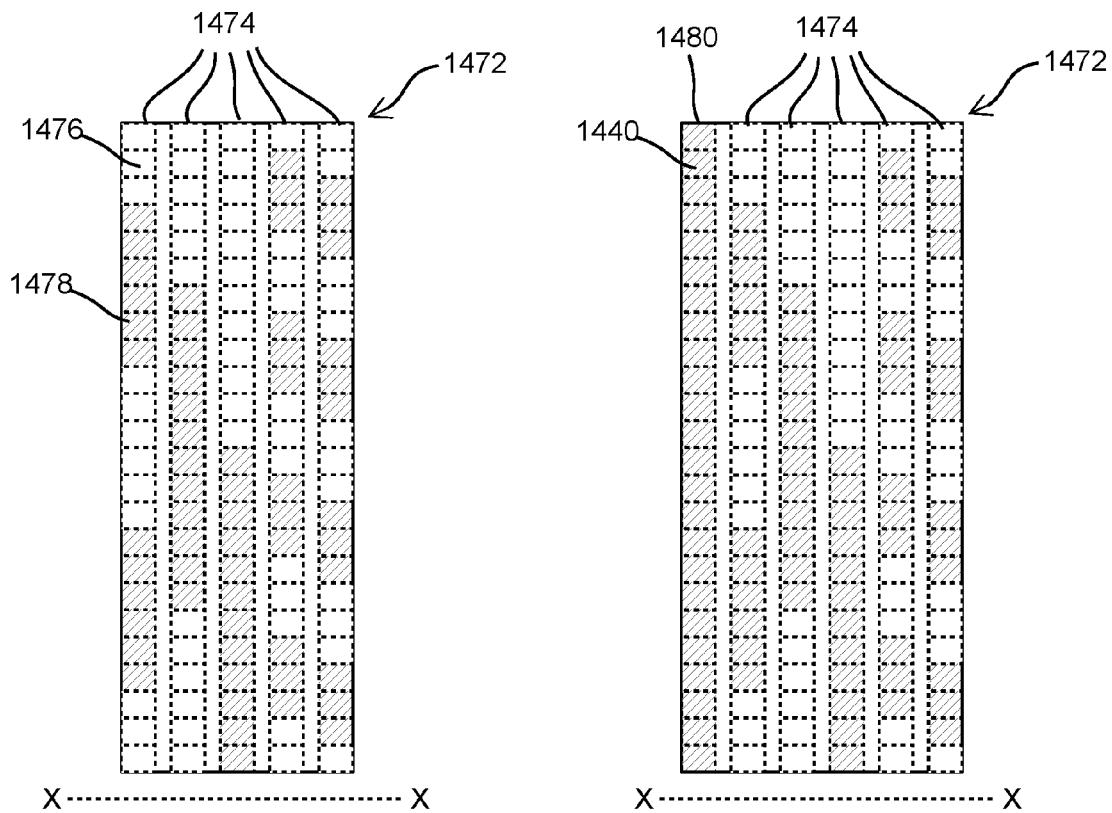
FIG. 27B shows the encoder pattern of the flexible PCB of FIG. 27A.
FIG. 28 shows the encoder pattern of the flexible PCB of FIG. 27A, according to an alternative embodiment.

As shown in FIGS. 27A and 27B, a portion of the flexible PCB 1462 is an encoder strip 1470 for wrapping about the pivoting pin 1452 and the wiper 1454. The linear encoder strip 1470 comprises a plurality of linear bands 1474, when wrapped, about the axis X-X of the pivot 1446 forming a linear encoder pattern 1472. Each band 1474 is in contact with an electrical contact of the wiper 1454.

Each band 1474 is made of segments 1476 and 1478 storing 0's and 1's using the methods described above such that, the electrical contacts of the wiper, reading the information stored in the bands 1474 along the pivot axis X-X, read a codeword.

The linear encoder pattern 1472 stores the codewords of the boosted cyclic Gray code of FIG. 16G. In particular, the encoder pattern 1472 comprises n bands forming n base encoder channels encoded with an n-bit conventional Gray code, and m bands forming m Booster channels. Each of the base channels 1202, 1204 and 1206 is partitioned into a maximum of $2^n$ aligned, equal-length segments such that each segment has a length of at least $D/2^n$, where D represents the length of the band. Each segment stores a binary 1 or 0 such that the n base encoder channels stores the codewords of an n-bit conventional Gray code.

The m Booster channels are each partitioned to a maximum of $2^n$ equal-length segments, each having an length of at least $D/2^n$, and alternately coded with 0's and 1's. The segments of each Booster channel are offset from the base encoder channels by a linear distance calculated as:

$$L_i = \frac{Si}{m+1}, \quad (36)$$

where S represents the length of each segment, in this embodiment $S=D/2^n$, i=1, 2, ..., m, represents the Booster channel number, numbered from the Booster channel adjacent the base encoder channels to that furthest to the base encoder channels.

When the hinge links 1440 and 1442 are rotated relative to each other about the pivot 1446, the contacts of the wiper 1454 slide over the flexible PCB 1462 and read the codewords stored therein, generating a signal indicative of the angle between the hinge links 1440 and 1442.

In one example, the hinge encoder is about 2 millimeter (mm) thick, 5 mm wide, and 10 mm long.

In above embodiments, the output of the angle encoder is a parallel signal representing a codeword. A parallel-to-serial converter may be used to convert the parallel signal to serial as needed.

Those skilled in the art appreciate that various embodiments are readily available. For example, in an alternative embodiment, the channels of the encoder pattern may be connected to the electrical detectors via individual busses for each channel, while the contacts are connected to an electrical source.

In another embodiment, as shown in FIG. 28, the encoder pattern 1472 comprises an extra band 1480 which provides an electrical source for the encoder pattern. This arrangement simplifies the mechanical design by eliminating the need for external electrical connections to the encoder pattern.

With the examples of FIGS. 27A to 28, those skilled in the art appreciate that any of the above described, circular encoder pattern for use in a circular encoder disc 1058 may be implemented as a linear encoder pattern for use in a linear encoder strip. For example, in another embodiment, the hinge encoder 1400 has two readers and measures an angle range from 0° to an angle equal to or smaller than 180°. In this embodiment, the encoder pattern 1472 stores the codewords of the boosted cyclic Gray code of FIG. 23A or FIG. 24. In particular, the encoder pattern 1472 comprises n bands forming an n-bit conventional Gray code, and m bands forming the Booster channels. The (n+m) bands also comprises (n+m) Booster channels at the location, when wrapping on the pivot pin 1452 and the wiper 1454, opposite to the location of the n-bit conventional Gray code. Therefore, the encoder pattern 1472 in this embodiment comprises (n+2m) Booster channels, improving the angle measurement resolution.

Figure 29:
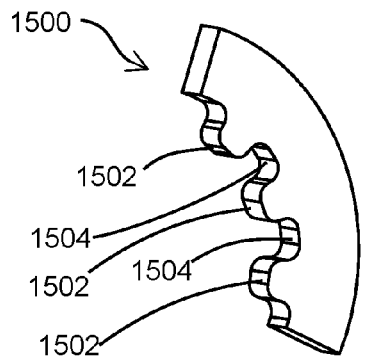
FIG. 29 shows a portion of the encoder pattern, according to an alternative embodiment.

In an alternative embodiment, the encoder pattern is implemented as a surface 1500 containing peaks 1502 and valleys 1504 as shown in FIG. 29, with peaks corresponding to binary 1's and valleys corresponding to binary 0's. The wiper is held in a position above the peaks so as to not make physical contact. The capacitance between an electrical contact and the encoder pattern is determined by the distance there between. Therefore, a codeword indicative of an angle may be read by detecting the capacitance between the electrical contacts and the encoder pattern.

Referring to FIGS. 30A to 30E, in an alternative embodiment, the angle encoder is implemented using capacitive sensing of the encoder pattern. In this embodiment, no physical contact between the reader and the encoder pattern is required, giving rise to minimal wear.

Figure 30A:
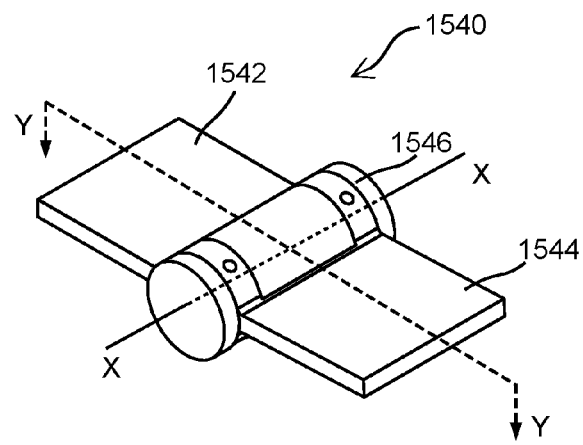
FIG. 30A is a perspective view of a hinge encoder, according to another embodiment.
Figure 30B:
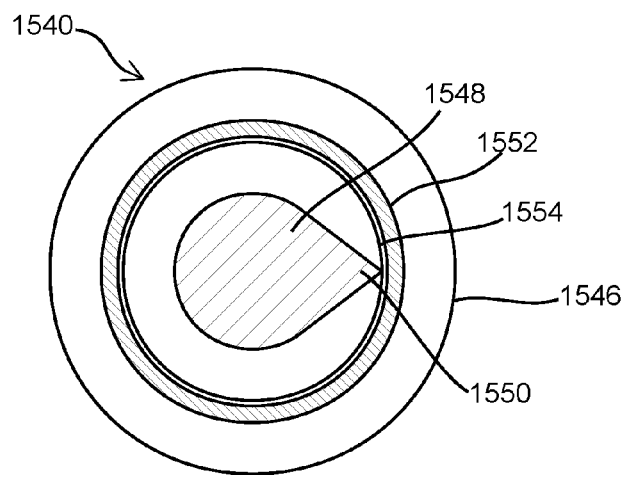
FIG. 30B is a cross-sectional view of the hinge encoder of FIG. 30A along section Y-Y.
Figure 30C:
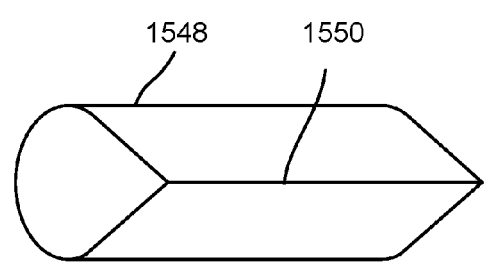
FIG. 30C is a perspective view of the pivoting electrode of the hinge encoder of FIG. 30A.

As shown in FIGS. 30A to 30C, the angle encoder 1540 comprises a first and a second link 1542 and 1544 rotatable about a pivot 1546. The pivot 1546 comprises a pivoting electrode 1548 coupled to the second link 1544 and rotatable therewith. The pivoting electrode 1548 comprises a reader pin 1550 for reading the binary information stored in an encoder strip 1552 wrapping thereabout. The encoder strip 1552 in this embodiment is a flexible PCB coupled to the first link 1542 and rotatable therewith. As capacitive sensing technology is used in this embodiment, there exists a non-conductive gap 1554 between the reader pin 1550 and the flexible PCB 1552, which is filled with a suitable dielectric material such as polyimide, silicon grease or in some embodiments, air.

Figure 30D:
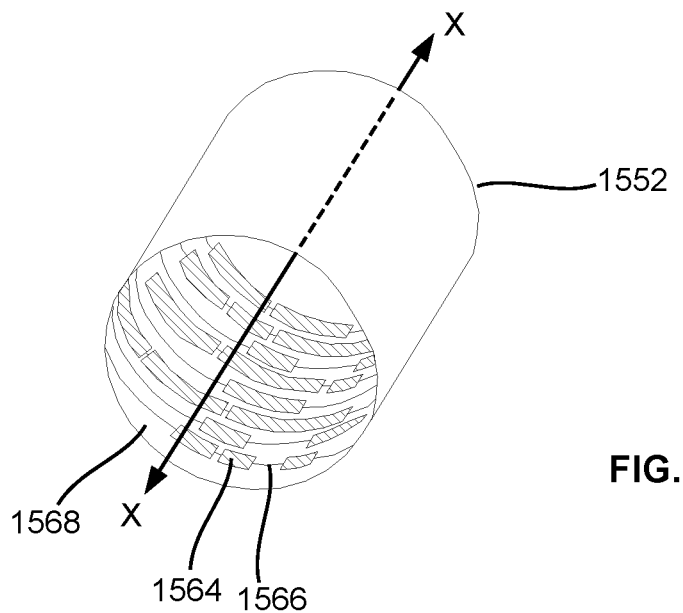
FIG. 30D illustrates the flexible PCB of the hinge encoder of FIG. 30A.
Figure 30E:
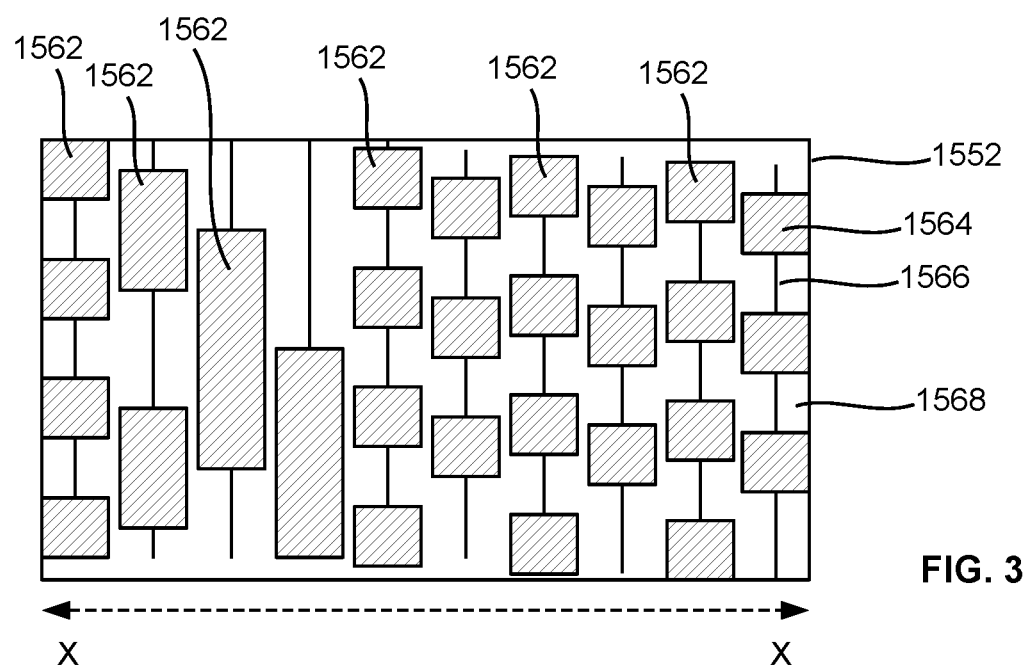
FIG. 30E shows the encoder pattern of the flexible PCB of FIG. 30D.

As shown in FIGS. 30D and 30E, the flexible PCB 1552 comprises a plurality of linear strips 1474, when wrapped, about the axis X-X of the pivot 1546 forming an encoder pattern 1472.

Similar to the flexible PCB 1472 of FIG. 27A, each strip 1474 is made of segments 1564 and 1568 storing 0's and 1's using the boosted cyclic Gray code described above. For example, by using etching technology on a flexible PCB having a dielectric base and a metal (e.g., copper) coating, the segments 1564 of the flexible PCB 1552 of FIG. 30E are formed by blocks of the metal coating for storing 1's, and segments 1568 are formed by the dielectric PCB base for storing 0's. The metal segments 1564 in each strip 1474 are connected by a thin metal-coating trace 1566. In this way, the capacitance between the reader pin 1550 and a metal segment 1564 thereunder is different than that between the reader pin 1550 and a dielectric segment 1568 thereunder. A predefined capacitance threshold, or an equivalent electrical parameter threshold, may be used for detecting 0's and 1's by comparing the detected capacitance (or the equivalent) with the predefined threshold. Of course, in a similar alternative embodiment, the metal segments 1564 may store 0's and the dielectric segments 1568 may store 1's.

In some alternative embodiments, the predefined capacitance threshold (or the equivalent) may be customizable in use, or alternatively may be determined from a control channel on the encoder strip 1552.

A designer has the freedom of carefully controlling the capacitance between the reader pin 1550 and the encoder strip 1552, which is a function of the distance between the reader pin 1550 and the encoder strip 1552, and the dielectric material filling in the gap 1554 therebetween and the overlapping surface area of the reader pin 1550, and the encoder segment 1564. Depending on the encoder application and manufacturing capabilities, it may be sufficient to use air as the dielectric material in some embodiments. However, in embodiments of using the angle encoder in electrically noisy environments or demanding applications, a suitable dielectric fluid or grease filling in the gap 1554 can significantly improve the capacitance between the reader pin 1550 and the encoder strip 1552.

As described above, the metal segments 1564 of FIGS. 30D and 30E are electrically connected via thin metal-coating traces 1566. These metal-coating traces 1566 are designed to have a thin width, measured along the X-X axis, such that the width ratio between the metal segments 1564 and the metal-coating traces 1566 is sufficiently high to reduce the impact of the metal-coating traces 1566 to the capacitance of between the reader pin 1550 and the dielectric segments 1568.

In an alternative embodiment, the angle encoder uses optical sensing for reading stored codewords. The angle encoder in these embodiments is similar to that of FIGS. 25A to 27B (or FIGS. 30A to 30E), except that the encoder strip is made of a transparent base material coated with non-transparent segments. The non-transparent segments may be printed to the transparent base material. Alternatively, the transparent base material may be initially fully coated with the non-transparent coating, and then etched using a suitable solvent to remove the non-transparent coating except at the locations of the non-transparent segments. The encoder strip then comprises an encoder pattern consisting of a plurality of bands, each having alternately arranged non-transparent and transparent segments storing 0's and 1's. One or more light sources and one or more optical sensors, such as one or more CCD or CMOS sensors, arranged on opposite sides of the encoder strip are used for reading the stored 0's and 1's.

In another embodiment, the angle encoder uses resistance sensing for reading stored codewords. The angle encoder in these embodiments is similar to that of FIGS. 25A to 27B (or FIGS. 30A to 30E), except that the encoder strip is made of a material having different resistances at the segments of 0's and 1's, e.g. a flexible PCB circuit with insulating solder mask or overlay material representing binary 0 and exposed copper segments representing binary 1. A suitable electrical circuit detecting the resistances of the encoder strip is used for reading stored 0's and 1's.

In another embodiment, the encoder strip comprises both the above described encoder pattern for providing a digital reading of the codewords of a boosted cyclic Gray code, and a slider element for providing analogue reading. A Bayesian filter is used to use the analogue reading for improving the accuracy of angle measurement.

In this embodiment, the angle encoder uses capacitive sensing and is similar to that of FIGS. 30A to 30C, but with a different encoder strip 1602 (see FIGS. 31A and 31B) and different pivoting electrode 1642 (see FIGS. 31C to 31G).

Figure 31A:
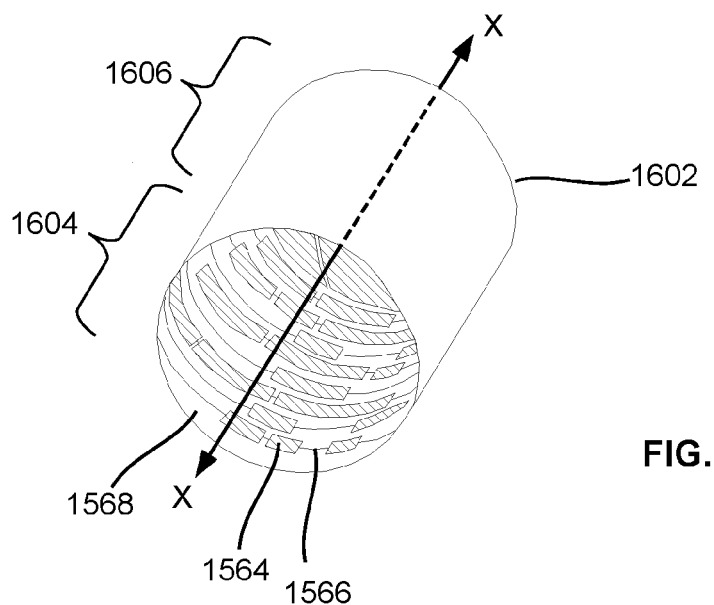
FIG. 31A illustrates the flexible PCB of the hinge encoder of FIG. 30A, according to an alternative embodiment.
Figure 31B:
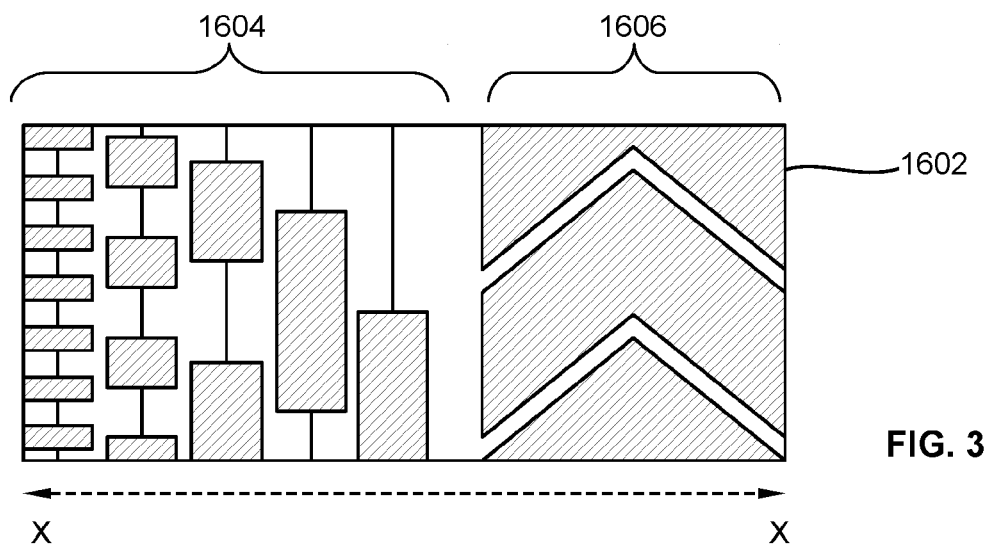
FIG. 31B shows the encoder pattern of the flexible PCB of FIG. 31A, the encoder pattern having a digital encoder section and an analogue encoder section.
Figure 31C:
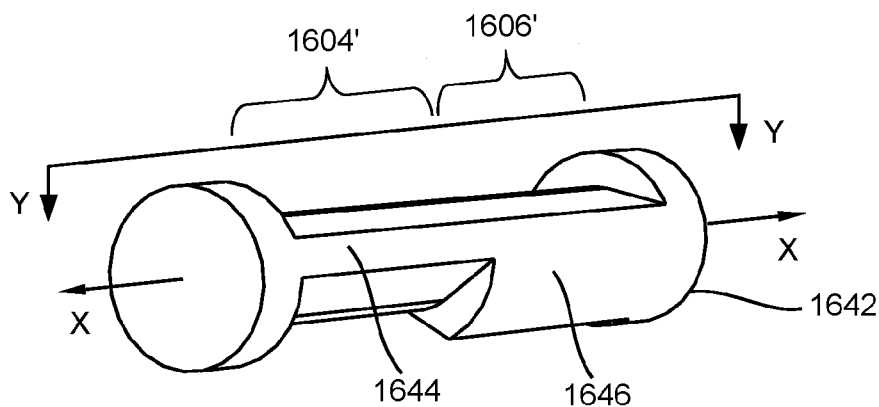
FIG. 31C is a perspective view of the pivoting electrode of the hinge encoder of FIG. 30A for acting with the flexible PCB of FIG. 31A.
Figure 31D:
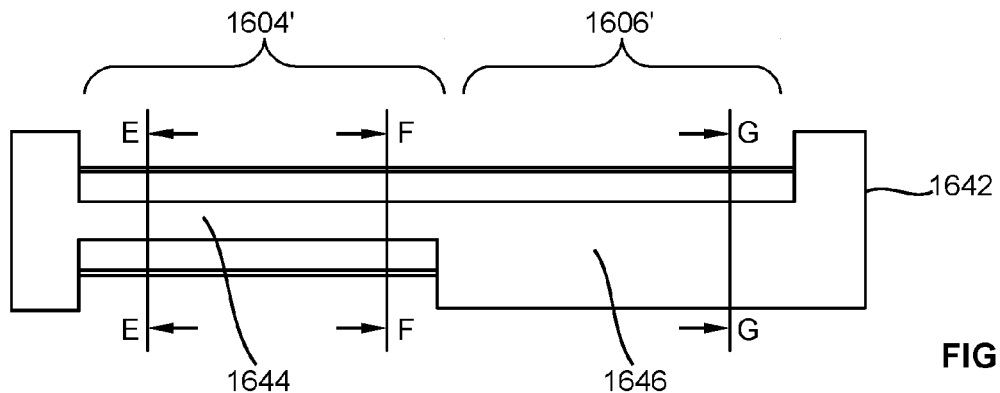
FIG. 31D is a front view of the pivoting electrode of FIG. 31C.
Figure 31E:
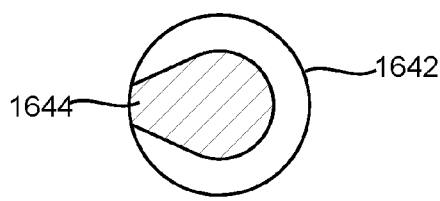
FIGS. 31E to 31G are cross-sectional views of the reader of FIG. 31C from sections E-E, F-F and G-G, respectively.
Figure 31G:
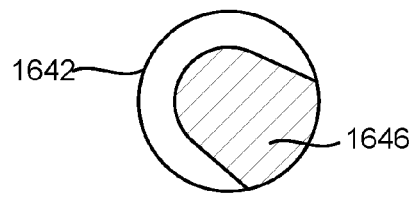
Figure 31F:
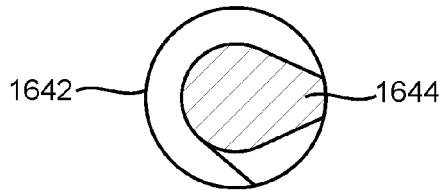

As shown in FIGS. 31A and 31B, the encoder pattern 1602 consists of a digital encoder section 1604 storing a boosted cyclic Gray code described above, and an analogue encoder section 1606 for providing analogue reading. In both sections, the shaded area gives rise to a capacitance significantly different to that of the unshaded area.

The pivoting electrode 1642 is shown in FIGS. 31C to 31G. As can be seen, the pivoting electrode 1642 comprises a digital electrode section 1604' and an analogue electrode section 1606' respectively corresponding to the digital and analogue encoder sections 1604 and 1606 of the encoder strip 1602. In this embodiment, the analogue electrode section 1606' comprises an analogue reader pin 1646 larger than the digital reader pin 1644 of the digital electrode 1604'.

A statistic estimator, such as a Bayesian estimator, and in particular such as a Kalman Filter, an Extended Kalman Filter, a Minimum Mean Square Error estimator, a Particle Filter, or the like, is used to combine the readings from the digital encoder section 1604 (representing a boosted cyclic Gray codeword) and from the analogue encoder section 1606, for improving the precision and resolution of the angle measurement. In various embodiments, the Bayesian estimator may be implemented as a firmware module of a controller in the angle encoder, a firmware module in a computing device functionally coupled to the angle encoder, or a software module in a computing device functionally coupled to the angle encoder.

In particular, the digital encoder section 1604 has an angular resolution, i.e., the minimum measurable angle, of $\Delta\alpha$ degrees. Thus, if the reading of the digital encoder section 1604 gives an angle $\alpha_g$, the actual angle $\alpha_A$ is then $\alpha_g - \Delta\alpha/2 \leq \alpha_A \leq \alpha_g + \Delta\alpha/2$.

Figure 32A:
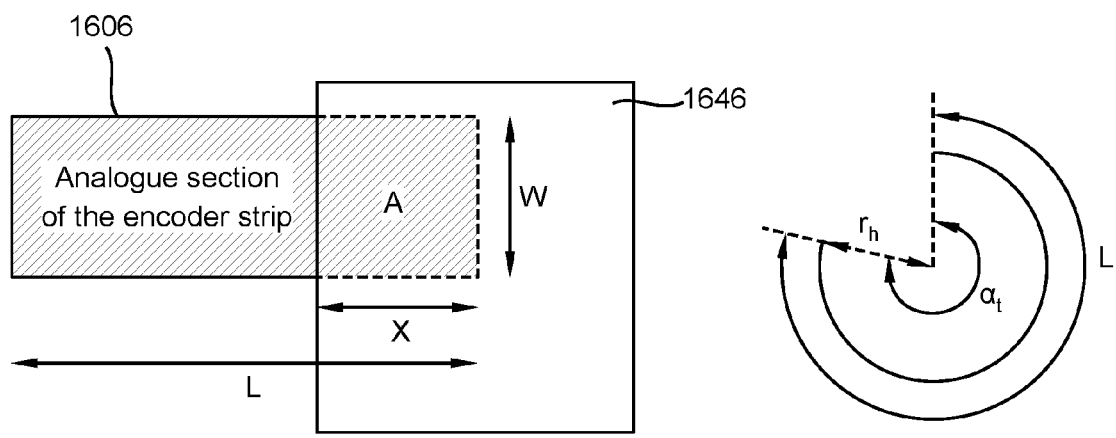
FIGS. 32A and 32B are schematic illustrations for showing angle estimation using the analogue encoder section of the encoder pattern of FIG. 31B.
Figure 32B:
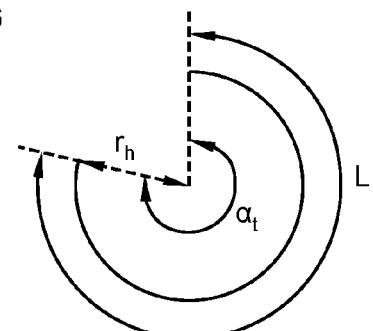

The encoder calculates the relative capacitance of the analogue encoder section 1606. As shown in FIGS. 32A and 32B, the analogue encoder section 1606 of the encoder strip 1602 has a length L and a width W, wrapping with a radius $r_h$ for measuring a total measurable angle $\alpha_t$. Then, $$L = \alpha_t r_h, \tag{37}$$

where $\alpha_t$ is expressed in rad.

When the angle encoder is measuring an actual angle $\alpha_A$, the area of the analogue encoder section 1606 of the encoder strip 1602 under, or overlapping, the analogue reader pin 1646 is denoted as $A(\alpha_A)$. Then, the capacitance between the analogue encoder section 1606 and the analogue reader pin 1646 is proportional to the area $A(\alpha_A)$, i.e., $$C(\alpha_A) \propto A(\alpha_A). \tag{38}$$

The length x of the area $A(\alpha_A)$ may be determined by an actual angle $\alpha_A$ as:

$$x = \alpha_A r_h. \tag{39}$$

Then, the capacitance $C(\alpha_A)$ can be written as:

$$C(\alpha_A) = \frac{\epsilon A(\alpha_A)}{d} = \epsilon \frac{wx}{d} = \epsilon \frac{w\alpha_A r_h}{d} = \gamma \alpha_A. \tag{40}$$

where $\epsilon$ is a constant, d is the distance between the analogue encoder section 1606 and the analogue reader pin 1646, and $$\gamma = \frac{\epsilon w r_h}{d}. \tag{41}$$

The measured capacitance $\hat{C}$, however, is distorted by measurement noise and often biased due to parasitic capacitance from, e.g., the metal-coating traces, i.e., $$\hat{C} = \gamma \alpha_A + b + n. \tag{42}$$

where b is parasitic capacitance, and n is the measurement noise. In this embodiment, $n \sim N(0,R)$, i.e., n is of a normal distribution with a zero mean and a variance of R.

In use, the values of the state variables $\gamma$ and b may slowly vary in time due to variations in $d, \epsilon, w, r_h$ caused by temperature and other environmental impacts. In this embodiment, the state variables $\gamma$ and b are modeled using a first-order Markov model:

$$\begin{bmatrix} \gamma_{k|k-1} \\ b_{k|k-1} \end{bmatrix} = \Phi \begin{bmatrix} \gamma_{k-1|k-1} \\ b_{k-1|k-1} \end{bmatrix} + w, \tag{43}$$

where $\Phi = I$ with I representing an identity matrix, and $w \sim N(0, \sigma_S^2 I)$.

To estimate and track the actual angle $\alpha_A$, in this embodiment, a Kalman Filter is used. First, the initial values of the state variables $\gamma$ and b are estimated. The initial value of the state variable $\gamma$ may be calculated using Equation (41), and initial value of the state variable b may be estimated using a calibration process.

With the model of the state variables γ and b expressed in Equation (43), the prediction covariance can then be calculated from $$P_{k|k-1} = \Phi P_{k-1|k-1}\Phi^T + \sigma_S^2 I \qquad (44)$$

Rewriting Equation (42), the measured capacitance $\hat{C}$ can be expressed in matrix form as:

$$\hat{C} = [\alpha_A 1][b^\gamma] + n. \qquad (45)$$

As described above, n~N(0,R) is the measurement noise. In this embodiment, the measurement matrix is formulated as $$H_k = [\alpha_g 1]. \qquad (46)$$

As described above, $\alpha_g$ is the angle obtained from the reading of the digital encoder section 1604.

The Kalman gain K can be found from:

$$K_k = P_{k|k-1}H_k^T(H_k P_{k|k-1}H_k^T + R_k)^{-1}. \qquad (47)$$

Then, the corrected states are:

$$\begin{bmatrix} \gamma_{k|k} \\ b_{k|k} \end{bmatrix} = \begin{bmatrix} \gamma_{k|k-1} \\ b_{k|k-1} \end{bmatrix} + K_k\left(\hat{C}_k - H_k\begin{bmatrix} \gamma_{k|k-1} \\ b_{k|k-1} \end{bmatrix}\right). \qquad (48)$$

The updated covariance matrix is then:

$$P_{k|k} = (1 - K_k H_k)P_{k|k-1}(1 - K_k H_k)^T + K_k R_k K_k^T. \qquad (49)$$

From $[\gamma_{k|k}, b_{k|k}]^T$ and the measured value of capacitance $\hat{C}$, the estimation $\hat{\alpha}_A$ of the actual angle $\alpha_A$ can be found as:

$$\hat{\alpha}_A = \frac{\hat{C}_k - b_{k|k}}{\gamma_{k|k}}. \qquad (50)$$

Combining the readings of digital and analogue encoder sections improves angle measurement accuracy. However, as having been shown above, the angle encoder in some embodiments may not have any analogue encoder section 1606. Similarly, in some other embodiments, the angle encoder only comprises the analogue encoder section 1606, and a Bayesian estimator may be used in a manner similar to the description above for estimating the measured angle.

In another embodiment, a tracking algorithm is used based on determining the similarity of the encoder output with respect to all or a subset of the possible encoder outputs, denoted as a set of reference outputs. In particular, the set of reference outputs, being codewords or measurements, e.g., angle measurements, may be pre-selected from all possible encoder outputs, determined via a calibration process, or dynamically determined based on previous encoder output. In use, for each encoder output (which may be distorted by measurement noise), a correlation between the encoder output and each reference output of the set of reference outputs is calculated. The reference output exhibiting largest correlation with the encoder output is selected as the most likely measurement.

The set of reference outputs can be selected from all possible encoder outputs having $L_W$ possible encoder outputs about the previously determined angle output.

The number of reference outputs $L_W$ can be adaptively adjusted in use, depending on the tracking error probability, the sampling rate of the encoder relative to the detected speed of motion (e.g., speed of angular rotation), and the like. When calculating the correlation, the reference outputs may be weighted by a set of weights associated with the probability of the next predicted output.

Those skilled in the art appreciate that, in alternative embodiments, the encoder may store other types of codes. For example, in one embodiment, the encoder stores a set of Pseudo Noise (PN) sequences, with each PN sequence representing an output, e.g., an angle. Each of these PN sequences is (nearly) orthogonal to the others of the PN sequences. Those skilled in the art appreciate that other codes, e.g., Gold codes or combination of Gray codes, including the Gray code described herein, and PN sequences, can alternatively be used in various alternative embodiments.

Figure 33A:
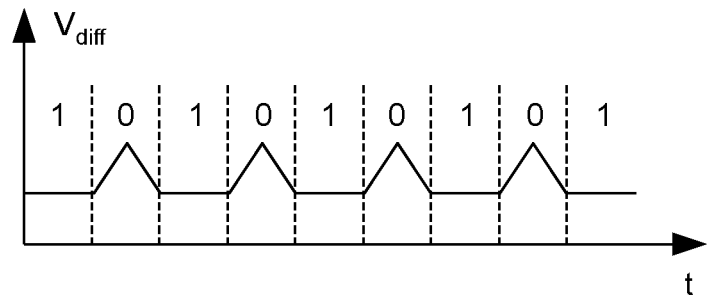
FIGS. 33A and 33B show the voltage differential and resistance, respectively, between a wiper and an encoder strip of an encoder, according to an alternative embodiment.

In another embodiment, the sectors of the encoder strip storing 1's are electrically conductive and are connected to the circuitry for detecting stored codewords. On the other hand, the sectors storing 0's are electrically nonconductive. A reader, such as a wiper, is connected to the circuitry for detecting stored codewords, and is set at a specific distance from the encoder strip. A medium, e.g., grease or fluid, with a controlled volume resistivity fills the gap therebetween. A voltage is then applied across the wiper and the encoder strip (in particular the sectors storing 1's). As shown in FIG. 33A, in use, the voltage differential $V_{Diff}$ between the wiper and the encoder strip when the wiper overlaps a sector storing a binary 1 (denoted as a "binary 1 sector") is at a smallest level, and when the wiper starts to overlap a sector storing a binary 0 (denoted as a "binary 0 sector"), the voltage differential $V_{Diff}$ between the wiper and the encoder strip starts to grow to a peak (about the mid-point between two neighboring binary 1 sectors, and then starts to drop to the smallest level when the wiper moves out of the binary 0 sector.

Figure 33B:
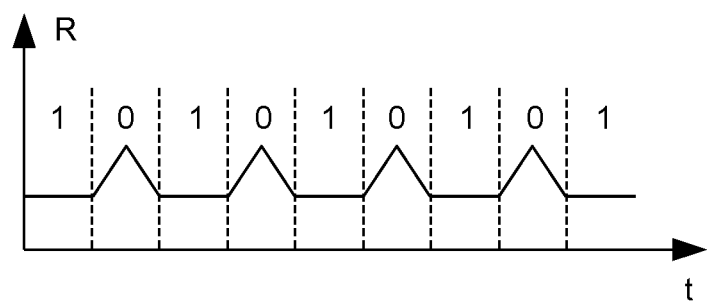

Correspondingly, as shown in FIG. 33B, the resistance R between the wiper and the encoder strip is at the smallest level when the wiper overlaps a binary 1 sector. When the wiper starts to overlap a binary 0 sector, the resistance R between the wiper and the encoder strip starts to grow to a peak (about the mid-point between two neighboring binary 1 sectors, and then starts to drop to the smallest level when the wiper moves "out of" the binary 0 sector.

The circuitry connecting to the encoder strip and the wiper can detects the changing resistance or voltage differential for detecting the stored binary 1 or 0, e.g., by comparing the sensed voltage differential with a voltage threshold. In this embodiment, tracking of the voltage differential between the wiper and the encoder strip allows interpolation of encoder output, e.g., position or angle output, between the outputs represented by the encoded codewords. Also, in this embodiment, mechanical wear on the surface of the segments is reduced significantly.

In above embodiments, the base channels store an n-bit conventional Gray code. In some alternative embodiments, the base channels may store any suitable type of Gray code, including the cyclic Gray code disclosed herein.

Figure 34A:
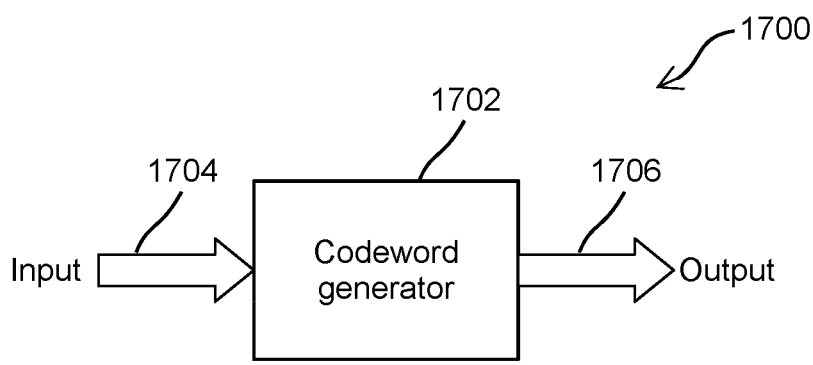
FIGS. 34A and 34B are schematic diagrams of devices using a cyclic Gray code disclosed herein, in a first and a second use categories, respectively.

In various embodiments, the cyclic Gray code and the angle encoders disclosed herein may be used in various applications, which may be categorized in two use categories. FIG. 34A shows a schematic diagram of a device or component 1700, such as an encoder, using the above-described cyclic Gray code in a first use category. The device 1700 comprises a codeword generator 1702, a signal input 1704 and a signal output 1706. The codeword generator 1702 in this embodiment is implemented as an IC chip or chips using suitable technologies such as FPGA, ASIC or the like. The signal applied to the signal input 1704 and the signal output from the signal output 1706 may be in any suitable form such as electrical, optimal, mechanical forms and/or the like.

In response to an input signal via the signal input 1704, the codeword generator 1702 generates a codeword of an above-described cyclic Gray code such as a codeword of an (n,m) boosted cyclic Gray code or a codeword of an (n,m) boosted cyclic Gray code with dual Booster channel sets, and outputs the generated codeword in the form of an output signal via the output 1706.

In one embodiment, the codeword generator 1702 comprises a storage storing all or a portion of an above-described cyclic Gray code. In response to an input signal, the codeword generator 1702 selects a codeword from the stored codewords and outputs the selected codeword. In another embodiment, the codeword generator 1702 comprises a logic circuit executing an above-described codeword generating process, and dynamically generates a codeword in response to an input signal. The generated codeword is then output via the signal output 1706.

As those skilled in the art appreciate, either or both of the input and output 1704 and 1706 may be a serial input/output or a parallel input/output, depending on the design. The angle encoder described herein is an application of this category.

Figure 34B:
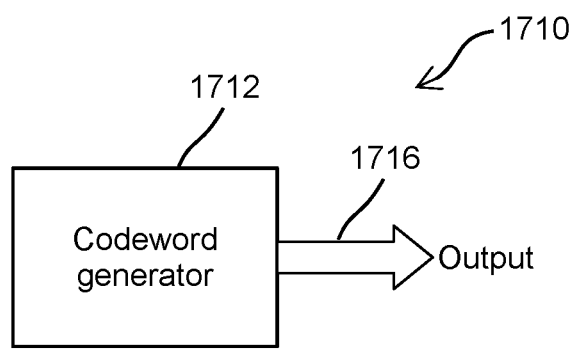

FIG. 34B shows a schematic diagram of a device or component 1710, such as a counter, using the above-described cyclic Gray code in a second use category. The device 1710 comprises a codeword generator 1712 and a signal output 1716, but does not have any signal input. In this embodiment, the codeword generator 1712 stores all or a portion of an above-described cyclic Gray code such as an (n,m) boosted cyclic Gray code or an (n,m) boosted cyclic Gray code with dual Booster channel sets, and automatically and sequentially, usually at a predetermined frequency, selects therefrom a codeword for outputting in the form of an output signal via the output 1716.

In another embodiment, the codeword generator 1712 executes an above-described codeword generating process, and automatically and sequentially generates a codeword for outputting in the form of an output signal via the output 1716.

As those skilled in the art appreciate, the output 1716 may be a serial output or a parallel output, depending on the design.

Although embodiments have been described above with reference to the accompanying drawings, those of skill in the art will appreciate that variations and modifications may be made without departing from the scope thereof as defined by the appended claims.

What is claimed is:

1. An angle encoder comprising:
  a first component;
  a second component rotatable with respect to the first component and juxtaposed thereto;
  an encoder pattern storing codewords indicative of possible angles between the first and second components, said encoder pattern comprising one or more channels formed by one or more circumferentially extending linear strips;
  at least a first reader, in response to a current angle between the first and second components, reading, from said encoder pattern, a codeword indicative of the current angle between the first and second components; and
  a module of a statistic estimator coupled to at least one of the at least first reader for determining the current angle between the first and second components.

2. The angle encoder of claim 1 wherein the encoder pattern is a flexible printed circuit board (PCB) storing said codewords.

3. The angle encoder of claim 1 wherein the at least first reader measures the capacitance between the encoder pattern and the at least first reader, for reading, from said encoder pattern, the codeword indicative of the current angle between the first and second components.

4. The angle encoder of claim 1 wherein the at least first reader uses at least one of mechanical, optical and magnetic means for reading, from said encoder pattern, the codeword indicative of the current angle between the first and second components.

5. The angle encoder of claim 1 wherein the at least first reader measures the resistance or voltage differential between the encoder pattern and the at least first reader, for reading, from said encoder pattern, the codeword indicative of the current angle between the first and second components.

6. The angle encoder of claim 1 further comprising:
  an analogue encoder section; and
  a second reader coupled to the analogue encoder section for reading an analogue parameter for determining the current angle between the first and second components.

7. The angle encoder of claim 1 wherein the statistic estimator is a Bayesian estimator.

8. The angle encoder of claim 7 wherein the Bayesian estimator is a Kalman Filter, an Extended Kalman Filter, a Minimum Mean Square Error estimator, or a Particle Filter.

9. The angle encoder of claim 1 wherein said one or more channels of the encoder pattern comprises:
  n base encoder channels, each of said n base encoder channels comprising at most $2^n$ aligned, equal-length segments, each segment storing a binary 1 or 0, and said n base encoder channels storing the codewords of an n-bit Gray code;
  at least m first Booster channels, each of said m first Booster channels comprising at most $2^n$ equal-length segments, said equal-length segments alternately storing 0's and 1's and being offset from the base encoder channels by an offset distance of $L_i=Si/(m+1)$, where S represents the length of each segment, and i=1, 2, . . . , m, represents the Booster channel number of the first Booster channels.

10. The angle encoder of claim 9 wherein n=3, and m=2.

11. The angle encoder of claim 9 wherein each segment of the linear strips has a linear length of at least $S=L/2^n$, where L is the linear length of each strip, and said offset distance $L_i$ is a linear offset distance.

12. An angle encoder comprising:
  a first component;
  a second component rotatable with respect to the first component and juxtaposed thereto;
  an encoder pattern storing codewords indicative of possible angles between the first and second components;
  at least a first reader, in response to a current angle between the first and second components, reading, from said encoder pattern, a codeword indicative of the current angle between the first and second components;
  an analogue encoder section;
  a second reader coupled to the analogue encoder section for reading an analogue parameter for determining the current angle between the first and second components; and
  a module of a statistic estimator coupled to at least one of the at least first reader for determining the current angle between the first and second components.

13. The angle encoder of claim 12 wherein the statistic estimator is a Bayesian estimator.

14. The angle encoder of claim 13 wherein the Bayesian estimator is a Kalman Filter, an Extended Kalman Filter, a Minimum Mean Square Error estimator, or a Particle Filter.

15. An angle encoder comprising:
a first component;
a second component rotatable with respect to the first component and juxtaposed thereto;
an encoder pattern storing codewords indicative of possible angles between the first and second components; and
at least a first reader, in response to a current angle between the first and second components, reading, from the encoder pattern, a codeword indicative of the current angle between the first and second components;
wherein the encoder pattern comprises:
n base encoder channels, each of the n base encoder channels comprising at most $2^n$ aligned, equal-length segments, each segment storing a binary 1 or 0, and the n base encoder channels storing the codewords of an n-bit Gray code;
at least m first Booster channels, each of the m first Booster channels having a channel segment arrangement comprising at most $2^{n-1}$ equal-length segments, the equal-length segments alternately storing 0's and 1's and being offset from the base encoder channels by an offset distance of $Si/(m+1)$, where S represents the length of each segment, and i=1, 2, ..., m, represents the Booster channel number of the first Booster channels; and
at least m second Booster channels, the m second Booster channels having the same channel segment arrangement as the m first Booster channels, and the m second Booster channels being offset from the m first Booster channels by S.

16. The angle encoder of claim 15 wherein the current angle is determined as:

$$a = gS + \sum_{c=1}^{m} \frac{S[(b_{c1} \oplus b_{c2}) \oplus (g \bmod 2)]}{m+1},$$

wherein $\oplus$ represents exclusive-or (XOR) operation.

17. The angle encoder of claim 15 wherein each channel is a linear strip, and $S=L/2^n$, where L is the linear length of each strip.

18. The angle encoder of claim 15 wherein each channel is a ring, and $S=360°/2^n$.

19. An angle encoder for measuring an angle within a range from 0° to a predefined angle β, the angle encoder comprising:
a first component;
a second component rotatable with respect to the first component and juxtaposed thereto;
an encoder pattern storing codewords indicative of possible angles between the first and second components, the encoder pattern comprising a primary encoding zone and M−1 additional encoding zones, the primary encoding zone comprising n base encoder channels and m Booster channels, and each additional encoding zone comprising (n+m) Booster channels; and
at least M readers respectively associated with the M encoding zones, the at least M readers, in response to a current angle between the first and second components, reading, from the encoder pattern, a codeword indicative of the current angle between the first and second components;
wherein each base encoder channel comprises a plurality of aligned, equal-length segments, each segment has a length of $S=L/2^n$ and stores a binary 1 or 0, L is the length of the channel, and each set of n segments across the n base encoder channels store a codeword of an n-bit Gray code;
wherein each Booster channel comprises a plurality of equal-length segments, each segment has a length of $S=L/2^n$ and stores a binary 1 or 0; and
wherein segments of the Booster channels are offset from the base encoder channels by an offset angle $P_i$ calculated as:

$$P_i = \frac{Si}{(m+1)} + (v-1)\frac{L}{M},$$

where i is the Booster channel number, i≤m for Booster channels in the primary encoding zone, and i>m for Booster channels in the additional encoding zones; and where $$v = \frac{i - i \bmod (m+n)}{m+n} + 1.$$

20. The angle encoder of claim 19 wherein each channel is a ring, and L is an angular length equal to 360°.

* * * * *